US012648262B2

(12) United States Patent
Baek et al.

(10) Patent No.: US 12,648,262 B2
(45) Date of Patent: Jun. 2, 2026

(54) LIGHT EMITTING DEVICE AND LIGHT EMITTING MODULE HAVING THE SAME

(71) Applicant: SEOUL VIOSYS CO., LTD., Gyeonggi-do (KR)

(72) Inventors: Yong Hyun Baek, Gyeonggi-do (KR); Dae Hong Min, Gyeonggi-do (KR); Ji Hun Kang, Gyeonggi-do (KR); Chung Hoon Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 223 days.

(21) Appl. No.: 18/070,551

(22) Filed: Nov. 29, 2022

(65) Prior Publication Data

US 2023/0093367 A1 Mar. 23, 2023

Related U.S. Application Data

(63) Continuation-in-part of application No. 17/569,114, filed on Jan. 5, 2022.
(Continued)

(51) Int. Cl.
*H10H 20/812* (2025.01)
*H01L 25/16* (2023.01)
(Continued)

(52) U.S. Cl.
CPC ......... *H10H 20/812* (2025.01); *H01L 25/167* (2013.01); *H10H 20/82* (2025.01); *H10H 20/825* (2025.01)

(58) Field of Classification Search
CPC ............. H01L 33/0012; H01L 33/0025; H01L 33/0062; H01L 33/0066; H01L 33/02;
(Continued)

(56) References Cited

U.S. PATENT DOCUMENTS 10,777,716 B1 9/2020 Chen
11,621,369 B2 4/2023 Han et al.
(Continued)

FOREIGN PATENT DOCUMENTS

EP 2200100 A1 6/2010
EP 3217438 A1 9/2017
(Continued)

OTHER PUBLICATIONS

European Search Report for European Patent Application No. 22736840.4, Sep. 27, 2024, 9 pages.
(Continued)

*Primary Examiner* — Natalia A Gondarenko
(74) *Attorney, Agent, or Firm* — LaBatt, LLC

(57) ABSTRACT

A light emitting device and a light emitting module having the same are provided. A light emitting device includes: a first conductivity type semiconductor layer; a second conductivity type semiconductor layer; and an active layer disposed between the first conductivity type semiconductor layer and the second conductivity type semiconductor layer, in which, upon operation, the active layer emits light of a first peak wavelength and light of a second peak wavelength in which the first peak wavelength may be within a range of about 400 nm to about 415 nm, and the second peak wavelength may be greater than or equal to about 440 nm.

19 Claims, 28 Drawing Sheets

Related U.S. Application Data

(60) Provisional application No. 63/284,589, filed on Nov. 30, 2021, provisional application No. 63/253,520, filed on Oct. 7, 2021, provisional application No. 63/134,319, filed on Jan. 6, 2021.

(51) Int. Cl.
    *H10H 20/82*     (2025.01)
    *H10H 20/825*     (2025.01)

(58) Field of Classification Search
    CPC ..... H01L 33/025; H01L 33/04; H01L 33/486; H01L 33/505; H01L 33/62; H01L 33/06; H01L 33/08; H01L 33/12; H01L 33/18; H01L 33/20; H01L 33/22; H01L 33/24; H01L 33/30; H01L 33/305; H01L 33/32; H01L 33/325; H01L 33/36; H01L 33/387; H01L 33/405; H01L 33/42; H01L 33/44; H01L 25/0753; H01L 25/167; H01L 33/146; H01L 33/50; H01L 33/502; H01L 33/504; H01L 33/508; H01L 33/507; H01L 33/52; H01L 33/54; H01L 33/58; H01L 33/60; H05K 1/189; H05K 2201/10106; H05K 3/284; H10H 20/811; H10H 20/8131; H10H 20/8162; H10H 20/818; H10H 20/819; H10H 20/82; H10H 20/8506; H10H 20/8514; H10H 20/857; H10H 20/812; H10H 20/821; H10H 29/011; H10H 29/032; H10H 29/036; H10H 29/0362; H10H 29/14; H10H 29/24; H10H 29/842; H10H 29/8508; H10H 29/851; H10H 29/852; H10H 29/853; H10H 29/854; H10H 20/825; H10H 20/831; H10H 20/8504; H10H 20/851; H10H 20/853; H10H 20/854
    USPC ............................................... 257/13, 79, 88
    See application file for complete search history.

(56) References Cited

U.S. PATENT DOCUMENTS

| | | | |
|---|---|---|---|
| 2005/0157515 A1 | 7/2005 | Chen et al. | |
| 2005/0227569 A1* | 10/2005 | Maeda | C09K 11/025 |
| | | | 257/E33.059 |
| 2005/0230693 A1 | 10/2005 | Chen | |
| 2006/0131595 A1 | 6/2006 | Chen | |
| 2006/0197098 A1 | 9/2006 | Aihara | |
| 2008/0315179 A1 | 12/2008 | Kim et al. | |
| 2010/0207098 A1* | 8/2010 | Avramescu | H01L 33/08 |
| | | | 257/14 |
| 2013/0313516 A1* | 11/2013 | David | H01L 33/04 |
| | | | 257/89 |
| 2014/0362565 A1 | 12/2014 | Yao et al. | |
| 2015/0029725 A1* | 1/2015 | Kamikawa | F21V 7/24 |
| | | | 362/296.04 |
| 2015/0083993 A1 | 3/2015 | Nagata et al. | |
| 2015/0280056 A1* | 10/2015 | Northrup | H10H 20/812 |
| | | | 438/37 |

| | | | |
|---|---|---|---|
| 2016/0163919 A1 | 6/2016 | Matsui et al. | |
| 2016/0359300 A1 | 12/2016 | El-Ghoroury et al. | |
| 2017/0130909 A1* | 5/2017 | Yeon | H10H 20/851 |
| 2017/0324047 A1 | 11/2017 | Fujiwara et al. | |
| 2018/0062039 A1 | 3/2018 | Fujiwara | |
| 2018/0145208 A1 | 5/2018 | Kim | |
| 2019/0221730 A1 | 7/2019 | Yoo et al. | |
| 2019/0355783 A1* | 11/2019 | Koh | H10H 20/851 |
| 2019/0371768 A1 | 12/2019 | You et al. | |
| 2019/0371968 A1 | 12/2019 | Asada et al. | |
| 2020/0217460 A1 | 7/2020 | Park et al. | |
| 2020/0279979 A1 | 9/2020 | Lee et al. | |
| 2020/0328198 A1 | 10/2020 | Takeya et al. | |
| 2020/0357950 A1* | 11/2020 | Takagi | H10H 20/854 |
| 2021/0013378 A1* | 1/2021 | Lee | H01L 33/483 |
| 2021/0408328 A1* | 12/2021 | Andrews | H01L 33/22 |
| 2022/0216188 A1 | 7/2022 | Baek et al. | |
| 2022/0367754 A1 | 11/2022 | Hartensveld | |
| 2023/0335672 A1* | 10/2023 | Liu | H01L 33/24 |

FOREIGN PATENT DOCUMENTS

| | | |
|---|---|---|
| EP | 3690944 A1 | 8/2020 |
| JP | 2004031657 A | 1/2004 |
| JP | 2010034184 A | 2/2010 |
| JP | 2014045015 A | 3/2014 |
| JP | 6738455 B2 | 8/2020 |
| KR | 1020140006498 A | 1/2014 |
| KR | 1020160136717 A | 11/2016 |
| KR | 1020170080598 A | 7/2017 |
| KR | 1020180005320 A | 1/2018 |
| KR | 1020190038365 A | 4/2019 |
| WO | 2020005827 A1 | 1/2020 |

OTHER PUBLICATIONS

Office Action for U.S. Appl. No. 17/569,114, mailed Apr. 29, 2024, 26 pages.

International Search Report for International Application No. PCT/KR2022/000198, mailed Apr. 15, 2022, English Translation, 3 pages.

English translation of International Search Report for PCT/KR2022/019192, Mar. 16, 2023, 2 pages.

Office Action for U.S. Appl. No. 17/569,114, Dec. 26, 2024, 38 pages.

Final Office Action for U.S. Appl. No. 17/569,114, Sep. 17, 2024, 33 pages.

Advisory Action for U.S. Appl. No. 17/569,114, Nov. 29, 2024, 4 pages.

Final Office Action for U.S. Appl. No. 17/569,114, May 29, 2025, 45 pages.

Extended European Search Report for European Patent Application No. 22901767.8, Oct. 10, 2025, 11 pages.

Examination Report for corresponding Indian Patent Application No. 202317038589, Dec. 15, 2025, 6 pages.

Final Office Action for U.S. Appl. No. 17/569,114, Sep. 22, 2025, 6 pages.

Extended European Search Report for PCT/KR2022/019192, Oct. 10, 2025, 11 pages.

Examination Report for corresponding Indian Patent Application No. 202417036471, Dec. 15, 2025, 7 pages.

Notice of Allowance for U.S. Appl. No. 17/569,114, Feb. 23, 2026, 8 pages.

* cited by examiner

LIGHT EMITTING DEVICE AND LIGHT EMITTING MODULE HAVING THE SAME

CROSS-REFERENCE OF RELATED APPLICATIONS AND PRIORITY

The present application is a continuation-in-part application of the non-provisional application Ser. No. 17/569,114, filed Jan. 5, 2022, which claims priority to and the benefit of U.S. Provisional Application Ser. No. 63/134,319, filed Jan. 6, 2021, and U.S. Provisional Application Ser. No. 63/253,520, filed Oct. 7, 2021, and further claims priority to and the benefit of U.S. Provisional Application Ser. No. 63/284,589 filed Nov. 30, 2021, the disclosures of which are incorporated by reference as if they are fully set forth herein.

TECHNICAL FIELD

Exemplary embodiments of the present disclosure relate to a light emitting device and a light emitting module having the same.

BACKGROUND

A light emitting device, such as a light emitting diode, uses a semiconductor to emit light by electron/hole recombination. Various colors have been implemented by a combination of a blue light emitting device emitting blue light and a phosphor. Since the light emitting device can implement various colors, it can be used in various ways in everyday life, and for example, can be used as a light source in various fields such as a lighting, an automobile lamp, light therapy, and a display.

Meanwhile, a III-V semiconductor light emitting device is generally formed using a semiconductor layer grown at a high temperature of about 1000° C. on a substrate, for example, a sapphire substrate. The semiconductor layer grown at the high temperature is cooled to room temperature after growth. When a semiconductor layer having a lattice constant smaller than that of the sapphire substrate is grown at the high temperature, the semiconductor layer grown on a heterogeneous sapphire substrate having a large lattice constant and a thermal expansion coefficient has many dislocations, a substrate warp occurs during cooling, and a breakage or a crack is likely to occur in the substrate or the semiconductor layer. In particular, as a size of the substrate increases, a degree of substrate warpage increases. A relatively thick substrate may be used as a growth substrate so as to suppress potential substrate warpage. The use of thick growth substrates tends to increase a material cost and a process cost.

SUMMARY

Exemplary embodiments of the present disclosure provide a light emitting module capable of implementing various colors.

Some exemplary embodiments of the present disclosure provide a light emitting module capable of implementing various colors without using a phosphor.

Exemplary embodiments of the present disclosure provide a light emitting device suitable for emotional lighting and a light emitting module having the same.

Exemplary embodiments of the present disclosure also provide a method of manufacturing a light emitting device having a high quality crystal.

Exemplary embodiments of the present disclosure provide a method of manufacturing a light emitting device capable of improving a warpage of a substrate.

Some exemplary embodiments of the present disclosure provide a light emitting device having a sterilization function together with a lighting function and a light emitting module having the same.

A light emitting module according to an exemplary embodiment of the present disclosure includes a circuit board and a plurality of light emitting units arranged on the circuit board, in which each of the plurality of light emitting units includes a light emitting device, and the plurality of light emitting units includes light emitting units emitting light of different colors from one another.

At least one of the plurality of light emitting units may include a wavelength converter covering the light emitting device.

At least one of the light emitting devices may include a lower multiple quantum well structure, an upper multiple quantum well structure, and a spacer layer disposed between the lower multiple quantum well structure and the upper multiple quantum well structure, in which the upper multiple quantum well structure may include a plurality of grooves.

The lower multiple quantum well structure may include a plurality of grooves, and the grooves of the lower multiple quantum well structure and the grooves of the upper multiple quantum well structure may overlap one another.

A portion of the spacer layer and a portion of the upper multiple quantum well structure may be located in the groove of the lower multiple quantum well structure.

Well layers in the grooves of the upper multiple quantum well structure may have an In content higher than that of well layers in the grooves of the lower multiple quantum well structure.

The well layers in the grooves of the upper multiple quantum well structure may have an In content equal to or higher than that of the well layers of the lower multiple quantum well structure surrounding the grooves of the lower multiple quantum well structure.

The well layers in the grooves of the upper multiple quantum well structure may have an In content lower than that of the well layers of the upper multiple quantum well structure surrounding the grooves.

The spacer layer may be formed of AlGaN or AlInGaN, and the spacer layer may include an Al content higher than that of a barrier layer in the lower multiple quantum well structure.

The at least one of the light emitting devices may further include a first conductivity type semiconductor layer disposed under the lower multiple quantum well structure, a second conductivity type semiconductor layer disposed on the upper multiple quantum well structure, and a step coverage layer disposed between the upper multiple quantum well structure and the second conductivity type semiconductor layer, in which the step coverage layer may be formed of AlGaN or AlInGaN.

An Al content of the step coverage layer may decrease as a distance from the upper multiple quantum well structure increases.

The light emitting device may further include a growth substrate disposed under the first conductivity type semiconductor layer.

The light emitting module may further include a protection material covering the plurality of light emitting units. Furthermore, the protection material may include a light diffuser.

The light emitting module may further include a control unit for driving the plurality of light emitting units.

In some exemplary embodiments, the circuit board may be a flexible board or a rollable board.

A light emitting device according to an exemplary embodiment of the present disclosure includes a lower multiple quantum well structure, an upper multiple quantum well structure, and a spacer layer disposed between the lower multiple quantum well structure and the upper multiple quantum well structure, in which the upper multiple quantum well structure includes a plurality of grooves.

The lower multiple quantum well structure may include a plurality of grooves, and the grooves of the lower multiple quantum well structure and the grooves of the upper multiple quantum well structure may overlap one another.

A portion of the spacer layer and a portion of the upper multiple quantum well structure may be located in the groove of the lower multiple quantum well structure.

Well layers in the grooves of the upper multiple quantum well structure may have a lower In content than that of well layers of the upper multiple quantum well structure surrounding the grooves.

The light emitting device may emit light having at least three emission peaks in a visible region without a wavelength converter.

A light emitting device according to an exemplary embodiment of the present disclosure includes a first conductivity type semiconductor layer; a second conductivity type semiconductor layer; and an active layer disposed between the first conductivity type semiconductor layer and the second conductivity type semiconductor layer, in which, upon operation, the active layer emits light of a first peak wavelength and light of a second peak wavelength, the first peak wavelength is within a range of about 400 nm to about 415 nm, and the second peak wavelength is greater than or equal to about 440 nm.

The first peak wavelength may be less than or equal to 410 nm.

The second peak wavelength may be greater than or equal to 580 nm.

A difference between the first peak wavelength and the second peak wavelength may be greater than or equal to 30 nm.

An intensity at the first peak wavelength may be different from an intensity at the second peak wavelength.

The intensity at the first peak wavelength may be greater than the intensity at the second peak wavelength.

An area of a spectrum of light having the first peak wavelength may be different from that of a spectrum of light having the second peak wavelength.

A full width at half maximum of the spectrum of light having the first peak wavelength may be different from that of the spectrum of light having the second peak wavelength.

The active layer may include a lower multi-quantum well structure; an upper multi-quantum well structure; and a spacer layer disposed between the lower multi-quantum well structure and the upper multi-quantum well structure.

The lower multi-quantum well structure and the upper multi-quantum well structure include a plurality of grooves, respectively, and the grooves of the lower multi-quantum well structure and the grooves of the upper multi-quantum well structure may overlap each other.

The spacer layer may be formed of AlGaN or AlInGaN, and the spacer layer may include a higher Al content than that of a barrier layer in the lower multi-quantum well structure.

4

The light emitting device may further include a step coverage layer disposed between the upper multi-quantum well structure and the second conductivity type semiconductor layer, and the step coverage layer may be formed of AlGaN or AlInGaN.

Light of the first peak wavelength and light of the second peak wavelength may be simultaneously emitted.

A light emitting module according to an exemplary embodiment of the present disclosure includes: a circuit board; light emitting devices disposed on the circuit board; and a protection material covering the light emitting devices, in which at least one of the light emitting devices includes: a first conductivity type semiconductor layer; a second conductivity type semiconductor layer; and an active layer disposed between the first conductivity type semiconductor layer and the second conductivity type semiconductor layer, in which, upon operation, the active layer emits light of a first peak wavelength and light of a second peak wavelength in which the first peak wavelength may be within a range of about 400 nm to about 415 nm, and the second peak wavelength may be greater than or equal to about 440 nm.

The protection material may include a wavelength conversion material.

The at least one light emitting device may have a surface having concave grooves, and the wavelength conversion material may be concentrated in the concave grooves.

The light emitting module may be used for lighting and sterilization.

An intensity of light of the first peak wavelength may be greater than that of light of the second peak wavelength.

The active layer may include a lower multi-quantum well structure; an upper multi-quantum well structure; and a spacer layer disposed between the lower multi-quantum well structure and the upper multi-quantum well structure.

The lower multi-quantum well structure and the upper multi-quantum well structure may include a plurality of grooves, and the grooves of the lower multi-quantum well structure and the grooves of the upper multi-quantum well structure may overlap each other.

BRIEF DESCRIPTION OF THE DRAWINGS

FIG. 6A is a graph showing a spectrum of light in which a light emitting device has a plurality of peaks and CIE coordinates (x, y) are within a range of 0.2<x<0.48, and 0.15<y<0.4.

FIG. 6O is a graph showing a spectrum of light in which a light emitting device has a plurality of peaks and CIE coordinates (x, y) are within a range of 0.36<x<0.55, and 0.25<y<0.35.

FIG. 7A illustrates a step of forming a first stress relief layer on a lower surface of a substrate.

FIG. 7B illustrates a step of forming a light emitting structure in a structure of FIG. 7A.

FIG. 8A illustrates a step of forming an ohmic electrode, first and second contact electrodes on a light emitting structure.

FIG. 8B illustrates a step of removing a stress relief layer and a portion of a substrate in the structure of FIG. 8A.

FIG. 8C illustrates a step of dividing the substrate through a dicing D process after the step of FIG. 8B.

FIG. 8D illustrates a step of providing a light emitting device that has undergone the division step shown in FIG. 8C.

FIG. 10A illustrates a step of removing a first stress relief layer by grinding a lower surface of a substrate on which the first stress relief layer is grown.

FIG. 10B illustrates a step in which a second insulation reflection layer is formed in a lower portion of the substrate.

FIG. 10C illustrates a step of dividing the substrate through a dicing D process.

FIG. 10D illustrates a step of providing a light emitting device that has undergone the division step shown in FIG. 10C.

FIG. 12A illustrates a step of forming a substrate, a first stress relief layer, a second stress relief layer, and a light emitting structure.

FIG. 12B illustrates a step of removing the first stress relief layer by grinding a lower surface of the substrate on which the first stress relief layer is grown, and removing at least a portion of the substrate.

FIG. 12C illustrates a step of dividing the substrate through a dicing D process.

FIG. 12D illustrates a step of providing a light emitting device that has undergone the division step shown in FIG. 12C.

FIGS. 14A through 14D are schematic cross-sectional views illustrating a method of manufacturing a light emitting device according to another exemplary embodiment.

FIG. 14A illustrates a step of forming a substrate, a first stress relief layer, a second stress relief layer, and a light emitting structure.

FIG. 14B illustrates a step of removing the first stress relief layer by grinding a lower surface of the substrate on which the first stress relief layer is grown, and removing at least a portion of the substrate.

FIG. 14C illustrates a step of dividing the substrate through a dicing D process.

FIG. 14D illustrates a step of providing a light emitting device that has undergone the division step shown in FIG. 14C.

FIG. 15A illustrates a step in which the light emitting device is disposed on an electrode located on an upper surface of a circuit board, and a molding layer is formed.

FIG. 15B illustrates a step of forming a molding layer on an upper surface of which forms a convex dome shape lens structure.

FIG. 16A illustrates a step of forming a first stress relief layer on a lower surface of a substrate.

FIG. 16B illustrates a step of forming a light emitting structure in a structure of FIG. 16A.

DETAILED DESCRIPTION OF EMBODIMENTS

Figure 1:
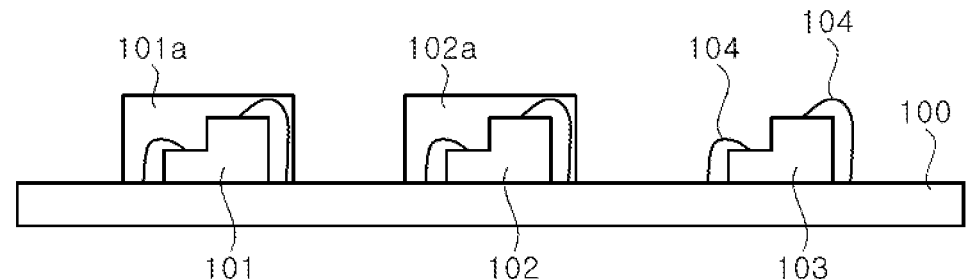
FIG. 1 is a cross-sectional view of a light emitting module according to a first exemplary embodiment.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

FIG. 1 is a cross-sectional view of a light emitting module according to a first exemplary embodiment.

Referring to FIG. 1, the light emitting module includes a substrate 100 and a plurality of light source units arranged on the substrate 100. The substrate 100 is not particularly limited, and may be in various forms such as a printed circuit board, a transparent substrate, a flexible substrate, a polyimide substrate, a graphene substrate, an optical fiber, or the like. The substrate 100 may have a circuit pattern electrically connected to light emitting devices 101, 102, and 103.

A first light source unit includes the light emitting device 101 and a wavelength converter 101a, a second light source unit includes the light emitting device 102 and a wavelength converter 102a, and a third light emitting unit includes the light emitting device 103. In the illustrated exemplary embodiment, the light source unit includes a light emitting device or a combination of a light emitting device and a wavelength converter. The first to third light source units may emit light of different colors from one another.

The light emitting devices 101, 102, and 103 may be a lateral light emitting diode chip, and may be electrically connected to the circuit pattern of the substrate 100 through bonding wires 104. The light emitting devices 101, 102, and 103 may emit light having similar peak wavelengths, without being limited thereto, or may emit light having peak wavelengths of different colors. In addition, wavelength converters 101a and 102a are disposed on at least portions of the light emitting devices 101, 102, and 103. For example, the wavelength converters 101a and 102a that emit light of different colors may be disposed on the light emitting device 101 and the light emitting device 102, respectively, and a wavelength converter may not be disposed on the light emitting device 103. The wavelength converters 101a and 101b convert light emitted from the light emitting devices 101 and 102 into light of a different wavelength, respectively. In some forms, the wavelength converters 101a and 101b may include phosphors or quantum dots.

The light emitting module according to the illustrated exemplary embodiment may implement light of various colors using the light emitting devices 101, 102, and 103 and the wavelength converters 101a and 102a.

Figure 2:
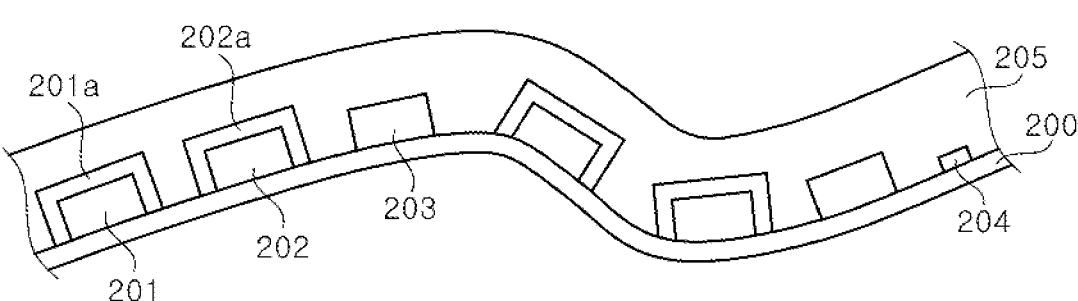
FIG. 2 is a cross-sectional view of a light emitting module according to a second exemplary embodiment.

FIG. 2 is a cross-sectional view of a light emitting module according to a second exemplary embodiment.

Referring to FIG. 2, the light emitting module according to the illustrated exemplary embodiment includes a substrate 200 and a plurality of light emitting units arranged on the substrate 200, and further, may include a control unit 204 and a protection material 205. The light emitting units may include a combination of light emitting devices 201, 202, and 203 and wavelength converters 201a and 202a.

The substrate 200 is similar to the substrate 100 described with reference to FIG. 1, and the detailed description as to the substrate 100 can be referred to in connection with the substrate 200. The light emitting devices 201, 202, and 203 may be mounted on the substrate 200 using electrode pads instead of bonding wires. The light emitting devices 201, 202, and 203 may have the electrode pads facing the substrate 200, and the electrode pads may be bonded to pads on the substrate 200. For example, the light emitting devices 201, 202, and 203 may be flip-chip type light emitting diode chips. Since a bonding wire is not used, the wavelength converters 201a and 202a may be uniformly formed on upper surfaces of the light emitting devices 201 and 202, and in particular, when applied to a deformable substrate such as a flexible substrate or a polyimide substrate, short circuit of an electrode may be minimized. In addition, the light emitting devices 201, 202, and 203 may be connected in series to one another using a circuit on the substrate 200 so as to be driven together, or may be connected to the circuit on the substrate 200 so as to enable individual driving. When electrically connected so as to enable individual driving, even when any one of the light emitting devices is short-circuited and a driving failure occurs, another light emitting device can be driven, thereby maintaining the driving of the light emitting module.

The light emitting devices 201, 202, and 203 may emit light having similar peak wavelengths, without being limited thereto, or may emit light having peak wavelengths of different colors. In addition, the wavelength converters 201a and 202a may be disposed on at least portions of the light emitting devices 201, 202, and 203. For example, the wavelength converters 201a and 202a that emit light of different colors from one another may be disposed on the light emitting device 201 and the light emitting device 202, respectively, and a wavelength converter may not be disposed on the light emitting device 203, as shown in FIG. 2.

The wavelength converters 201a and 202a convert light emitted from the light emitting devices 201 and 202 into light of a different wavelength, respectively. The wavelength converters 201a and 202a may include phosphors or quantum dots.

For example, the light emitting devices 201, 202, and 203 may emit light in an ultraviolet region or a visible region, and the wavelength converters 201a and 202a may include phosphors or quantum dots having a high color temperature stability. The wavelength converters 201a, 202a may also be used so as to achieve a high color rendering index (CRI).

In exemplary embodiments, the wavelength converters 101a and 201a may include a red light-emitting phosphor. The red light-emitting phosphor may be an Mn(IV)-activated luminescent material based on an oxidohalide host lattice:

(General Formula (I))

$$(A_{4-a}Ba)_{m/2+n/2}X_{2m}[MX_4O_2]n \tag{I}$$

(A=H and/or D, where D is deuterium; B=Li, Na, K, Rb, Cs, NH4, ND4 and/or NR4, wherein R is an alkyl or aryl radical; X=F and/or Cl; M=Cr, Mo, W and/or Re; $0\leq a\leq4$; $0<m\leq10$; and $1\leq n\leq10$).

Red-emitting luminescent materials with emission maxima in a range between 610 nm and 640 nm, high quantum yield, long lifetime, and high stability of color temperature may be implemented by incorporating Mn(IV) ions into the oxidohalide host lattice of a general form as in the above general formula (I), so as to obtain compounds of a general composition: $(A_{4-a}B_a)_{m/2+n/2}X_{2m}[MX_4O_2]_n$:Mn (IV).

The luminescent materials are obtainable efficiently and inexpensively by a simple synthesis. In particular, Cr(VI), Mo(VI), W(VI) and/or Re(VI) are used for fluoride compounds with prolonged stability, and it is because corresponding octahedral oxidohalide complex anions of a general form $[MX_4O_2]^{2-}$ have exceptionally high stability. In a case of a microscale powder of the luminescent material of the present disclosure, there is thus no gray discoloration because there is no formation of $MnO_2$. Moreover, the oxidohalides have greater stability owing to their higher lattice energy compared to other fluorides. In particular, in a case of tungstates, significant 7C back-bonding reduces an effective ion charge density on the Halide and W(VI) ions.

Tetravalent Mn(IV) ions are incorporated in crystallographic layers of hexavalent M ions (with M=Cr(VI), Mo(VI), W(VI), and/or Re(VI)). Doping of Mn(IV) permits a simple and efficient synthesis since the Mn(IV) ions are inserted efficiently into a crystal structure of the host lattice. A charge is balanced by an additional incorporation of the Halide and oxygen defect sites into the host lattice.

The phosphor is a red-emitting Mn(IV) luminescent material, and may have multiple peaks in a red spectral region, with a maximum peak value in a range between 610 nm and 640 nm, particularly between 620 nm and 635 nm.

In the above general formula (I), preferred alkyl radicals are linear C1-C5-alkyl radicals or branched C3-C5-alkyl radicals. Especially preferred alkyl radicals are methyl, ethyl, propyl, butyl, and pentyl. In addition, preferred aryl radicals are phenyl, naphthyl, anthryl, and phenanthryl, which may optionally be substituted by one or more radicals selected from methyl, ethyl, propyl, butyl, methoxy, ethoxy, hydroxyl, fluoride, chloride, and trifluoromethyl.

In the above general formula (I), A is a singly charged hydrogen and/or Deuterium cation A$^+$, and B is a singly charged metal and/or ammonium cation B$^+$. M is a hextuply charged metal atom M$^{6+}$. Mn(IV) is present as a quadruply charged metal atom Mn$^{4+}$, whereas Halogen X is present as a Halide (X$^-$) and Oxygen (O) as an oxide (O$^{2-}$). The Mn(IV)-activated luminescent materials of the present disclosure are conversion materials doped with Mn$^{4+}$, where one Mn$^{4+}$ ion and two $^{X-}$ ions replace one M$^{6+}$ ion and two O$^{2-}$ ions. Thus, the charge is balanced by the additional incorporation of two X$^-$ ions and an absence of two O$^{2-}$ ions.

The compounds of the present disclosure are generally excitable by light in a spectral range from about 250 nm to about 550 nm, preferably from about 325 nm to about 525 nm, where an absorption maximum is between 425 nm and 500 nm, and typically emit in a red spectral region from about 600 nm to about 650 nm, where an emission maximum is in a range between 610 nm and 640 nm, preferably between 620 nm and 635 nm. The compounds of the present disclosure also exhibit high photoluminescence quantum yields and have high spectral purity and high stability of color temperature when used in an LED.

In the present disclosure, ultraviolet light refers to light having an emission maximum between 100 m and 399 nm, violet light to light having an emission maximum between 400 nm and 430 nm, blue light to light having an emission maximum between 431 nm and 480 nm, cyan light to light having an emission maximum between 481 nm and 510 nm, green light to light having an emission maximum between 511 nm and 565 nm, yellow light to light having an emission maximum between 566 nm and 575 nm, orange light to light having an emission maximum between 576 nm and 600 nm, and red light to light having an emission maximum between 601 nm and 750 nm.

In a preferred exemplary embodiment, the Mn(IV)-doped compounds of the general formula (I) are represented by the following general formula (II):

$$(A_{4-a}B_a)_{m/2+n/2}X_{2m}[M_{1-x}X_{4+2x}O_{2-2x}]_n:$$
$$[Mn(IV)_x]_n, \tag{General Formula (II)}$$

where symbols and indices used are as follows:
A is selected from a group consisting of H and D and mixtures thereof, where D is Deuterium; B is selected from a group consisting of Li, Na, K, Rb, Cs, NH4, ND4 and NR4 and mixtures of two or more thereof, where R is an alkyl or aryl radical; X is selected from a group consisting of F and Cl and mixtures thereof; M is selected from a group consisting of Cr, Mo, W, and Re and mixtures of two or more thereof; and $0\leq a\leq4$; $0<m\leq10$; $1\leq n\leq10$; and $0<x<1.0$.

It is preferable that, for the index a in the general formulas (I) and (II): $1\leq a\leq4$ and more preferably $2.0\leq a\leq4.0$. In a preferred exemplary embodiment, a in the general formulas (I) and (II) is an integer from 1 to 4, more preferably an integer selected from 2, 3, and 4. Most preferably, in the general formulas (I) and (II): a=3.0.

It is preferable that, for the index m in the general formulas (I) and (II): $0.1\leq m\leq5$, more preferably 0.5 m 3.0, and most preferably 0.75 m 1.50. In a preferred exemplary embodiment, m in the general formulas (I) and (II) is an integer selected from 1, 2, and 3. Most preferably, in the general formulas (I) and (II): m=1.0.

It is preferable that, for the index n in the general formulas (I) and (II): 1 n 5 and more preferably $1.0\leq n\leq3.0$. In a preferred exemplary embodiment, n in the general formulas (I) and (II) is an integer from 1 to 5, more preferably an integer selected from 1, 2, and 3. Most preferably, in the general formulas (I) and (II): n=1.0.

In a preferred exemplary embodiment, the Mn(IV)-doped compounds of the general formula (I) or the compounds of the general formula (II) are represented by the following general formula (III):

$$AB_3M_{1-x}X_{6+2x}O_{2-2x}:Mn(IV)_x, \quad \text{(General Formula (III))}$$

herein, A, B, X, and M have one of the definitions given above for the general formula (I) and/or the general formula (II), and x is as follows: $0 \leq x \leq 1.0$.

Preferably, in the general formulas (I), (II) and/or (III), A is H or D, where D is Deuterium; more preferably, A is H. Preferably, in the general formulas (I), (II) and/or (III), B is selected from a group consisting of Na, K, Cs and mixtures of two or three thereof; more preferably, A is selected from a group consisting of Na and K. Preferably, in the general formulas (I), (II) and/or (III), X is F, where optionally at most 10 atomic % of X, more preferably at most 5 atomic % of X is Cl. More preferably, X in the general formulas (I), (II) and/or (III) is F. Preferably, in the general formulas (I), (II) and/or (III), M is selected from a group consisting of Mo, W and mixtures of Mo and W, where Cr and/or Re may be optionally present. More preferably, in the general formulas (I), (II) and/or (III), M is selected from Cr and Mo; Mo and W; Cr and W; Cr and Re; Mo and Re; W and Re; Cr, Mo and W; Cr, Mo and Re; Cr, W and Re; Mo, W and Re; and mixtures consisting of Cr, Mo, W and Re.

In a preferred exemplary embodiment, the index x of the general formulas (II) and (III) is as follows: $0 < x \leq 0.80$, more preferably $0 < x \leq 0.60$, even more preferably $0.0001 < x \leq 0.40$, especially preferably $0.001 \leq x \leq 0.20$, more especially preferably $0.001 \leq x \leq 0.10$, and most preferably $0.002 \leq x \leq 0.05$.

In a preferred exemplary embodiment, two or more of the above-mentioned preferred features are applicable simultaneously, irrespective of whether they are preferred, more preferred, especially preferred and/or most preferred features. Particular preference is therefore given to compounds of the general formulas (II) and (III) for which: A is selected from a group consisting of H and D and mixtures thereof, where D is Deuterium; B is selected from a group consisting of Na, K, Rb and mixtures of two or three thereof; X is F; M is selected from a group consisting of Mo, W and mixtures of Mo and W, where Cr and/or Re may be selectively present; $0.0001 < x \leq 0.40$, more preferably $0.001 < x \leq 0.20$, especially preferably $0.001 < x \leq 0.10$, most preferably $0.002 < x \leq 0.05$.

In especially preferred compounds of the general formula (II), further: $1 \leq a \leq 4$, more preferably $2.0 \leq a \leq 4.0$, most preferably $a = 3.0$; $0.5 \leq m \leq 3.0$, more preferably $0.75 \leq m \leq 1.50$, most preferably $m = 1.0$; and $1 \leq n \leq 5$, more preferably $1.0 \leq m \leq 3.0$, most preferably $n = 1.0$.

Meanwhile, the wavelength converters 102a and 202a may include, for example, green or yellow phosphors. For example, the phosphor that emits light in a green wavelength band may include a yttrium-aluminum-garnet-based phosphor (for example, $Y_3(Al, Ga)_5O_{12}:Ce$), a lutetium-aluminum-garnet-based phosphor (for example, $Lu_3(Al, Ga))_5O_{12}:Ce$), a terbium/aluminum/garnet-based phosphor (for example, $Tb_3(Al, Ga)_5O_{12}:Ce$), a silicate-based phosphor (for example, $(Ba, Sr)_2SiO_4:Eu$), a chlorosilicate-based phosphor (for example, $Ca_8Mg(SiO_4)_4Cl_2:Eu$), a β-sialon-based phosphor (for example, $Si_{6-z}Al_zO_zN_{8-z}:Eu$ ($0 < z < 4.2$)), a SGS-based phosphor (for example, $SrGa_2S_4:Eu$), and the like. The yellow phosphor may include an α-sialon-based phosphor (for example, $M_z(Si, Al)_{12}(O, N)_{16}$ (provided that $0 < z \leq 2$, and M is Li, Mg, Ca, Y, and lanthanum elements excluding La and Ce), and the like.

In addition, among the phosphors emitting light in the green wavelength region, there are also phosphors emitting light in a yellow wavelength region. In addition, for example, in the yttrium/aluminum/garnet-based phosphor, by substituting a portion of Y for Gd, an emission peak wavelength may be shifted toward a longer wavelength, and thus, it is possible to emit light in the yellow wavelength region.

The light emitting devices 101, 102, 103, 201, 202, and 203 described with reference to FIGS. 1 and 2 may be independently controlled and driven. For this purpose, the light emitting module may further include the control unit 204 as shown in FIG. 2. The control unit 204 may be disposed on the substrate 200. The control unit 204 may implement a light emission pattern or a light emission wavelength according to a user's input. For example, all of the light emitting devices mounted on the substrate 200 may be driven, or alternatively, only some of the light emitting devices may be driven, and through this, light of the light emission pattern or the light emission wavelength desired by a user may be implemented. Accordingly, the light emitting module may be used in a personalized lighting apparatus inside or outside a building, or inside or outside a vehicle.

The protection material 205 covers the light emitting devices 201, 202, and 203. The protection material 205 may prevent the light emitting devices 201, 202, and 203 from being peeled off from the substrate 200. In particular, when the substrate 200 is rollable, the protection material 205 may adhere the light emitting devices 201, 202, and 203 to the substrate 200 to prevent peeling. Furthermore, the protection material 205 protects the light emitting devices 201, 202, and 203 from external environments. The protection material 205 may have a curved shape, and by using the curved shape, a light emission efficiency may be increased like a lens.

In some forms, the protection material 205 may be formed of transparent silicone. In another form, the protection material 205 may also include a light diffuser. The light diffuser diffuses light generated from the light emitting devices 201, 202, and 203 over a wide region. Accordingly, for example, even when only portions of the light emitting devices 201, 202, and 203 mounted on the substrate 200 are turned on, light may be widely spread around a light diffuser 205. Thus, it is possible to remove a dark portion that may be generated in a failed light emitting device or a region between the light emitting devices, and a linear or planar light source may be implemented.

In addition, when a plurality of light emitting devices is turned on so as to implement a wavelength desired by the user, light emitted from the light emitting devices may be mixed with each other by the light diffuser in the protection material 205, and through this, various colors of light may be implemented by using a small number of light emitting devices.

Figure 3:
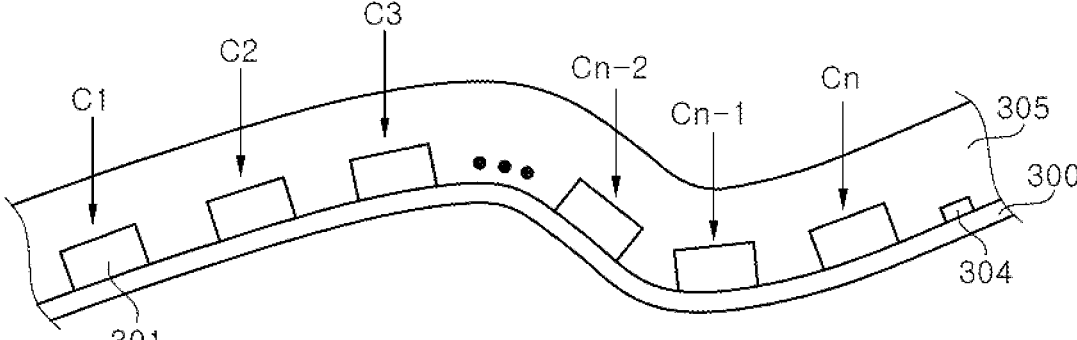
FIG. 3 is a cross-sectional view of a light emitting module according to a third exemplary embodiment.

In the exemplary embodiments described with reference to FIGS. 1 and 2, it has been described that some light source units include wavelength converters 101a, 102a, 201a, and 202a to implement light of various colors, but a light emitting module in which light source units implement light of various colors without a wavelength converter may be provided. Hereinafter, a light emitting module that implements light of various colors using light emitting devices without a wavelength converter will be described. FIG. 3 is a cross-sectional view of a light emitting module according to a third exemplary embodiment, FIG. 4 is a cross-sectional view of a light emitting device according to a fourth exemplary embodiment, and FIG. 5 is an enlarged partial cross-sectional view of FIG. 4.

First, referring to FIG. 3, the light emitting module may include a substrate 300 and light emitting devices 301, and further, may include a control unit 304 and a protection material 305. In the illustrated exemplary embodiment, each light source unit implements a color by using the light emitting device 301 without a wavelength converter. The substrate 300, the control unit 304, and the protection material 305 are similar to the above-described substrate 200, the control unit 204, and the protection material 205, and detailed descriptions thereof will be omitted.

In the illustrated exemplary embodiment, the light emitting devices 301 include light emitting devices showing different emission spectrums. The light emitting devices 301 (C1 to Cn) include at least one of light emitting devices to be described later with reference to FIG. 4.

Figure 4:
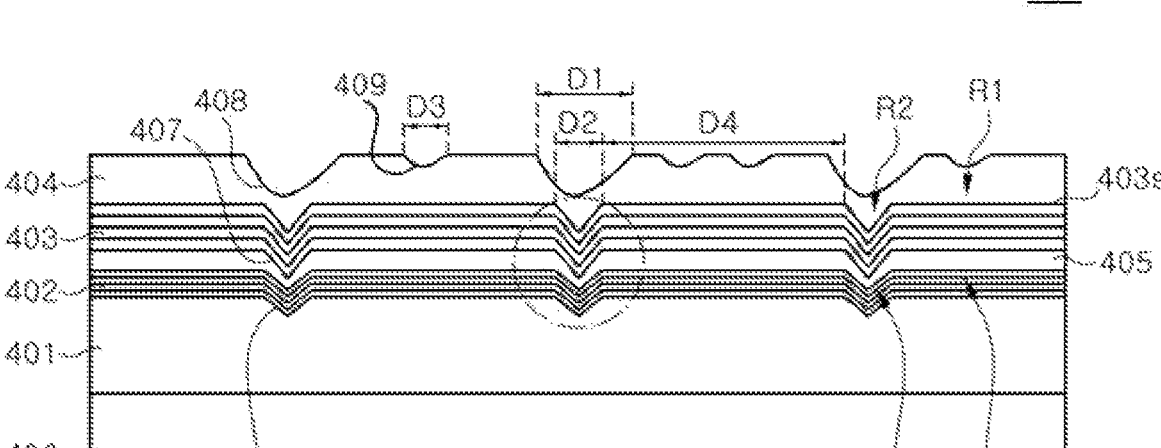
FIG. 4 is a cross-sectional view of a light emitting device according to a fourth exemplary embodiment.
Figure 5:
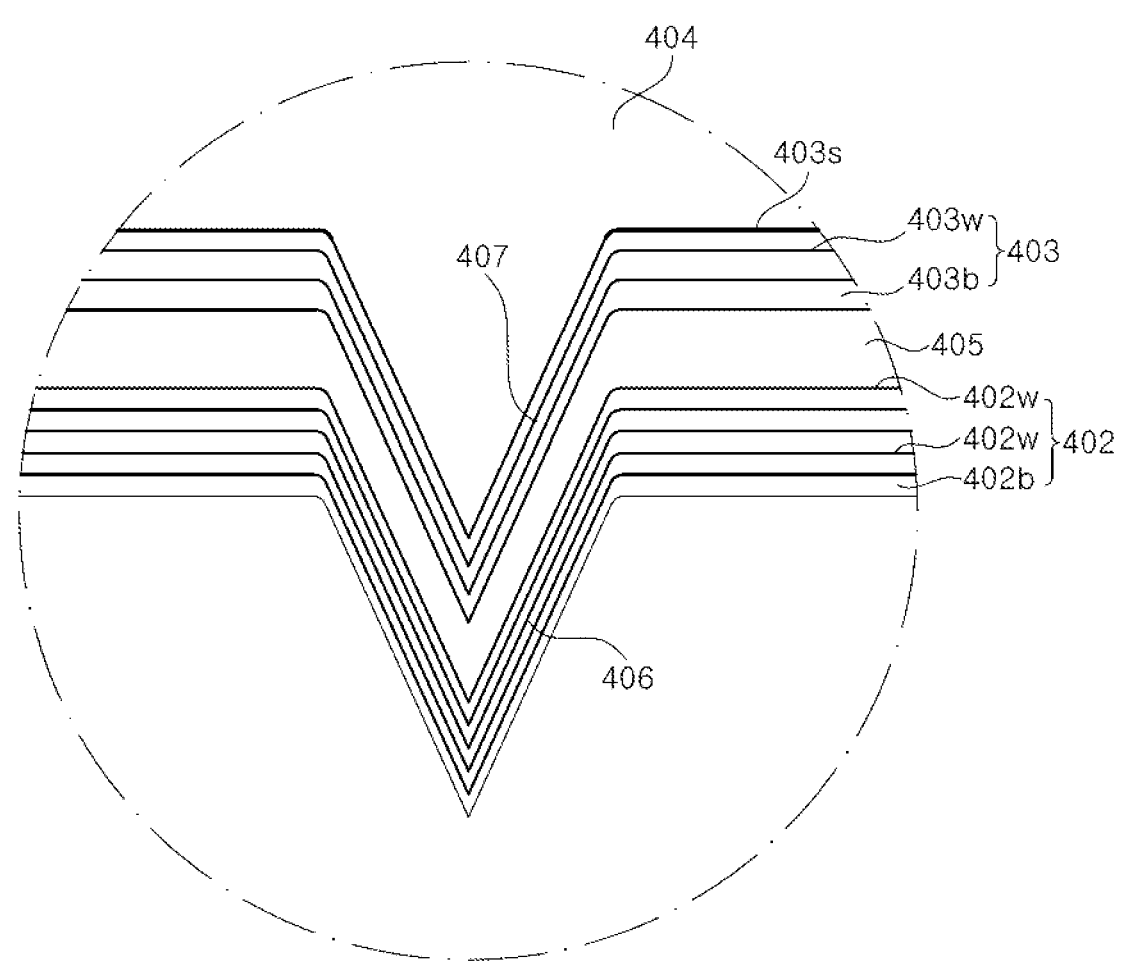
FIG. 5 is an enlarged partial cross-sectional view of FIG. 4.

Referring to FIGS. 4 and 5, the light emitting device 301 may include a substrate 400, a first conductivity type semiconductor layer 401, a lower multiple quantum well structure 402, an upper multiple quantum well structure 403, a second conductivity type semiconductor layer 404, a spacer layer 405, and a step coverage layer 403s. In addition, although not shown, the light emitting device 301 includes an electrical connection structure for being electrically connected to a circuit pattern of the substrate 300. For example, the light emitting device 301 may include an ohmic layer in ohmic contact with the first and second conductivity type semiconductor layers 401 and 404 and electrode pads.

In the illustrated exemplary embodiment, the substrate 400 may be a growth substrate for growing a gallium nitride-based semiconductor layer, for example, a sapphire substrate, a silicon substrate, a SiC substrate, a spinel substrate, or the like. In particular, the substrate 400 may be a patterned sapphire substrate.

The first conductivity type semiconductor layer 401 may be a multiple layer, and may include, for example, a nucleation layer, a high-temperature buffer layer, an n-type impurity doped layer, and the like. In addition, the first conductivity type semiconductor layer 401 may include a plurality of grooves on an upper surface thereof. A semiconductor layer formed in an upper portion of the first conductivity type semiconductor layer 401 may be formed of, for example, a GaN layer, and a plurality of grooves may be formed by growing the GaN layer at a temperature of about 900° C. or lower.

The second conductivity type semiconductor layer 404 is disposed in the upper portion of the first conductivity type semiconductor layer 401. The second conductivity type semiconductor layer 404 may be formed as a single layer or multiple layers, and may include, for example, a layer doped with a p-type impurity.

The lower multiple quantum well structure 402 and the upper multiple quantum well structure 403 are disposed between the first conductivity type semiconductor layer 402 and the second conductivity type semiconductor layer 404, and the spacer layer 405 may be disposed between the lower multiple quantum well structure 402 and the upper multiple quantum well structure 404.

The lower multiple quantum well structure 402 may be formed on the first conductivity type semiconductor layer 401. The lower multiple quantum well structure 402 has a structure in which barrier layers 402b and well layers 402w are alternately stacked. The well layer 402w has a composition for emitting light of a first wavelength. For example, the well layer 402w may be formed of an InGaN layer or an AlInGaN layer, and may emit light in an ultraviolet region, a blue region, or a green region. For example, an Indium (In) content included in the well layer 402w may be 18 atomic % or less, and further, may be 12 atom % or less with respect to that of a total Group 3 elements.

The upper multiple quantum well structure 403 is disposed in an upper region of the lower multiple quantum well structure 402, and has a structure in which the barrier layers 403b and the well layers 403w are alternately stacked. The well layer 403w has a composition for emitting light of a second wavelength. Light of the second wavelength may have a wavelength longer than light of the first wavelength. For example, the well layer 403w may be formed of an InGaN layer or an AlInGaN layer, and may emit light in the green region or the red region. For example, an In content included in the well layer 403w may be 15 atomic % or more and less than 30 atomic % with respect to that of the total group 3 elements.

Meanwhile, the barrier layers 403b in the upper multiple quantum well structure 403 may be thicker than the barrier layers 402b in the lower multiple quantum well structure 402. In addition, the well layers 403w in the upper multiple quantum well structure 403 may be thicker than the well layers 402w in the lower multiple quantum well structure 402. As the upper multiple quantum well structure 403 is close to the second conductivity type semiconductor layer 404, the barrier layers 403b may be formed to be relatively thick to prevent electrons and holes from overflowing. Meanwhile, as the lower multiple quantum well structure 402 is relatively far from the second conductivity type semiconductor layer 404, a thickness of the barrier layers 402b may be relatively thin such that holes are well spread in the lower multiple quantum well structure 402. For example, the barrier layers 402b may have a thickness of 4 nm to 7 nm, and the barrier layers 403b may have a thickness of 8 nm to 15 nm.

As shown in FIG. 4, the upper multiple quantum well structure 403 may include a first region R1 and a second region R2. The first region R1 may have a substantially flat surface, and the second region R2 may have a non-flat surface. In some forms, the second region R2 form grooves as the non-flat surface. As shown in FIGS. 4 and 5, the grooves may be formed to have a V-shape, but the present disclosure is not limited thereto. The first region R1 is illustrated as being formed of a plurality of regions in the cross-sectional view of FIG. 4. In plan view, the first region R1 surrounds a plurality of second regions R2. The second regions R2 may be disposed on grooves formed in the upper region of the first conductivity type semiconductor layer 401. The barrier layers 403b and the well layers 403w of the upper multiple quantum well structure 403 are sequentially disposed in the first region R1 and the second region R2. At the location where the first region R1 and the second region R2 meet, upper surfaces of the barrier layers 403b and the well layers 403w may have a curved shape. Accordingly, it is possible to prevent cracks from occurring in the barrier layers 403b or the well layers 403w, thereby preventing a charge leakage.

In some forms, the barrier layers 403b and the well layers 403w have different thicknesses in the first region R1 and the second region R2. That is, the thicknesses of the barrier layers 403b and the well layers 403w in the first region R1 may be formed larger than those of the barrier layers 403b and the well layers 403w in the second region R2. Furthermore, an Indium (In) content in the well layers 403w of the second region R2 is smaller than an Indium (In) content in the well layers 403w in the first region R1. Accordingly, the multiple quantum well structure 403 includes a multiple quantum well structure in the first region R1 and a multiple quantum well structure 407 in the second region, which are different from each other. The multiple quantum well structure of the first region R1 may emit light of the second wavelength described above, whereas the multiple quantum well structure 407 of the second region R2 may emit light of a third wavelength having a wavelength shorter than light of the second wavelength. Additionally, or alternatively, light of the third wavelength may be light of a shorter wavelength, a longer wavelength, or a same wavelength as light of the first wavelength emitted from the lower multiple quantum well structure 402.

For example, an Indium (In) in the well layers 403w in the first region R1 may be 15 atomic % or more, and less than 30 atomic % with respect to that of the total group 3 elements so as to emit light of the first wavelength. In contrast, an Indium (In) in the well layers 403w in the second region R2 may be less than about 7 atomic % to about 12 atomic %, further, about 8 atomic % to about 10 atomic % with respect to that of the total group III element so as to emit light of the third wavelength.

As shown in FIG. 4, a width D4 of the first region R1 may be greater than a width D2 of the second region R2, and thus, a relatively wide flat surface may be formed on the second conductivity type semiconductor layer 404 formed on the upper multiple quantum well structure 403, and an electrode may be easily formed on the second conductivity type semiconductor layer 404.

The lower multiple quantum well structure 402 may also include a third region R3 having a flat surface and a fourth region R4 having a non-flat surface and forming grooves. Thicknesses of the barrier layers 402b and the well layers 402w in the third region R3 may be greater than those of the barrier layers 402b and the well layers 402w in the fourth region R4. The fourth regions R4 are located in a lower portion of the second regions R2. At least portions of the groove of the second region R2 and the groove of the fourth region R4 may overlap in a vertical direction, as shown in FIG. 4. In addition, a portion closest to the substrate 400 in the second region R2 may be located in a groove region of the fourth region R4.

The lower multiple quantum well structure 402 may emit light of the first wavelength described above in the third region R3, and the multiple quantum well structure 406 in the fourth region R4 may not emit light. However, the inventive concepts are not limited thereto, and the multiple quantum well structure 406 in the fourth region R4 may emit light of a wavelength shorter than light of the first wavelength.

In some embodiments, the number of pairs of layers constituting the lower multiple quantum well structure 402 affects a peak intensity of light of the first wavelength. As the number of pairs of the lower multiple quantum well structure 402 increases, the peak intensity of light of the first wavelength, for example, the peak intensity of a blue region may increase. In addition, the number of pairs of the lower multiple quantum well structure 402 and that of pairs of the upper multiple quantum well structure 403 may be adjusted differently. For example, the number of pairs of the lower multiple quantum well structure 402 may be greater than that of pairs of the upper multiple quantum well structure 403, and thus, the peak intensity of light of the first wavelength may be set to be greater than that of light of the second wavelength. Furthermore, the well layers of the lower multiple quantum well structure 402 may have different band gaps from one another. For example, the lower multiple quantum well structure 402 may include a first group of well layers and a second group of well layers, in which the first group of well layers may have an Indium (In) content relatively higher than that of the second group of well layers. In particular, the second group of well layers may be disposed between the first group of well layers and the upper multiple quantum well structure 403. For example, the first group of well layers may include an Indium (In) content of 10 atomic % or more, and the second group of well layers may include an Indium (In) content of less than 10 atomic %.

In another exemplary embodiment, the number of pairs of the lower multiple quantum well structure 402 may be smaller than the number of pairs of the upper multiple quantum well structure 403. Accordingly, in spectrums of light emitted from the light emitting device 301, a peak intensity of light in a shorter wavelength region may be smaller than that of light in a longer wavelength region.

The spacer layer 405 may be disposed between the lower multiple quantum well structure 402 and the upper multiple quantum well structure 403. The spacer layer 405 may have a band gap that is wider than or equal to that of the barrier layer 402b in the lower multiple quantum well structure 402. The spacer layer 405 may include GaN, AlGaN, or AlInGaN. By adjusting the band gap of the spacer layer 405, a concentration of holes injected into the lower multiple quantum well structure 402 may be controlled, and through this, the intensity of light emitted from the lower multiple quantum well structure 402 may be adjusted. For example, when the spacer layer 405 includes a relatively high Al content and has a wide band gap, the spacer layer 405 prevents holes from being injected into the lower multiple quantum well structure 402. Accordingly, as the number of electron-hole pairs in the lower multiple quantum well structure 402 decreases, an emission intensity may be reduced. Conversely, as the number of holes trapped in the upper multiple quantum well structure 403 increases, the emission intensity of the upper multiple quantum well structure 403 will increase. A thickness of the spacer layer 405 also affects hole injection.

As described above, by adjusting the numbers of pairs of the lower multiple quantum well structure 402 and the upper multiple quantum well structure 403, and the band gap and the thickness of the spacer layer 405, relative light emission intensities of the lower multiple quantum well structure 402 and the upper multiple quantum well structure 403 may be adjusted.

As shown in FIGS. 4 and 5, the step coverage layer 403s is disposed on the upper multiple quantum well structure 403. The step coverage layer 403s may have a band gap wider than that of the barrier layer 403b of the upper multiple quantum well structure 403. In some forms, the step coverage layer 403s may be formed of, for example, AlGaN or AlInGaN. The step coverage layer 403s may be an Al grading layer in which an Al content decreases as a distance from the upper multiple quantum well structure 403 increases. For example, the Al content in the step coverage layer 403s may decrease in a thickness direction from 30 atomic % or more to 10 atomic % or less. The thickness of the step coverage layer 403s may be less than about 100 nm, and in a particular exemplary embodiment, may be less than about 50 nm, further less than about 30 nm.

By forming the step coverage layer 403s as the grading layer, holes may be set to be smoothly injected into the upper multiple quantum well structure 403, and may also assist to generate light of the third wavelength in the second region R2 of the upper multiple quantum well structure 403. In particular, an intensity of light with a peak wavelength of a longer wavelength may be controlled to be superior to light with a peak wavelength of a shorter wavelength emitted through electroluminescence through the step coverage layer 403s.

The second conductivity type semiconductor layer 404 may be disposed on the step coverage layer 403s. The second conductivity type semiconductor layer 404 may include surface grooves 408 corresponding to the second regions R2. An inlet width of the surface groove 408 may be greater than those of the grooves of the second regions R2. In addition, a sub-surface groove 409 may also be formed in an upper region of the first region R1, and an inlet width of the sub-surface groove 409 may be smaller than that of the surface groove 408. A light extraction efficiency may be improved by varying sizes of the surface grooves 408 and 409. Furthermore, the surface grooves 408 and 409 may increase a contact area of an ohmic electrode such as ITO, and thus, a driving voltage may be lowered and a reliability of the light emitting device 301 may be improved.

According to the illustrated exemplary embodiment, by disposing the lower multiple quantum well structure 402 and the upper multiple quantum well structure 403 and by adjusting the numbers of pairs of barrier layers and well layers, compositions of the well layers, the spacer layer 405, and the step coverage layer 403s in these multiple quantum well structures 402 and 403, it is possible to implement various wavelengths from one light emitting device 301 desired by a user, and color coordinates (CIE) and color rendering indices (CRI) of light emitted from the light emitting device 301 may be adjusted. As such, it is possible to provide a light emitting device capable of achieving desired CIE and CRI from one light emitting device 301 without combining the plurality of light emitting devices. In addition, light of a wavelength for sterilization desired by a user may be implemented from the light emitting device 301, and a sterilization wavelength may be controlled.

Figure 6A:
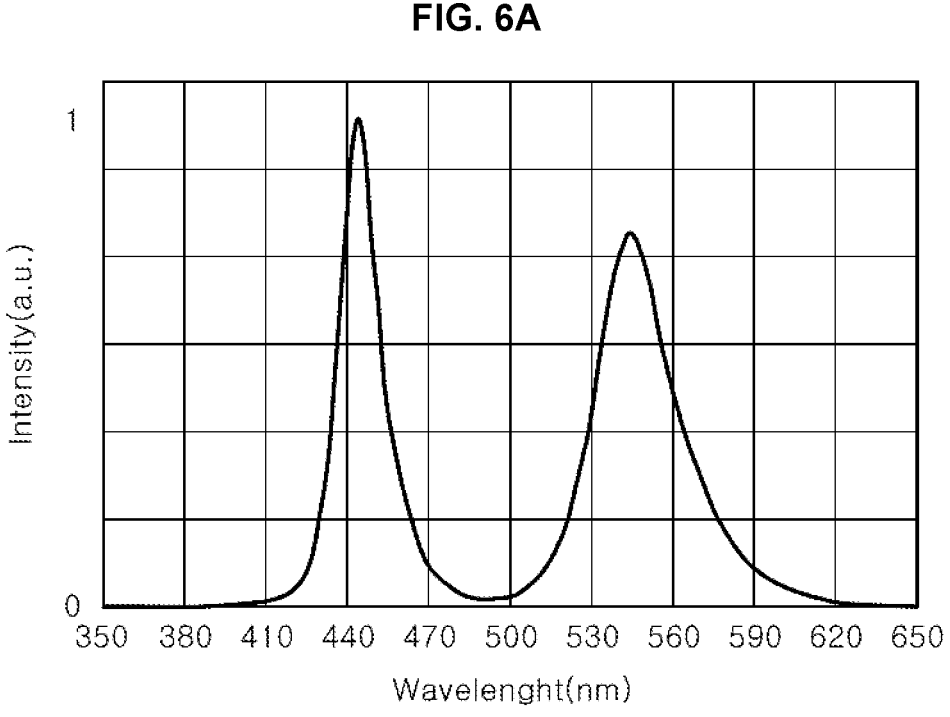
FIG. 6A through FIG. 6O are graphs showing emission spectrums of light emitting devices manufactured according to various exemplary embodiments.
Figure 6B:
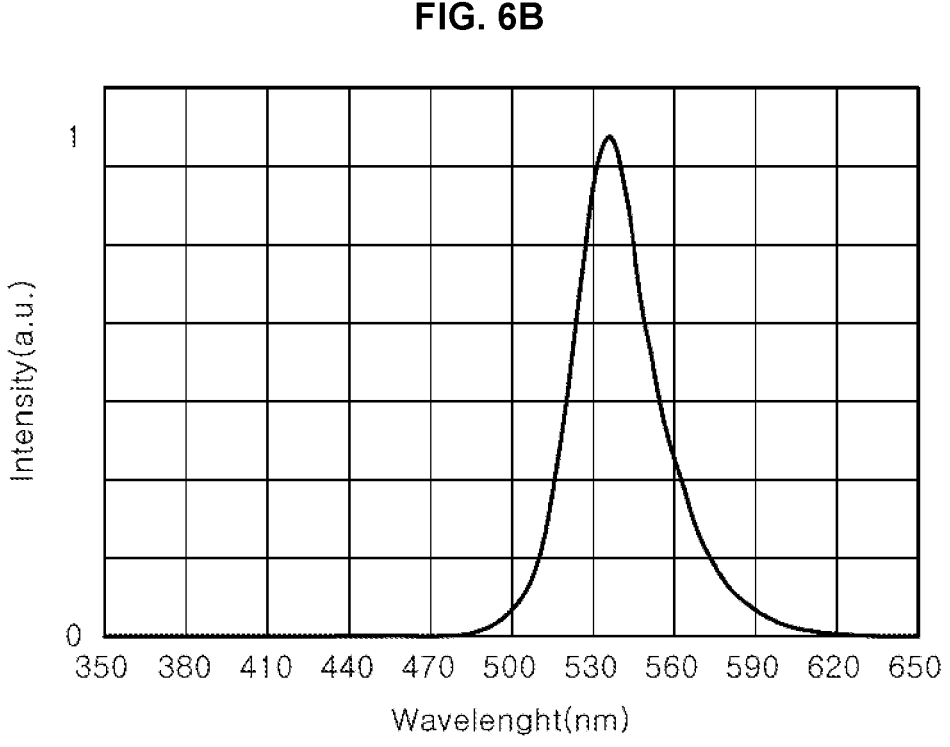
FIG. 6B is a graph showing a spectrum of light in which a light emitting device has a single peak and CIE coordinates (x, y) are within a range of 0.17<x<0.38, and 0.4<y<0.8.
Figure 6C:
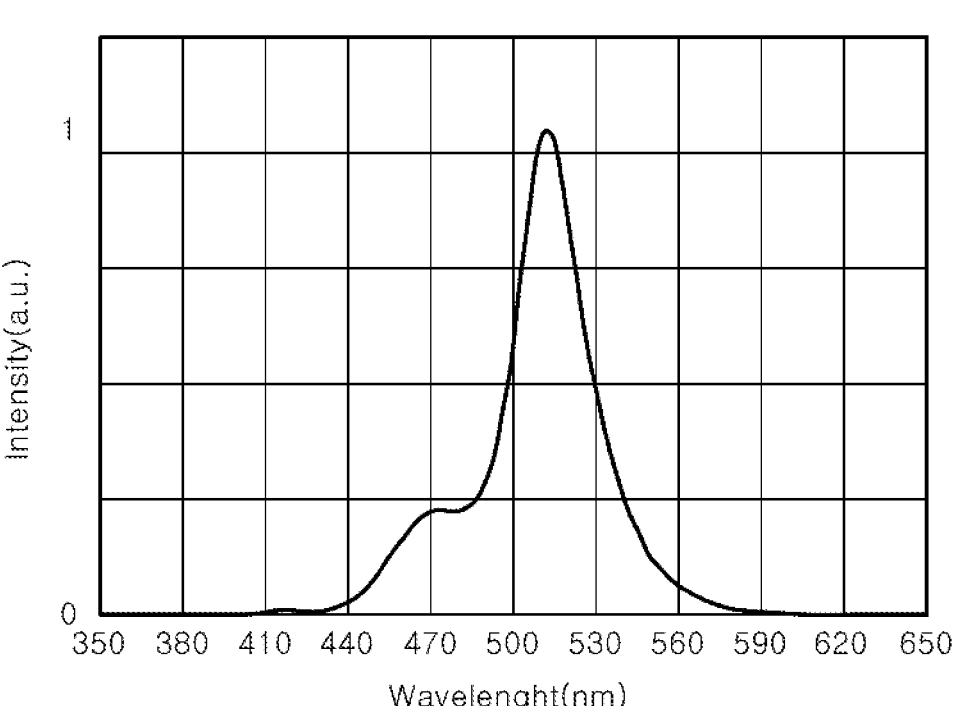
FIG. 6C is a graph showing a spectrum of light in which a light emitting device has a plurality of peaks and CIE coordinates (x, y) are within a range of 0<x<0.3, and 0.35<y<0.85.
Figure 6D:
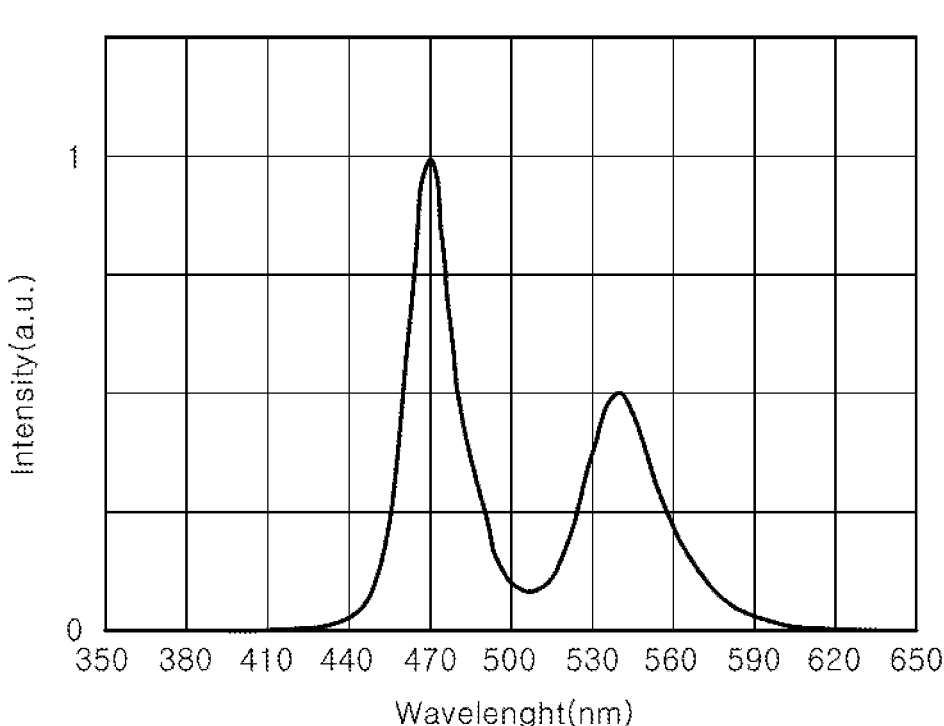
FIG. 6D is a graph showing a spectrum of light in which a light emitting device has a plurality of peaks and CIE coordinates (x, y) are within a range of 0.03<x<0.25, and 0.25<y<0.35.
Figure 6E:
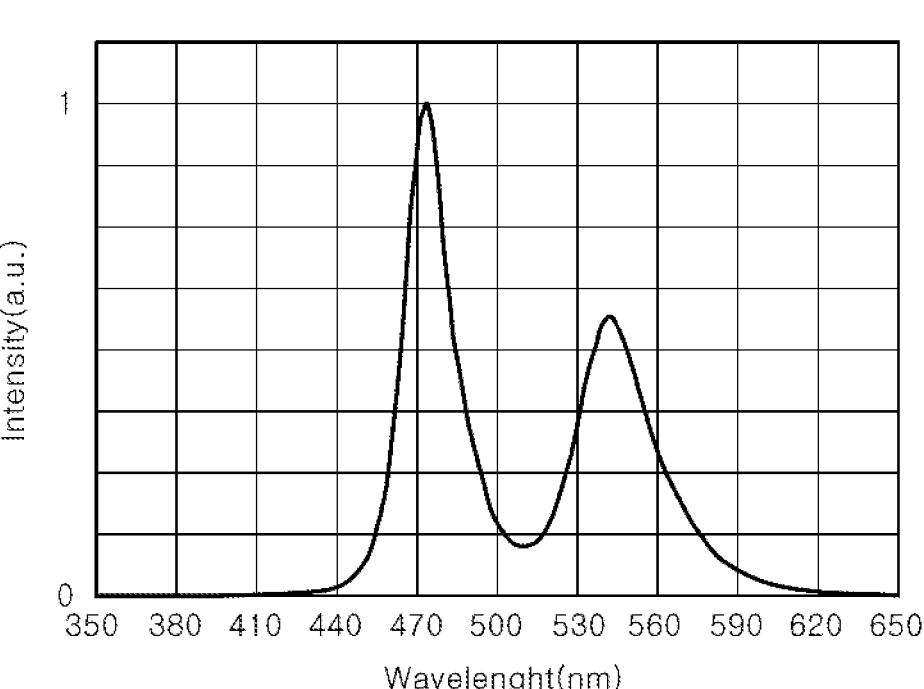
FIG. 6E is a graph showing a spectrum of light in which a light emitting device has a plurality of peaks and CIE coordinates (x, y) are within a range of 0.02<x<0.25, and 0.35<y<0.48.
Figure 6F:
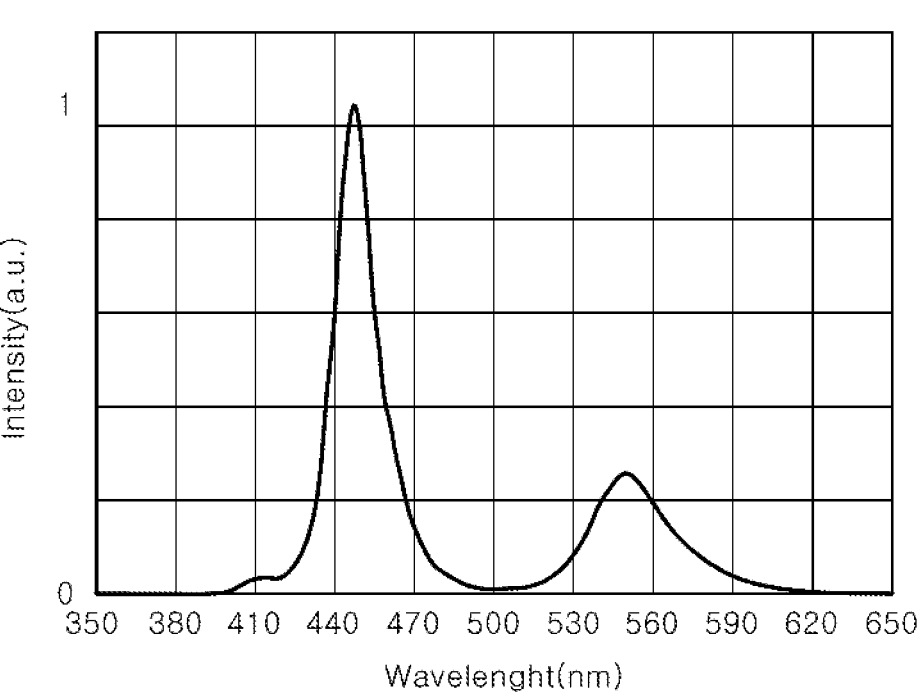
FIG. 6F is a graph showing a spectrum of light in which a light emitting device has a plurality of peaks and CIE coordinates (x, y) are within a range of 0.13<x<0.22, and 0<y<0.2.
Figure 6G:
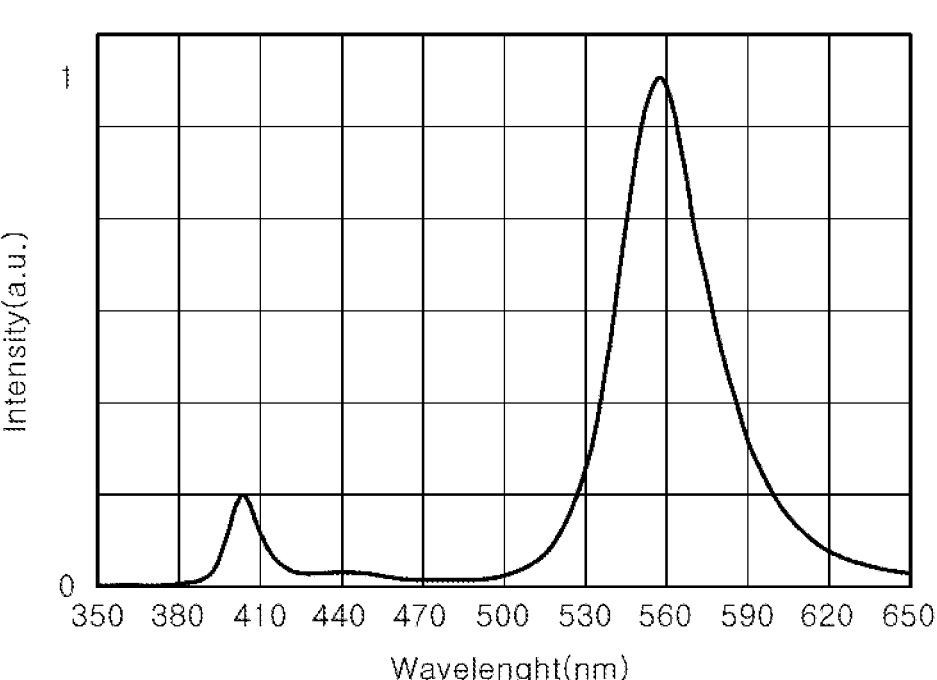
FIG. 6G is a graph showing a spectrum of light in which a light emitting device has a plurality of peaks and CIE coordinates (x, y) are within a range of 0.35<x<0.45, and 0.43<y<0.62.
Figure 6H:
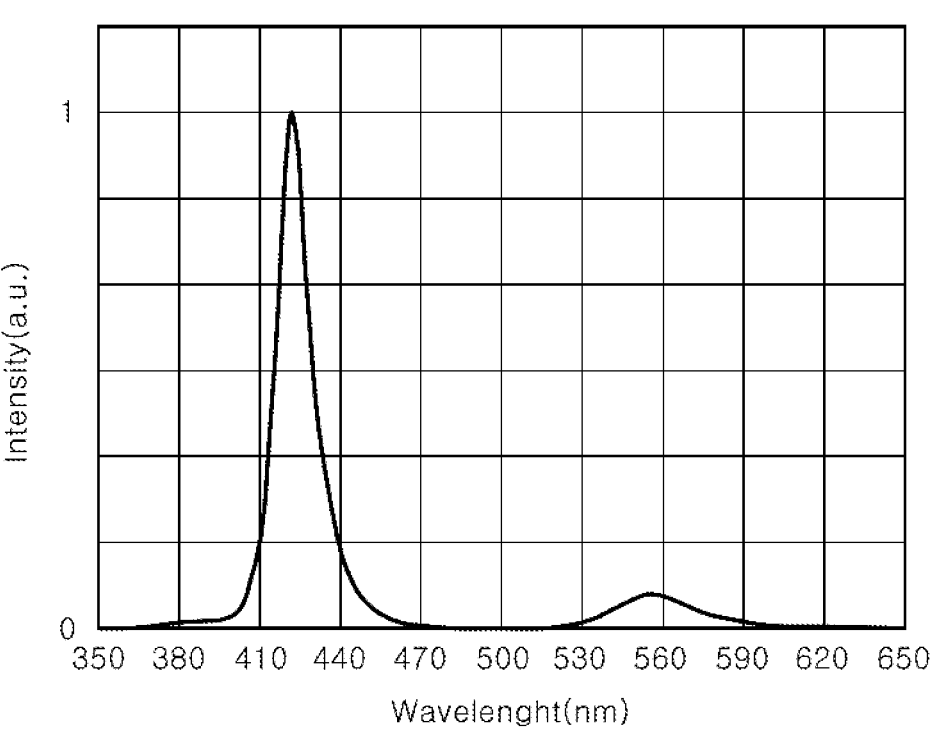
FIG. 6H is a graph showing a spectrum of light in which a light emitting device has a plurality of peaks and CIE coordinates (x, y) are within a range of 0.17<x<0.25, and 0<y<0.2.
Figure 6I:
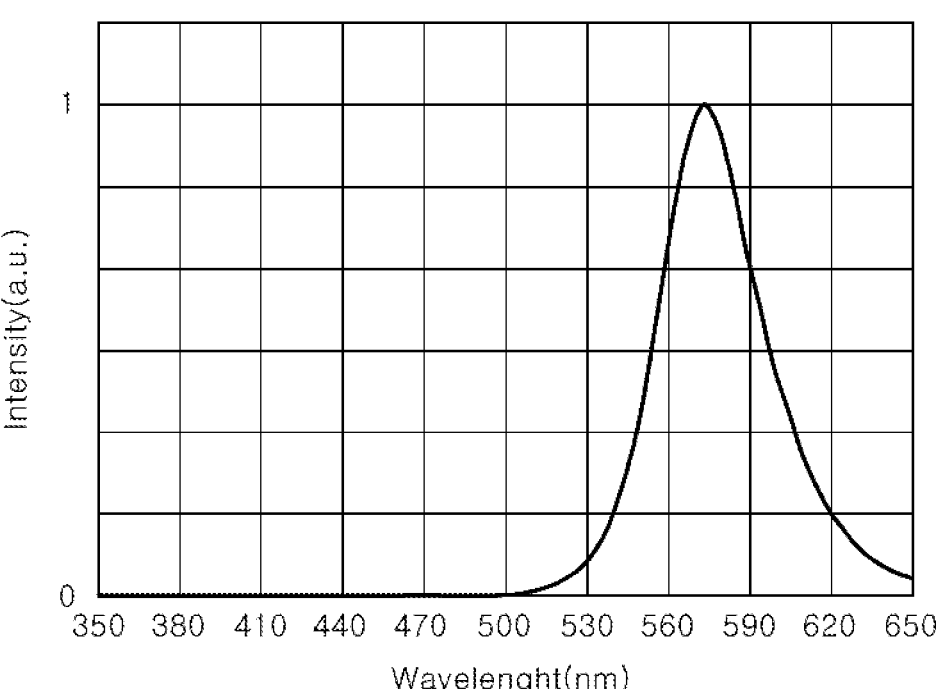
FIG. 6I is a graph showing a spectrum of light in which a light emitting device has a single peak and CIE coordinates (x, y) are within a range of 0.39<x<0.49, and 0.45<y<0.55.
Figure 6J:
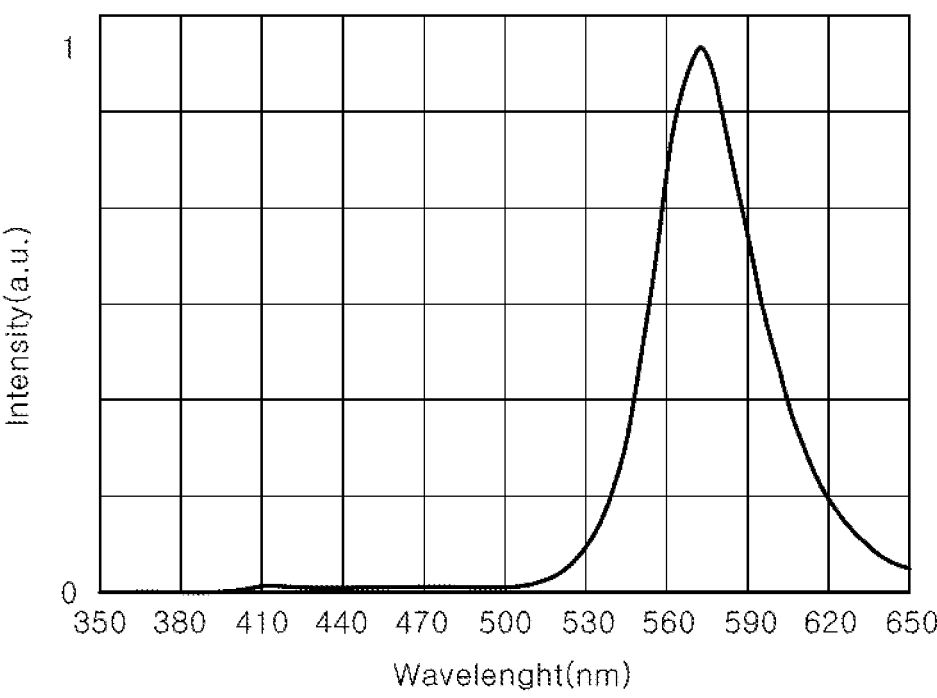
FIG. 6J is a graph showing a spectrum of light in which a light emitting device has a plurality of peaks and CIE coordinates (x, y) are within a range of 0.44<x<0.53, and 0.45<y<0.52.
Figure 6K:
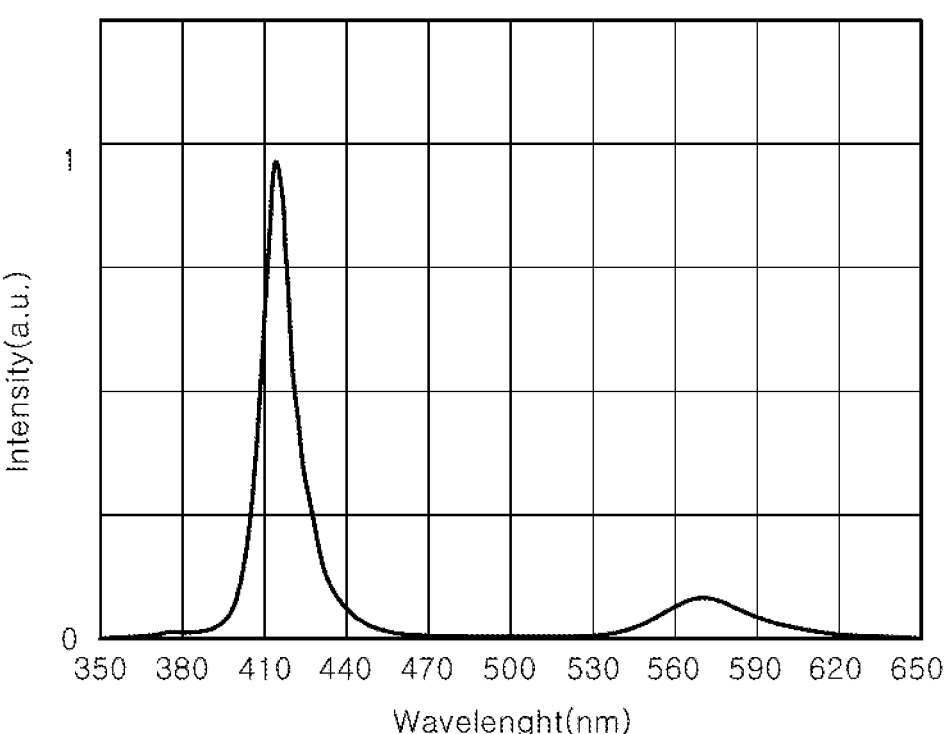
FIG. 6K is a graph showing a spectrum of light in which a light emitting device has a plurality of peaks and CIE coordinates (x, y) are within a range of 0.2<x<0.33, and 0.02<y<0.22.
Figure 6L:
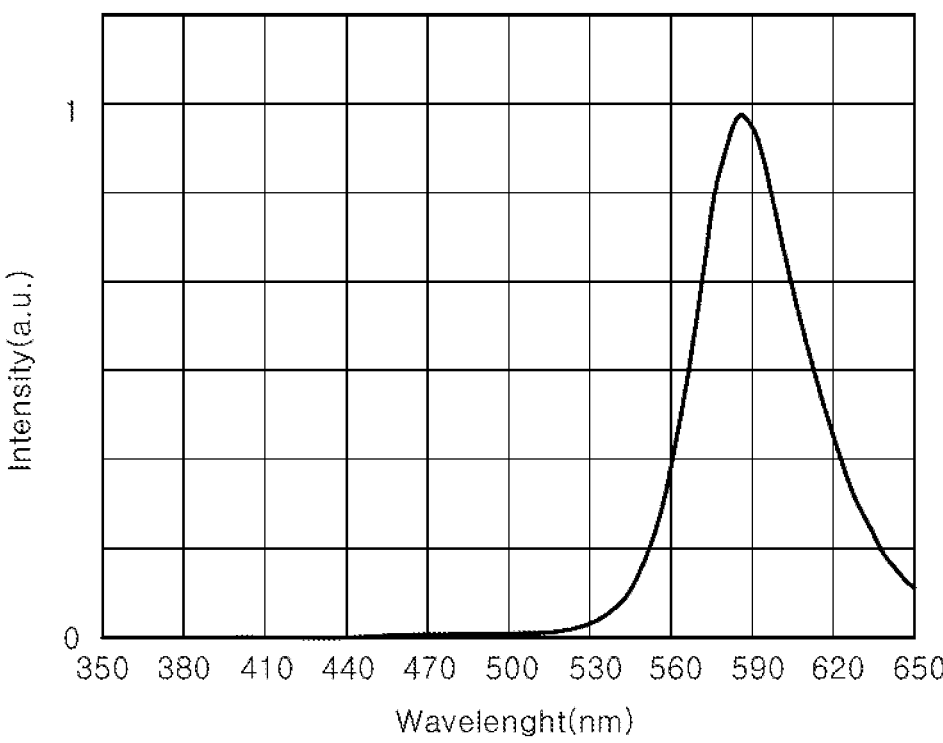
FIG. 6L is a graph showing a spectrum of light in which a light emitting device has a single peak and CIE coordinates (x, y) are within a range of 0.46<x<0.55, and 0.43<y<0.49.
Figure 6M:
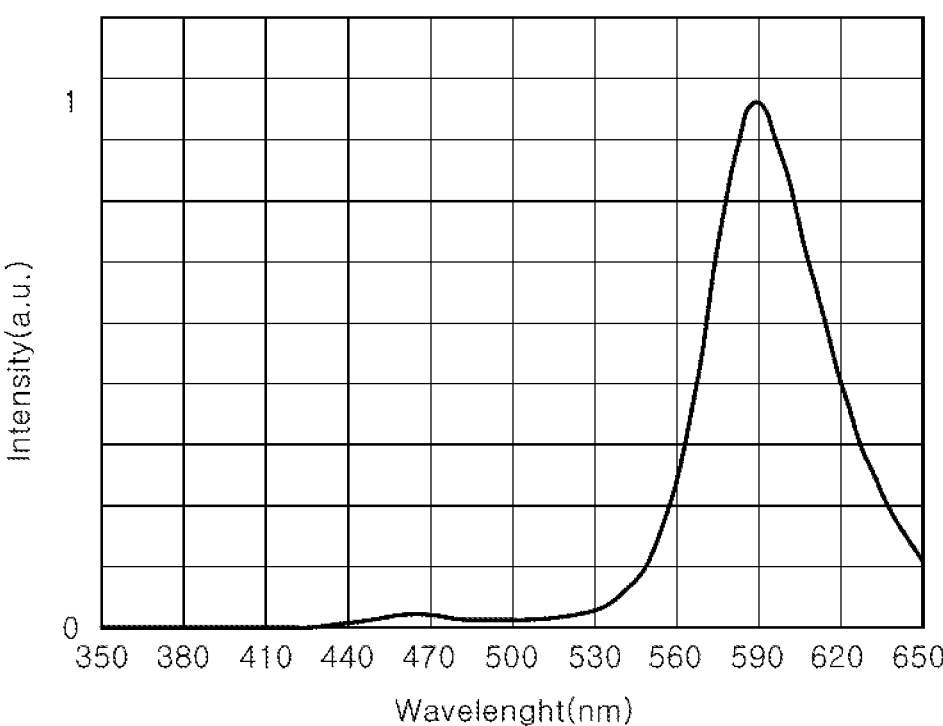
FIG. 6M is a graph showing a spectrum of light in which a light emitting device has a plurality of peaks and CIE coordinates (x, y) are within a range of 0.28<x<0.38, and 0.06<y<0.24.
Figure 6N:
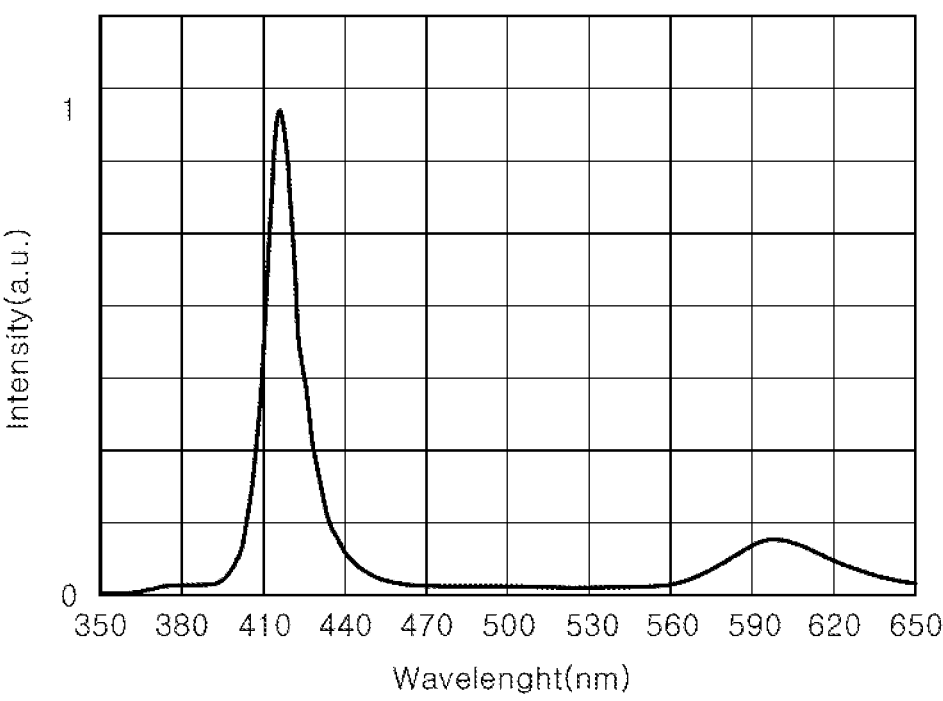
FIG. 6N is a graph showing a spectrum of light in which a light emitting device has a plurality of peaks and CIE coordinates (x, y) are within a range of 0.28<x<0.38, and 0.06<y<0.24.
Figures 6O, 7A:
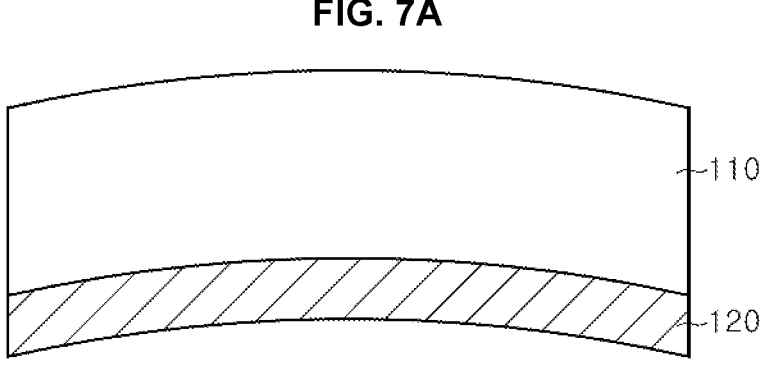
FIGS. 7A and 7B are cross-sectional views illustrating a method of manufacturing a light emitting device according to an exemplary embodiment.

FIG. 6A through FIG. 6O show emission spectrums of various light emitting devices 301 obtained by adjusting the lower and upper multiple quantum well structures 402 and 403, the step coverage layer 403s, and the spacer layer 405. Herein, the light emitting device 301 was driven under a current density of about 35 A/cm 2.

Referring to FIG. 6A through FIG. 6O, light having a single peak or a plurality of peaks may be emitted from one light emitting device by adjusting the lower quantum well structure 402, the upper quantum well structure 403, the step coverage layer 403s, and the spacer layer 405. In exemplary embodiments of the present disclosure, active layers emitting light having a plurality of peaks, for example, the lower quantum well structure 402 and the upper quantum well structure 403 share the first conductivity type semiconductor layer 401 or the second conductivity type semiconductor layer 404, or share the substrate 400.

Referring to FIG. 6A, the light emitting device may emit light having a plurality of peaks and CIE coordinates (x,y) within a range of 0.2<x<0.48, and 0.15<y<0.4. The color coordinate of light emitted from the light emitting device of this exemplary embodiment is approximately (0.21, 0.27). The light emitting device may emit light close to white without a phosphor. The plurality of peaks may include a first peak within a range of 400 nm to 500 nm and a second peak within a range of 500 nm to 600 nm, and a peak of a shorter wavelength may exhibit a higher intensity than a peak of a longer wavelength.

Referring to FIG. 6B, the light emitting device may emit light having a single peak and CIE coordinates (x,y) within a range of 0.17<x<0.38, and 0.4<y<0.8. The color coordinate of the emitted light in this exemplary embodiment is approximately (0.27, 0.70). For example, the light emitting device may emit yellowish green light without a phosphor through light of the second wavelength emitted from the first region of the upper quantum well structure 403.

Referring to FIG. 6C, the light emitting device may emit light having a plurality of peaks and CIE coordinates (x,y) within a range of 0<x<0.3, and 0.35<y<0.85. The color coordinate of the emitted light in this exemplary embodiment is approximately (0.15, 0.64). For example, the light emitting device may emit green light without a phosphor. The plurality of peaks may include a first peak within a range of 400 nm to 500 nm and a second peak within a range of 500 nm to 600 nm, and a peak of a shorter wavelength may exhibit a smaller emission intensity than a peak of a longer wavelength.

Referring to FIG. 6D, the light emitting device may emit light having a plurality of peaks and CIE coordinates (x,y) within a range of 0.03<x<0.25, and 0.25<y<0.35. The color coordinate of the emitted light in this exemplary embodiment is approximately (0.19, 0.33). For example, the light emitting device may emit blue green light without a phosphor. The plurality of peaks may include a first peak within a range of 400 nm to 500 nm and a peak within a second range of 500 nm to 600 nm, and a peak of a shorter wavelength within the range of 400 nm to 500 nm may exhibit a higher emission intensity than a peak of a longer wavelength within the range of 500 nm to 600 nm.

Referring to FIG. 6E, the light emitting device may emit light having a plurality of peaks and CIE coordinates (x,y) within a range of 0.02<x<0.25, and 0.35<y<0.48. The color coordinate of the emitted light in this exemplary embodiment is approximately (0.21, 0.38). For example, the light emitting device may emit bluish green light without a phosphor. The plurality of peaks may include a first peak within a range of 400 nm to 500 nm and a second peak within a range of 500 nm to 600 nm, and a peak of a shorter wavelength within the range of 400 nm to 500 nm may exhibit a higher emission intensity than a peak of a longer wavelength within the range of 500 nm to 600 nm.

Referring to FIG. 6F, the light emitting device may emit light having a plurality of peaks and CIE coordinates (x,y) within a range of 0.13<x<0.22, and 0<y<0.2. The color coordinate of the emitted light in this exemplary embodiment is approximately (0.20, 0.17). For example, the light emitting device may emit purplish blue light without a phosphor. The plurality of peaks may include a first peak within a range of 400 nm to 500 nm and a second peak within a range of 500 nm to 600 nm, and a peak of a shorter wavelength within the range of 400 nm to 500 nm may exhibit a higher emission intensity than a peak of a longer wavelength within the range of 500 nm to 600 nm.

Referring to FIG. 6G, the light emitting device may emit light having a plurality of peaks and CIE coordinates (x,y) within a range of 0.35<x<0.45, and 0.43<y<0.62. The color coordinate of the emitted light in this exemplary embodiment is approximately (0.39, 0.57). For example, the light emitting device may emit yellow green light without a phosphor. The plurality of peaks may include a first peak within a range of 380 nm to 500 nm and a second peak within a range of 500 nm to 650 nm, and a peak of a shorter wavelength within the range of 380 nm to 500 nm may exhibit a lower emission intensity than a peak of a longer wavelength within the range of 500 nm to 650 nm. In a specific exemplary embodiment, the first peak wavelength may be less than or equal to 410 nm, may be within a range of 390 nm to 410 nm, and the second peak wavelength may be greater than or equal to 530 nm. An intensity of the first peak may be less than or equal to 5 times of that of the second peak, and a sterilization function may be exhibited while emitting yellow-green light due to this height differ- ence. Accordingly, the light emitting device may perform the sterilization function as well as the light source function. In this illustrated embodiment, an active layer emitting light of a peak wavelength for sterilization and an active layer emitting color light may share a first conductivity type semiconductor layer or a second conductivity type semicon- ductor layer, or may share a substrate. The substrate may be a growth substrate.

In the light emitting device, a refractive index of a well layer generating the first peak may be lower than that of a well layer generating the second peak. Alternatively, the well layer generating the first peak and the well layer generating the second peak may include Group 3 materials (or elements or atoms), and among Group 3 materials included in the well layer generating the second peak, an amount of atoms (or elements or materials) with a largest atom (or element or material) may be less than an amount of same materials included in the well layer generating the first peak. Alternatively, a band gap energy of the well layer generating the first peak may be greater than that of the well layer generating the second peak. Alternatively, among Group 3 materials included in the well layer generating the second peak, materials (or elements or atoms) with a largest relative atomic mass may be included in a larger amount in the well layer generating the second peak than in the well layer generating the first peak. Among Group 3 materials included in the well layer generating the second peak, the atoms (or elements or materials) with the largest atom (or element or material), or among the materials (or elements or atoms) with the largest relative atomic mass or the group 3 materials included in the well layer, may be Indium.

Referring to FIG. 6H, the light emitting device may emit light having a plurality of peaks and CIE coordinates (x,y) within a range of 0.17<x<0.25, and 0<y<0.2. The color coordinate of the emitted light in this exemplary embodi- ment is approximately (0.21, 0.11). For example, the light emitting device may emit bluish purple light without a phosphor. The plurality of peaks may include a first peak within a range of 380 nm to 500 nm and a second peak within a range of 500 nm to 650 nm, and the first peak of a shorter wavelength within the range of 380 nm to 500 nm may exhibit a higher emission intensity than the second peak of a longer wavelength within the range of 500 nm to 650 nm. Mixed light of a color different from colors of each of peak wavelengths is emitted by a combination of light of the first peak and light of the second peak. In a specific exemplary embodiment, the first peak wavelength may be less than or equal to 425 nm, may be within a range of 400 nm to 415 nm, and the second peak wavelength may be greater than or equal to 530 nm. An intensity of the first peak may be less than or equal to 5 times of that of the second peak, and a sterilization function may be exhibited while emitting blue-violet light with this height difference. Accordingly, the light emitting device may perform the sterilization function as well as the light source function. In this illustrated embodiment, an active layer emitting light of a peak wavelength for sterilization and an active layer emitting color light may share a first conductivity type semiconductor layer or a second conductivity type semicon- ductor layer, or may share a substrate. The substrate may be a growth substrate.

In the light emitting device, a refractive index of a well layer generating the first peak may be lower than that of a well layer generating the second peak. Alternatively, the well layer generating the first peak and the well layer generating the second peak may include Group 3 materials (or elements or atoms), and among Group 3 materials included in the well layer generating the second peak, an amount of atoms (or elements or materials) with a largest atom (or element or material) may be less than an amount of same materials included in the well layer generating the first peak. Alternatively, a band gap energy of the well layer generating the first peak may be greater than that of the well layer generating the second peak. Alternatively, among Group 3 materials included in the well layer generating the second peak, materials (or elements or atoms) with a largest relative atomic mass may be included in a larger amount in the well layer generating the second peak than in the well layer generating the first peak. Among Group 3 materials included in the well layer generating the second peak, the atoms (or elements or materials) with the largest atom (or elements or materials), or among the materials (or elements or atoms) with the largest relative atomic mass or the group 3 materials included in the well layer, may be Indium.

Referring to FIG. 6I, the light emitting device may emit light having a single peak and CIE coordinates (x,y) within a range of 0.39<x<0.49, and 0.45<y<0.55. The color coor- dinate of the emitted light in this exemplary embodiment is approximately (0.47, 0.52). For example, the light emitting device may emit greenish yellow light without a phosphor.

Referring to FIG. 6J, the light emitting device may emit light having a plurality of peaks and CIE coordinates (x,y) within a range of 0.44<x<0.53, and 0.45<y<0.52. The color coordinate of the emitted light in this exemplary embodi- ment is approximately (0.49, 0.50). For example, the light emitting device may emit yellow light without a phosphor. The plurality of peaks may include a peak within a range of 380 nm to 500 nm and a peak within a range of 500 nm to 650 nm, and a peak of a shorter wavelength within the range of 380 nm to 500 nm may exhibit a lower emission intensity than a peak of a long wavelength within the range of 500 nm to 650 nm.

Referring to FIG. 6K, the light emitting device may emit light having a plurality of peaks and CIE coordinates (x,y) within a range of 0.2<x<0.33, and 0.02<y<0.22. The color coordinate of the emitted light in this exemplary embodi- ment is approximately (0.27, 0.19). For example, the light emitting device may emit purple light without a phosphor. The plurality of peaks may include a peak within a range of 350 nm to 500 nm and a peak within a range of 500 nm to 650 nm, and a peak of a shorter wavelength within the range of 350 nm to 500 nm may exhibit a higher emission intensity than a peak of a longer wavelength within the range of 500 nm to 650 nm. Mixed light of a color different from colors of each of peak wavelengths is emitted by a combination of light of the first peak and light of the second peak. In a specific exemplary embodiment, the first peak wavelength may be less than or equal to 420 nm, may be within a range of 400 nm to 415 nm, and the second peak wavelength may be greater than or equal to 530 nm. An intensity of the first peak may be greater than or equal to 1.5 times of that of the second peak, and a sterilization function may be exhibited while emitting purple light with this height difference. Accordingly, the light emitting device may perform the sterilization function as well as the light source function. In this illustrated embodiment, an active layer emitting light of a peak wavelength for sterilization and an active layer emitting color light may share a first conductivity type semiconductor layer or a second conductivity type semiconductor layer, or may share a substrate. The substrate may be a growth substrate.

In the light emitting device, a refractive index of a well layer generating the first peak may be lower than that of a well layer generating the second peak. Alternatively, the well layer generating the first peak and the well layer generating the second peak may include Group 3 materials (or elements or atoms), and among Group 3 materials included in the well layer generating the second peak, an amount of atoms (or elements or materials) with a largest atom (or element or material) may be less than an amount of same materials included in the well layer generating the first peak. Alternatively, a band gap energy of the well layer generating the first peak may be greater than that of the well layer generating the second peak. Alternatively, among Group 3 materials included in the well layer generating the second peak, materials (or elements or atoms) with a largest relative atomic mass may be included in a larger amount in the well layer generating the second peak than in the well layer generating the first peak. Among Group 3 materials included in the well layer generating the second peak, the atoms (or elements or materials) with the largest atom (or element or material), or among the materials (or elements or atoms) with the largest relative atomic mass or the group 3 materials included in the well layer, may be Indium.

Referring to FIG. 6L, the light emitting device may emit light having a single peak and CIE coordinates (x,y) within a range of $0.46 < x < 0.55$, and $0.43 < y < 0.49$. The color coordinate of the emitted light in this exemplary embodiment is approximately (0.55, 0.44). For example, the light emitting device may emit yellowish orange light without a phosphor. The single peak may be in a range of 500 nm to 650 nm.

Referring to FIG. 6M, the light emitting device may emit light having a plurality of peaks and CIE coordinates (x,y) within a range of $0.47 < x < 0.63$, and $0.37 < y < 0.45$. The color coordinate of the emitted light in this exemplary embodiment is approximately (0.55, 0.43). For example, the light emitting device may emit orange light without a phosphor. The plurality of peaks may include a peak within a range of 380 nm to 500 nm and a peak within a range of 500 nm to 650 nm, and a peak of a shorter wavelength within the range of 380 nm to 500 nm may exhibit a lower emission intensity than a peak of a longer wavelength within the range of 500 nm to 650 nm.

Referring to FIG. 6N, the light emitting device may emit light having a single peak and CIE coordinates (x,y) within a range of $0.28 < x < 0.38$, and $0.06 < y < 0.24$. The color coordinate of the emitted light in this exemplary embodiment is approximately (0.32, 0.18). For example, the light emitting device may emit reddish purple light without a phosphor. The plurality of peaks may include a peak within a range of 350 nm to 500 nm and a peak within a range of 500 nm to 650 nm, and a peak of a shorter wavelength within the range of 350 nm to 500 nm may exhibit a higher emission intensity than a peak of a longer wavelength within the range of 500 nm to 650 nm. Mixed light of a color different from colors of each of peak wavelengths is emitted by a combination of light of the first peak and light of the second peak. In a specific exemplary embodiment, the first peak wavelength may be less than or equal to 420 nm, and may be within a range of 400 nm to 415 nm, and the second peak wavelength may be greater than or equal to 550 nm. An intensity of the first peak may be greater than or equal to 10 times of that of the second peak, and a sterilization function may be exhibited while emitting reddish purple light with this height difference. Accordingly, the light emitting device may perform the sterilization function as well as the light source function. In this illustrated embodiment, an active layer emitting light of a peak wavelength for sterilization and an active layer emitting color light may share a first conductivity type semiconductor layer or a second conductivity type semiconductor layer, or may share a substrate. The substrate may be a growth substrate.

In the light emitting device, a refractive index of a well layer generating the first peak may be lower than that of a well layer generating the second peak. Alternatively, the well layer generating the first peak and the well layer generating the second peak may include Group 3 materials (or elements or atoms), and among Group 3 materials included in the well layer generating the second peak, an amount of atoms (or elements or materials) with a largest atom (or element or material) may be less than an amount of a same material included in the well layer generating the first peak. Alternatively, a band gap energy of the well layer generating the first peak may be greater than that of the well layer generating the second peak. Alternatively, among Group 3 materials included in the well layer generating the second peak, materials (or elements or atoms) with a largest relative atomic mass may be included in a larger amount in the well layer generating the second peak than in the well layer generating the first peak. Among Group 3 materials included in the well layer generating the second peak, the atoms (or elements or materials) with the largest atom (or element or material), or among the materials (or elements or atoms) with the largest relative atomic mass or the group 3 materials included in the well layer, may be Indium.

Referring to FIG. 6O, the light emitting device may emit light having a single peak and CIE coordinates (x,y) within a range of $0.36 < x < 0.55$, and $0.25 < y < 0.35$. The color coordinate of the emitted light in this exemplary embodiment is approximately (0.41, 0.30). For example, the light emitting device may emit pink light without a phosphor. The plurality of peaks may include a first peak within a range of 350 nm to 425 nm and a second peak within a range of 545 nm to 650 nm, and may include sub-peaks having a relatively low emission intensity between the first and second peaks.

In some exemplary embodiments, the light emitting device may emit light of a second peak wavelength for realizing color together with light of a first peak wavelength for sterilization, and light of the first peak wavelength and light of the second peak wavelength may be emitted simultaneously. However, the inventive concepts are not limited thereto, and an active layer emitting light of the first peak wavelength and an active layer emitting light of the second peak wavelength may be independently driven using different electrodes. Light of the first peak wavelength and light of the second peak wavelength may be operated through an external signal, for example, power on/off, or may be operated through a system. A difference between the first peak wavelength and the second peak wavelength is greater than or equal to 30 nm. In a specific embodiment, the first peak wavelength for sterilization may be less than or equal to 410 nm, and the second peak wavelength may be 440 greater than or equal to 440 nm. In a specific embodiment, as described in various embodiments above, an intensity of the first peak and that of the second peak may be different from each other. In addition, a spectral area of light of the first peak wavelength may be different from that of light of the second peak wavelength. Furthermore, a full width at half maximum (FWHM) of the spectrum of light having the first peak wavelength may be different from that of the spectrum of light having the second peak wavelength. Alternatively, the full width at half maximum (FWHM) of the spectrum of light having the first peak wavelength may have a value that is narrower or smaller than that of light having the second peak wavelength. In addition, in CIE color coordinates (x, y) of mixed light by a combination of light of the first peak wavelength and light of the second peak wavelength, x may be 0.21 or more and 041 or less, and y may be 0.11 or more and 0.57 or less. In the light emitting device, a refractive index of a well layer generating the first peak may be lower than that of a well layer generating the second peak. Alternatively, the well layer generating the first peak and the well layer generating the second peak may include Group 3 materials (or elements or atoms), and among Group 3 materials included in the well layer generating the second peak, an amount of atoms (or elements or materials) with a largest atom (or element or material) may be less than an amount of same materials included in the well layer generating the first peak. Alternatively, a band gap energy of the well layer generating the first peak may be greater than that of the well layer generating the second peak. Alternatively, among Group 3 materials included in the well layer generating the second peak, materials (or elements or atoms) with a largest relative atomic mass may be included in a larger amount in the well layer generating the second peak than in the well layer generating the first peak. Among Group 3 materials included in the well layer generating the second peak, the atoms (or elements or materials) with the largest atom (or elements or materials), or among the materials (or elements or atoms) with the largest relative atomic mass or the group 3 materials included in the well layer, may be Indium.

As shown in FIG. 3, the light emitting devices 301 (C1 to Cn) without the phosphor are arranged on the substrate 300 so as to emit light having the color coordinate desired by a user. A plurality of light emitting devices C1 to Cn may be arranged on the substrate 300, and the plurality of light emitting devices C1 to Cn may include light emitting devices emitting light of different colors from one another. Various colors may be implemented through a combination of light emitting devices that emit light of different colors from one another. In addition, the light emitting devices C1 to Cn may be individually driven, and a current injected into each of the light emitting devices may also be individually adjusted. The color of the light emitting device 301 may be adjusted by adjusting a current density of the light emitting device 301.

As shown in FIG. 4, the light emitting device 301 may include the substrate 400, without being limited thereto. In an exemplary embodiment, the substrate 400, particularly, the growth substrate may be removed. Accordingly, it is possible to prevent light emitted from the light emitting device 301 from being lost by the substrate 400, and even when it is mounted on a deformable circuit board such as a flexible substrate or a rollable substrate, it is possible to prevent the light emitting device 301 from being peeled off by accommodating a deformation of the circuit board.

In an exemplary embodiment, the user may drive the light emitting devices C1 to Cn by using the control unit 304 provided on a circuit board 300. The control unit 304 may control the light emitting devices C1 to Cn according to an input value provided by the user, and the user may change the input value for the control unit 304 according to the user's environment or mood, or others. For example, the user may control on/off of the light emitting devices C1 to Cn so as to create a desired atmosphere. As another example, in conjunction with a peripheral device such as a smart watch, a user's heart rate, or others may be measured, and a spectrum of light emitted from the light emitting module may be adjusted based on the data connected thereto.

Hereinafter, a method of manufacturing a light emitting device will be described. The method of manufacturing a light emitting device described below may be used to manufacture the light emitting device described above, and in particular, it is particularly useful for manufacturing a light emitting device using a large-area wafer of 4 inches or more, further 6 inches or more. However, the light emitting device described above is not necessarily limited to being manufactured by the method of manufacturing a light emitting device described below. In addition, the method of manufacturing a light emitting device described below may be applied to manufacturing of a general light emitting device using a large-area wafer.

FIG. 7A, FIG. 7B, FIG. 8A, FIG. 8B, FIG. 8C, and FIG. 8D are schematic cross-sectional views illustrating a method of manufacturing a light emitting device according to an exemplary embodiment.

Figure 7B:
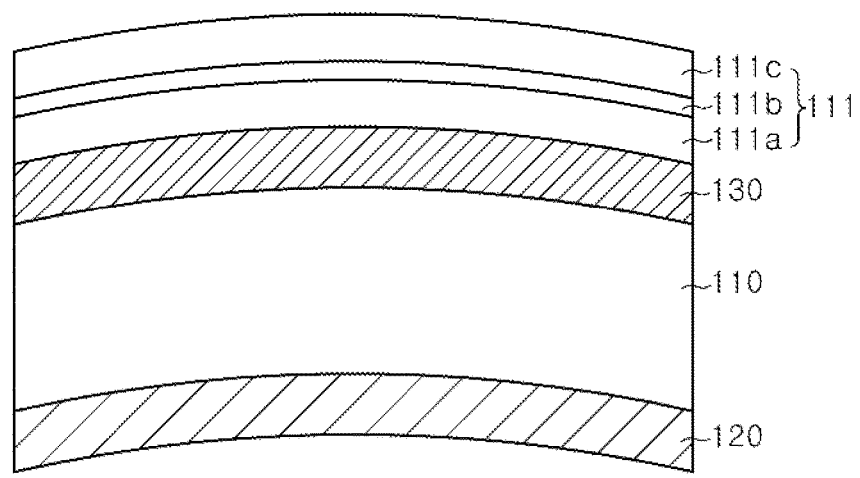

Referring to FIGS. 7A and 7B, in the method of manufacturing a light emitting device according to the present exemplary embodiment, a first stress relief layer 120 may be formed on a lower surface of a substrate 110, and a second stress relief layer 130 and a light emitting structure 111 may be formed on an upper surface of the substrate 110.

The substrate 110 is not limited as long as it is a substrate on which the light emitting structure 111 can be grown, and may include, for example, a sapphire substrate, a silicon substrate, a silicon carbide substrate, a spinel substrate, a nitride substrate, and the like. In addition, the substrate 110 may include a polar, non-polar, or semi-polar growth surface. In the illustrated exemplary embodiment, the substrate 110 may be a sapphire substrate having a c-plane growth plane (polarity), without being limited thereto. Since the c-plane is relatively easy to grow a nitride thin film and is stable at a high temperature, it may be used as a substrate for growing a nitride semiconductor.

In addition, the substrate 110 may have a size of 4 inches, without being limited thereto, and, for example, a large-diameter substrate of 6 inches or more may be used.

The first stress relief layer 120 may be formed on the lower surface of the substrate 110 and the second stress relief layer 130 may be formed on the upper surface of the substrate 110. The first stress relief layer 120 may be grown first, and thereafter, the second stress relief layer 130 may be grown.

The first and second stress relief layers 120 and 130 may be formed of a III-V semiconductor layer such as a gallium nitride-based material such as AlN, GaN, or AlGaN, but the inventive concepts are not necessarily limited thereto. For example, the first and second stress relief layers 120 and 130 may be formed of a metallic sheet, and after inserting an adhesive layer between the substrate 110 and each of the first and second stress relief layers 120 and 130, the adhesive layer may be melted to bond them.

The first and second stress relief layers 120 and 130 may be grown using a process such as metal organic chemical vapor deposition (MOCVD), hydrogen vapor phase epitaxy (HYPE), molecular beam epitaxy (MBE), or the like. In the illustrated exemplary embodiment, the first and second stress relief layers 120 and 130 are illustrated as a single layer, without being limited thereto, or may be formed of multiple layers stacked with different materials.

When the light emitting structure 111 is grown on the substrate 110 at a high temperature of about 1000° C. and cooled to room temperature, due to differences in lattice constants and thermal expansion coefficients between the substrate 110 and the light emitting structure 111, a stress is generated in the light emitting structure 111. That is, when the coefficient of thermal expansion of the substrate 110 is greater than that of thermal expansion of the light emitting structure 111, a compressive stress may be generated in the light emitting structure 111, and in contrast, when the coefficient of thermal expansion of the substrate 110 is smaller than that of thermal expansion of the light emitting structure 111, a tensile stress may be generated in the light emitting structure 111. For example, as the sapphire substrate has a higher coefficient of thermal expansion than the nitride light emitting structure 111, the compressive stress may be generated in the nitride light emitting structure 111, and as the silicon substrate has a smaller coefficient of thermal expansion than the nitride light emitting structure 111, the tensile stress may be generated in the nitride light emitting structure 111. For this reason, the substrate 110 is warped, and the light emitting structure 111 is formed to be thick so as to suppress the warpage.

As the difference in thermal expansion coefficients between the substrate 110 and the light emitting structure 111 is alleviated by forming the first and second stress relief layers 120 and 130 on the lower and upper surfaces of the substrate 110, respectively, a defect such as a breakage or a crack due to a wafer warpage that may occur while forming the light emitting structure 111 may be minimized, and it is possible to grow the semiconductor layer with a favorable crystal quality. In addition, in a case of the second stress relief layer 130, as, for example, a III-V nitride semiconductor layer may be disposed as an upper surface of the second stress relief layer 130, the second stress relief layer 130 may be grown with a material having a same stress direction as that of the semiconductor layer.

In particular, in a case of the large-diameter substrate 110 of 6 inches or more, the crack or the breakage may occur more easily in the substrate or the semiconductor layer due to the warpage of the substrate 110. Accordingly, the substrate 110 and the light emitting structure 111 may be formed to be thicker to compensate for the substrate warpage. However, as the warpage of the large-diameter substrate 110 is reduced by forming the first and second stress relief layers 120 and 130, a relatively thin large-diameter substrate may be used, and a thickness of the light emitting structure 111 grown on the substrate 110 may be reduced.

In addition, although not shown, buffer layers having various structures such as crystalline and amorphous for improving a crystallinity of a first conductivity type semiconductor layer 111a may be formed on the substrate 110, and for example, ZnO, SiC, AlN, and GaN may correspond to this. The buffer layer may alleviate defects occurring in the first conductivity type semiconductor layer 111a due to a lattice mismatch between the substrate 110 and the first conductivity type semiconductor layer 111a. The second stress relief layer 130 may replace the buffer layer, and in this case, the buffer layer may be omitted.

Next, the light emitting structure 111 may be formed on the second stress relief layer 130, and the light emitting structure 111 may be a structure including first and second conductivity type semiconductor layers 111a and 111c and an active layer 111b formed between the first and second conductivity type semiconductor layers 111a and 111c to emit light. Herein, although the active layer 111b is illustrated as a single layer, as described with reference to FIGS. 4 and 5, the active layer 111b may be a multiple layer including a lower multiple quantum well structure and an upper multiple quantum well structure with a spacer layer interposed therebetween, and may also include grooves.

The light emitting structure 111 may be formed by sequentially growing the first conductivity type semiconductor layer 111a, the active layer 111b, and the second conductivity type semiconductor layer 111c after growing the second stress relief layer 130 on the substrate 110. In addition, the light emitting structure 111 may be formed into a mesa structure by etching the second conductivity type semiconductor layer 111c and the active layer 111b through a mesa etching process. In more detail, the mesa structure may include the second conductivity type semiconductor layer 111c and the active layer 111b, and may be disposed on the first conductivity type semiconductor layer 111a. The mesa structure may include a portion of the first conductivity type semiconductor layer 111a together with the active layer 111b and the second conductivity type semiconductor layer 111c.

The first conductivity type semiconductor layer 111a may be formed adjacent to the second stress relief layer 130. The first conductivity type semiconductor layer 111a may be a nitride-based semiconductor layer doped with an n-type impurity, for example, a nitride semiconductor layer doped with Si, Ge, Se, Te, or C. The first conductivity type semiconductor layer 111a may be grown with a nitride-based semiconductor material. For example, the first conductivity type semiconductor layer 111a may include a semiconductor material having a composition formula of $Al_xIn_yGa_{(1-x-y)}N$ ($0 \leq x \leq 1$, $0 \leq y \leq 1$, $0 \leq x+y \leq 1$). The semiconductor material having the above composition formula may include GaN, AlN, AlGaN, InGaN, InN, InAlGaN, AlInN, and the like. The first conductivity type semiconductor layer 111a may be grown using the semiconductor material to include an n-type dopant such as Si, Ge, Sn, Se, Te, or the like. In this case, the first conductivity type semiconductor layer 111a may be continuously formed on the second stress relief layer 130. The first conductivity type semiconductor layer 111a is illustrated as a single layer, without being limited thereto, or may be formed of multiple layers.

The active layer 111b may be grown on the first conductivity type semiconductor layer 111a, and the active layer 111b may have a single quantum well structure, or a multiple quantum well (MQW) structure in which barrier layers and quantum well layers are alternately stacked. As described with reference to FIG. 4 and FIG. 5, the active layer 111b may include the lower multiple quantum well structure and the upper multiple quantum well structure, and may include a spacer layer therebetween. The barrier layer may be formed of a gallium nitride-based semiconductor layer having a wider band gap than the quantum well layer, for example, GaN, InGaN, AlGaN, or AlInGaN. By adjusting a composition ratio of the gallium nitride-based semiconductor of the quantum well layer, light having a desired peak wavelength may be emitted from the active layer 111b. For example, the well layer of the active layer 111b may be a ternary semiconductor layer such as $In_xGa_{(1-x)}N$ ($0 \leq x \leq 1$), or may be a quaternary semiconductor layer such as $Al_xIn_yGa_{(1-x-y)}N$ ($0 \leq x \leq 1$) and in this case, a value of x or y may be adjusted to emit light of the desired peak wavelength.

The barrier layer and the quantum well layer of the active layer 111b may be formed as an undoped layer, i.e., a layer that is not doped with an impurity so as to improve a crystal quality of an active region, but portions or all of the active regions may be doped with the impurity so as to lower a forward voltage.

The second conductivity type semiconductor layer 111c may be grown on the active layer 111b. The second conductivity type semiconductor layer 111c is a nitride-based semiconductor layer doped with a p-type impurity, and may be formed of, for example, a semiconductor layer doped with the p-type impurity such as Mg, Zn, Ca, Sr, and Ba. The second conductivity type semiconductor layer 111c may be grown with a nitride-based semiconductor material. For example, the second conductivity type semiconductor layer 111c may include a semiconductor material having a composition formula of $Al_xIn_yGa_{(1-x-y)}N$ ($0 \leq x \leq 1$, $0 \leq y \leq 1$, $0 \leq x + y \leq 1$). The semiconductor material having the above composition formula may include GaN, AlN, AlGaN, InGaN, InN, InAlGaN, AlInN, and the like. The second conductivity type semiconductor layer 111c may be formed using the semiconductor material in a manner of growing to include a p-type dopant such as Mg, Zn, Sr, BA, and the like. In addition, before growing the second conductivity type semiconductor layer 111c, the step coverage layer as (e.g., 403s) described with reference to FIGS. 4 and 5 may be formed.

Referring to FIGS. 8A, 8B, 8C and 8D, an ohmic electrode 113 and first and second contact electrodes 115a and 115b may be formed on the light emitting structure 111, and a first insulation reflection layer 117 having an opening on the first and second contact electrodes 115a and 115b may be formed. Thereafter, first and second pad electrodes 119a and 119b covering at least a portion of the first insulation reflection layer 117 and the exposed first and second contact electrodes 115a and 115b may be formed. In addition, at least portions of the previously formed first stress relief layer 120 and the substrate 110 may be removed.

The ohmic electrode 113 may be formed on the second conductivity type semiconductor layer 111c. The ohmic electrode 113 may be in ohmic contact with the second conductivity type semiconductor layer 111c. The ohmic electrode 113 may include, for example, a light-transmitting conductive oxide layer such as ITO (Indium Tin Oxide), ZnO (Zinc Oxide), ZITO (Zinc Indium Tin Oxide), ZIO (Zinc Indium Oxide), ZTO (Zinc Tin Oxide), GITO (Gallium Indium Tin Oxide), GIO (Gallium Indium Oxide), GZO (Gallium Zinc Oxide), AZO (Aluminum doped Zinc Oxide), GIO (Gallium Indium Oxide), FRO (Fluorine Tin Oxide), or others. The conductive oxide may include various dopants. The ohmic electrode 113 including the light-transmitting conductive oxide may have favorable ohmic contact characteristics with the second conductivity type semiconductor layer 111c. That is, the conductive oxide such as ITO or ZnO has a relatively lower contact resistance with the second conductivity type semiconductor layer 111c compared to a metallic electrode, and thus, it is possible to reduce a forward voltage (Vf) of the light emitting device and improve a luminous efficiency.

The ohmic electrode 113 may be formed to completely cover an upper surface of the second conductivity type semiconductor layer 111c, and thus, a current spreading efficiency may be improved when driving the light emitting device. For example, side surfaces of the ohmic electrode 113 may be formed flush with side surfaces of the mesa.

The ohmic electrode 113 may be formed on the second conductivity type semiconductor layer 111c after the light emitting structure 111 is formed, or may be first formed on the second conductivity-type semiconductor layer 111c before mesa etching.

Next, the first contact electrode 115a and the second contact electrode 115b may be formed.

The first contact electrode 115a may be in ohmic contact with the first conductivity type semiconductor layer 111a on the first conductivity type semiconductor layer 111a. To this end, the first contact electrode 115a may include a metallic layer in ohmic contact with the first conductivity type semiconductor layer 111a.

Meanwhile, the first contact electrode 115a does not overlap the active layer 111b or the second conductivity type semiconductor layer 111c exposed on the side surface of the mesa, and an insulation layer for insulating the first contact electrode 115a from the semiconductor layer 111c may be omitted. The first contact electrode 115a may be formed on the light emitting structure 111 using, for example, a lift-off process.

The second contact electrode 115b may be formed on the ohmic electrode 113, and may be electrically connected to the ohmic electrode 113 to assist current spreading in the second conductivity type semiconductor layer 111c.

Meanwhile, so as to reduce light absorption by the second contact electrode 115b, the second contact electrode 115b may be limitedly formed on a partial region of the ohmic electrode 113. In some forms, a total area of the second contact electrode 115b may not exceed $\frac{1}{10}$ of an area of the ohmic electrode 113.

The first and second contact electrodes 115a and 115b may be formed together through the same process. The first and second contact electrodes 115a and 115b may be formed together using a same material, and thus, may have a same layer structure. For example, the first and second contact electrodes 115a and 115b may include an Al reflection layer, and may include an Au connection layer, specifically a layer structure of Cr/Al/Ti/Ni/Ti/Ni/Au/Ti.

Thereafter, the first insulation reflection layer 117 may be formed to cover the substrate 110, the first conductivity type semiconductor layer 111a, the active layer 111b, the second conductivity type semiconductor layer 111c, the ohmic electrode 113, and the first and second contact electrodes 115a and 115b. The first insulation reflection layer 117 may have an opening exposing the first and second contact electrodes 115a and 115b, and may be formed in an entire region except for the opening.

The first insulation reflection layer 117 may include a distributed Bragg reflector. The distributed Bragg reflector may be formed by repeatedly stacking dielectric layers having different refractive indices, and the dielectric layers may include $TiO_2$, $SiO_2$, $HfO_2$, $Nb_2O_5$, $MgF_2$, or the like. For example, the first insulation reflection layer 117 may have a structure of an alternately stacked $TiO_2$ layer/$SiO_2$ layer. The distributed Bragg reflector may be manufactured so as to reflect light generated from the active layer 111b, and may be formed in a plurality of pairs so as to improve reflectivity. In the illustrated exemplary embodiment, the distributed Bragg reflectors may include between 10 and 25 pairs.

Next, the first pad electrode 119a and the second pad electrode 119b may be formed on at least a portion of the first insulation reflection layer 117, and may cover upper portions of the first and second contact electrodes 115a and 115b. The first and second pad electrodes 119a and 119b may be electrically connected through a region in contact with the first and second contact electrodes 115a and 115b.

The first pad electrode 119a may be generally formed in a partial portion of an upper region of the ohmic electrode 113, and may be formed on the first contact electrode 115a. In addition, the first pad electrode 119a may be formed to be laterally spaced apart from the second contact electrode 115b so as not to overlap the second contact electrode 115b. Since the first pad electrode 119a does not overlap the second contact electrode 115b, an electrical short circuit between the first pad electrode 119a and the second contact electrode 115b may be prevented from occurring.

The second pad electrode 119b may be formed in the upper region of the ohmic electrode 113. The second pad electrode 119*b* may be formed to be laterally spaced apart from the first contact electrode 115*a* so as not to overlap the first contact electrode 115*a*.

The first and second pad electrodes 119*a* and 119*b* may be formed to be spaced apart from each other by a predetermined distance or more. A shortest separation distance between the first and second pad electrodes 119*a* and 199*b* may be, for example, about 3 μm to about 100 μm.

In some forms, the first and second pad electrodes 119*a* and 119*b* may be formed together using the same material through the same process, and thus, may have the same layer structure.

The first and second pad electrodes 119*a* and 119*b* may directly contact the first and second conductivity type semiconductor layers 111*a* and 111*b*, if necessary. In this case, the first and second contact electrodes 119*a* and 119*b* may be omitted.

Thereafter, the first stress relief layer 120 and at least a portion of the substrate 110 may be removed. The first stress relief layer 120 may be removed by grinding the lower surface of the substrate 110 on which the first stress relief layer 120 has been grown, and a thickness of the substrate 110 may be reduced to a certain thickness by removing at least a portion of the substrate 110. In addition, so as to reduce a roughness of the surface of the substrate 110, lapping and chemical mechanical polishing (CMP) processes may be further carried out, and a roughened surface generated due to grinding may be trimmed.

Figure 8A:
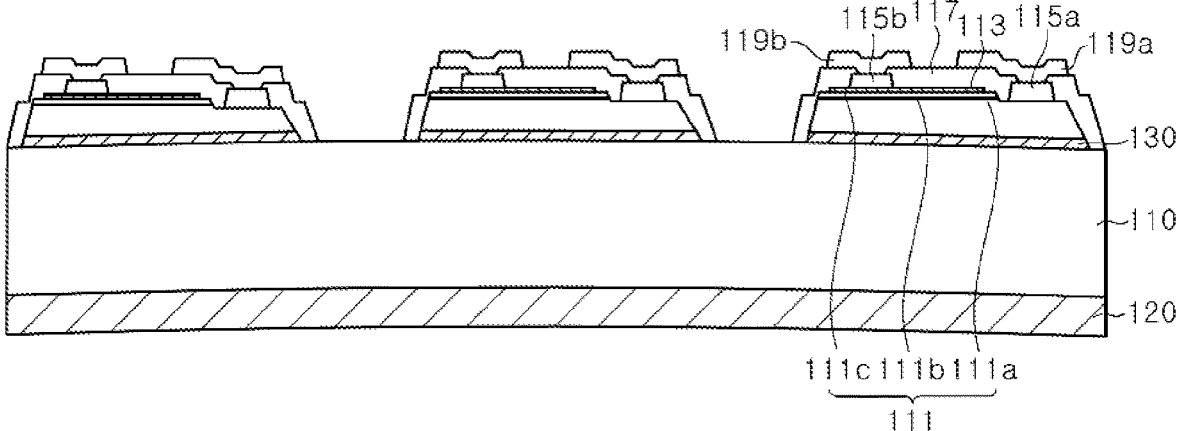
FIGS. 8A through 8D are schematic cross-sectional views illustrating a method of manufacturing a light emitting device according to an exemplary embodiment.
Figure 8B:
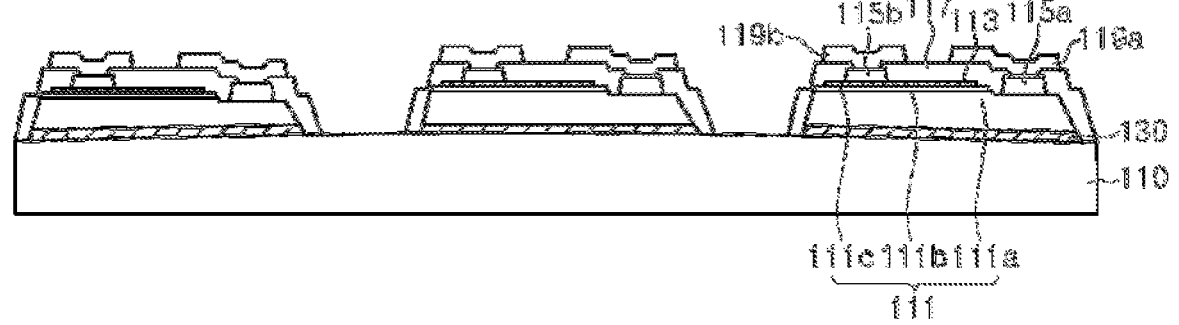
Figure 8C:
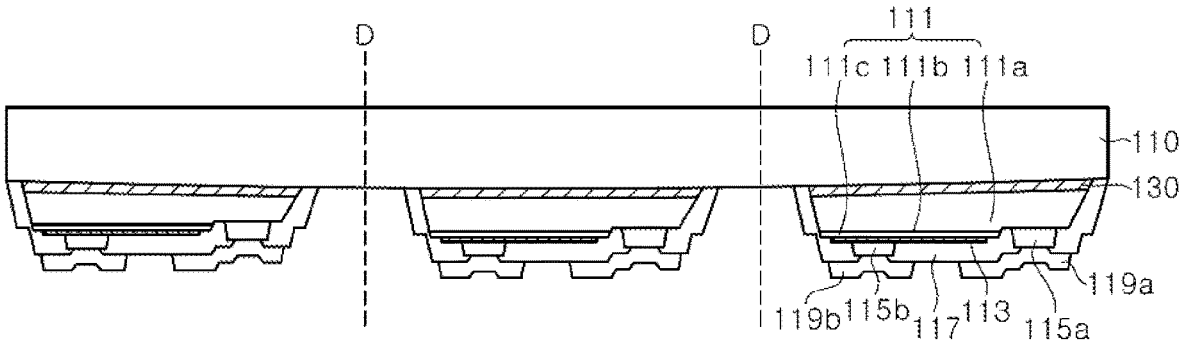
Figure 8D:
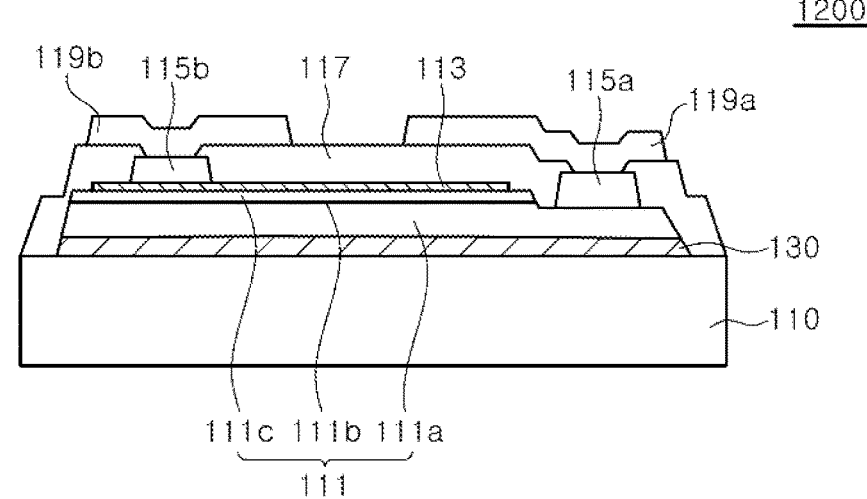

Subsequently, as shown in FIG. 8C, a light emitting device 1100 as shown in FIG. 8D may be provided by dividing the substrate through a dicing D process.

Hereinafter, in the description of other exemplary embodiments, same element portions as in the previous exemplary embodiment will be briefly described or omitted.

Figure 9:
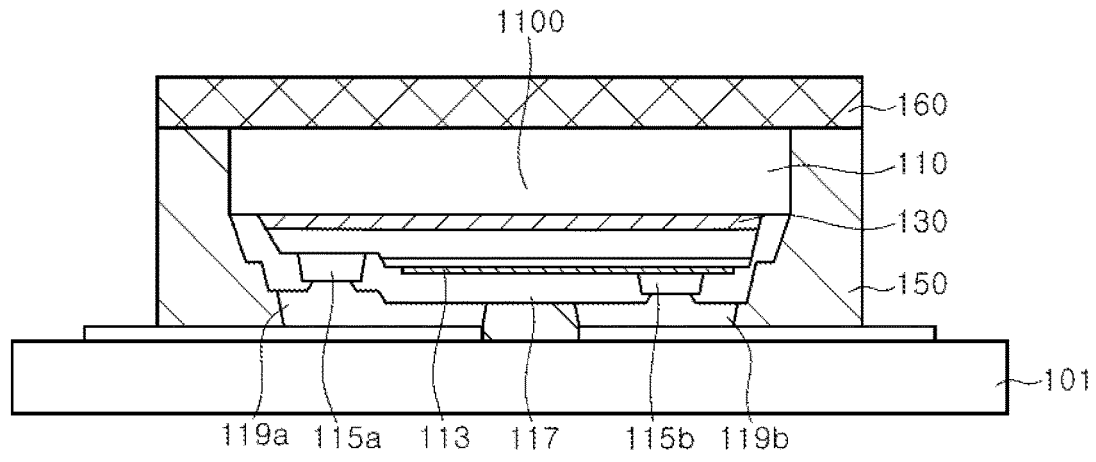
FIG. 9 is a schematic cross-sectional view illustrating an example in which a light emitting device according to an exemplary embodiment is applied to a light emitting device package.

FIG. 9 illustrates an example in which the light emitting device according to an exemplary embodiment of the present disclosure is applied to a package.

Referring to 9, the light emitting device 1100 may be disposed on an electrode located on an upper surface of the circuit board 101, a molding layer 150 may be formed on side and lower surfaces of the light emitting device 1100, and a reflection material 160 may be formed on an upper surface of the light emitting device 1100.

The light emitting device 1100 may emit light through the upper surface and the side surface thereof. The reflection material 160 may cover the upper surface of the light emitting device 1100. The reflection material 160 may reflect or absorb light emitted to the upper surface of the light emitting device 1100. The reflected light may be emitted through the side surface of the light emitting device 1100 after entering the light emitting device 1100.

The molding layer 150 may protect the light emitting device 1100 from external materials such as moisture, dust, and others. The molding layer 150 may include a light-transmitting material such as an epoxy resin, a silicone resin, or the like. The molding layer 150 may be formed by a dotting method after the light emitting device 1100 is mounted on the circuit board 101, without being not limited thereto. Alternatively, the molding layer may be formed after the light emitting device 1100 may be divided into individual devices through a dicing process. The molding layer 150 may cover the side surface, the lower surface, and the upper surface of the light emitting device 1100, without being limited thereto.

The reflection material 160 may include a white resin, without being limited thereto. The reflection material 160 may be formed on the substrate 110 of the light emitting device 1100 mounted on the circuit board 101, and may be formed to extend to an upper portion of the molding layer 150 located on the side surface of the light emitting device 1100. The reflection material 160 may be formed on the light emitting device 1100 by applying a white resin which is a resin with a white pigment by a dotting method, or coated on the light emitting device 1100. Instead of the reflection material 160, a light blocking material including a black pigment or a material for absorbing light in the resin may be disposed. In addition, the reflection material 160 may prevent light emitted from the light emitting device 1100 from being reabsorbed by the light emitting device 1100.

FIG. 10A, FIG. 10B, FIG. 10C, and FIG. 10D are schematic cross-sectional views illustrating a method of manufacturing a light emitting device according to another exemplary embodiment.

Referring to FIG. 10A, FIG. 10B, FIG. 10C, and FIG. 10D, the light emitting device has the same configuration as that of FIG. 7B and FIG. 8D except for a configuration of a second insulation reflection layer 140. Accordingly, a description of the same element is replaced with the description of the configuration of FIG. 7B and FIG. 8D.

The first stress relief layer 120 may be removed by grinding the lower surface of the substrate 110 on which the first stress relief layer 120 has been grown (FIG. 10B), and a thickness of the substrate 110 may be reduced to a certain thickness by removing at least a portion of the substrate 110. In addition, so as to reduce a roughness of the surface of the substrate 110, lapping and chemical mechanical polishing (CMP) processes may be further carried out, and a roughened surface generated due to grinding may be trimmed.

Figure 10A:
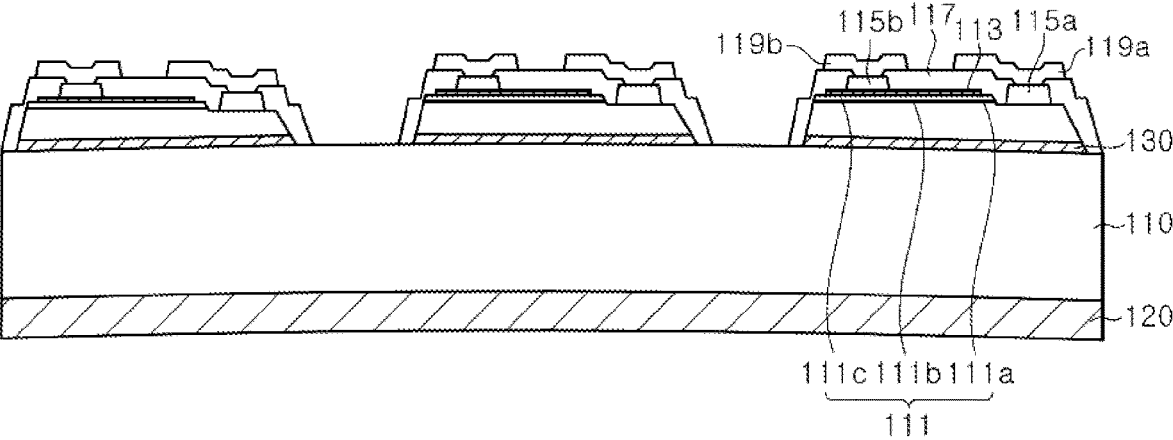
FIGS. 10A through 10D are schematic cross-sectional views illustrating a method of manufacturing a light emitting device according to another exemplary embodiment.
Figure 10B:
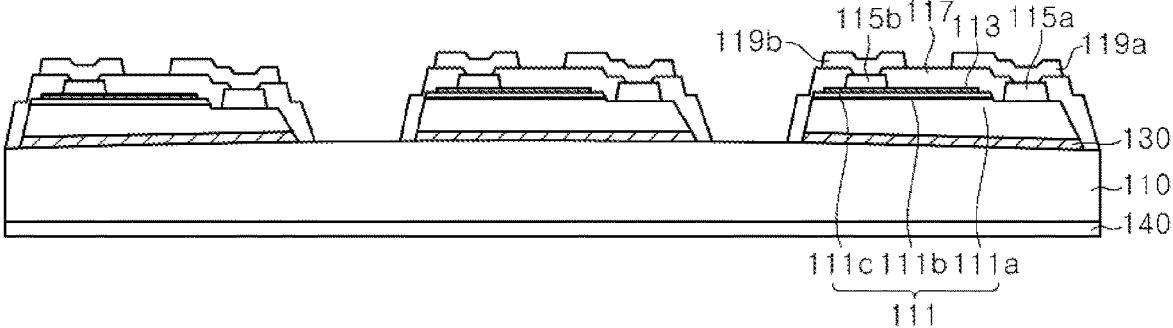

Thereafter, as shown in FIG. 10B, the second insulation reflection layer 140 may be formed in a lower portion of the substrate 110. The second insulation reflection layer 140 may cover an entire lower surface of the substrate 110. The second insulation reflection layer 140 may include a distributed Bragg reflector.

Since the distributed Bragg reflector of the second insulation reflection layer 140 is similar to the distributed Bragg reflector of the first insulation reflection layer 117, a detailed description thereof will be omitted.

Figure 10C:
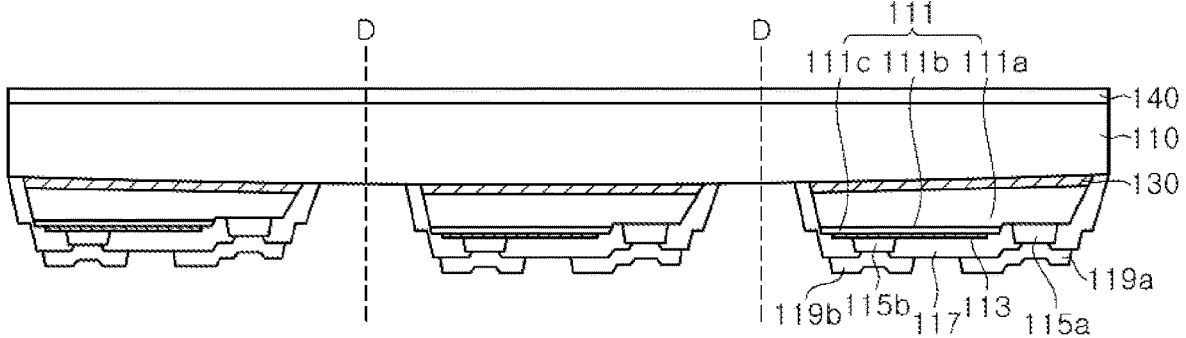
Figure 10D:
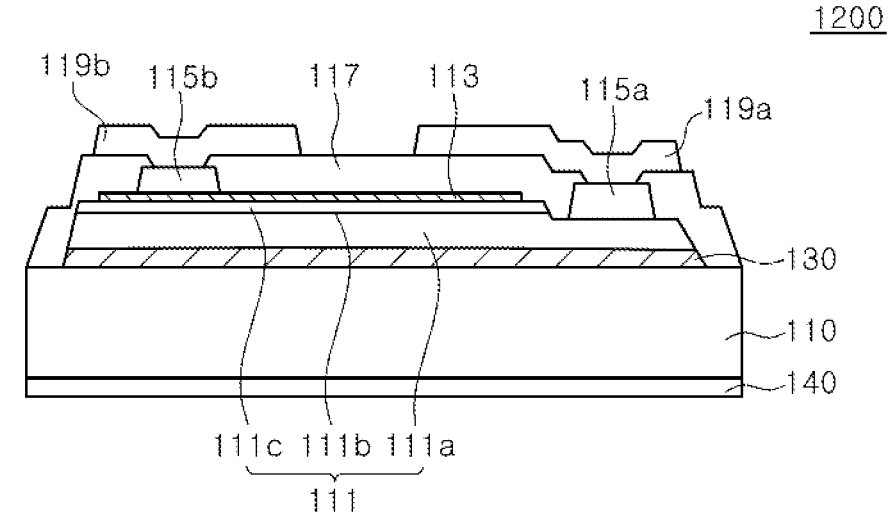

Subsequently, as shown in FIG. 10C, a light emitting device 1200 as shown in FIG. 10D may be provided by dividing the substrate through a dicing D process.

Figure 11A:
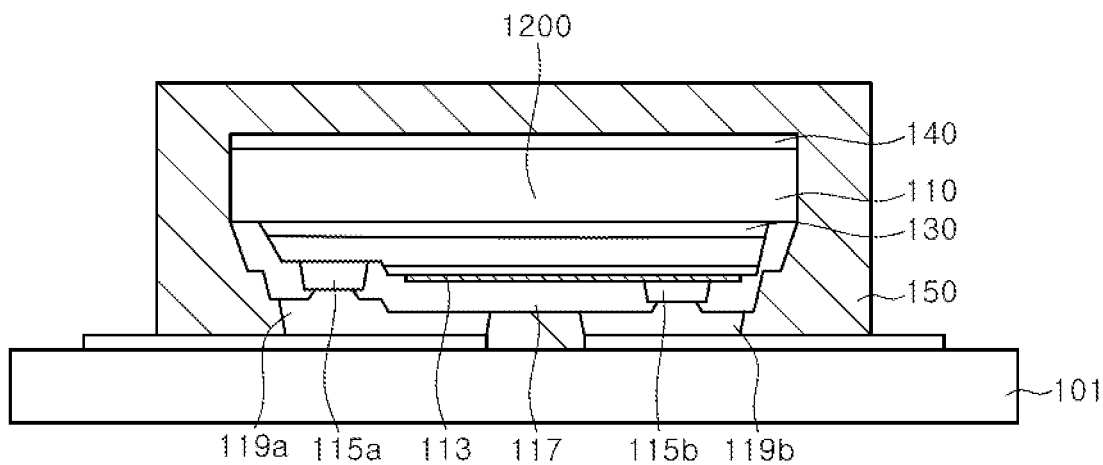
FIG. 11A is a schematic cross-sectional view illustrating an example in which a light emitting device according to another exemplary embodiment is applied to a light emitting device package.

FIG. 11A illustrates an example in which the light emitting device according to another exemplary embodiment of the present disclosure is applied to a package.

Referring to FIG. 11A, the light emitting device 1200 is disposed on the electrode located on the upper surface of the circuit board 101, and a molding layer 150 may be formed surrounding side, upper and lower surfaces of the light emitting device 1200. Specifically, first and second pad electrodes 119*a* and 119*b* of the light emitting device 1200 may be in contact with the electrode of the substrate 101 to make electrical contact.

The light emitting device 1200 may emit light through the side surface thereof. In more detail, the first and second insulation reflection layers 117 and 140 may reflect light emitted to the upper and lower surfaces of the light emitting device 1200, and reflected light may be emitted through the side surface of the light emitting device 1200. Accordingly, light emitted from the light emitting device 1200 may be widely dispersed in a lateral direction, and thus, a light emitting area of the light emitting device 1200 may be increased.

The molding layer 150 may protect the light emitting device 1200 from external materials such as moisture, dust, and others. The molding layer 150 may consist of a light-transmitting material such as an epoxy resin, a silicone resin, or the like.

Figure 11B:
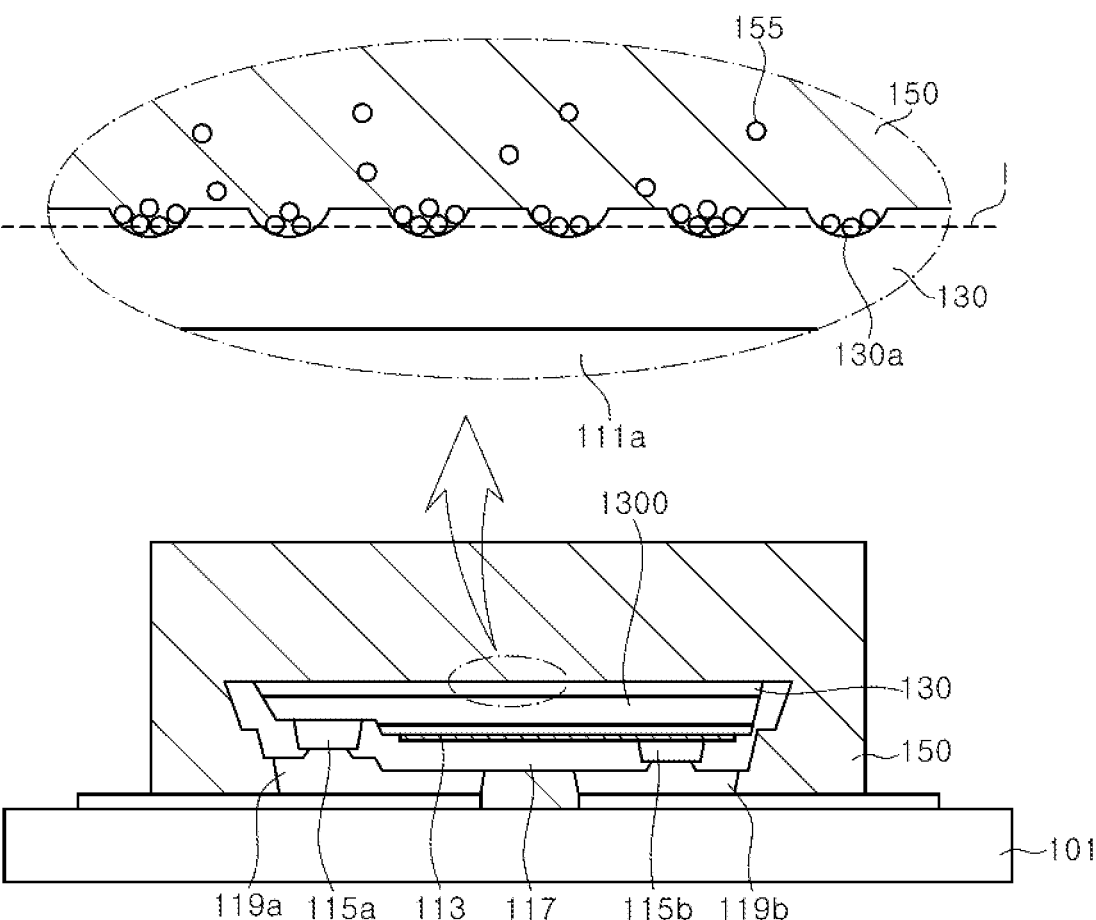
FIG. 11B is a schematic cross-sectional view illustrating an example in which a light emitting device according to another exemplary embodiment is applied to a light emitting device package.

FIG. 11B is a schematic cross-sectional view illustrating an example in which a light emitting device according to another exemplary embodiment is applied to a light emitting device package. The drawing below is an enlarged view of a part indicated by the dotted line.

Referring to FIG. 11B, the light emitting device package according to the illustrated embodiment is substantially similar to the light emitting device package described with reference to FIG. 11A, except that a light emitting device 1300 does not include the substrate 110. The substrate 110 may be, for example, a patterned sapphire substrate, and as the substrate 110 is removed, concave grooves 130a may be formed on a semiconductor layer, for example, the first stress relief layer 130. When the first stress relief layer 130 is omitted, the concave grooves 130a may be formed on a surface of the first conductivity type semiconductor layer 111a. Meanwhile, the molding layer 150 may include a wavelength conversion material 155, for example, a phosphor or a quantum dot. In this illustrated embodiment, the wavelength conversion material 155 may be dispersed in the molding layer 150. As shown in FIG. 11B, the wavelength conversion materials 155 may be concentrated in the concave grooves 130a. Accordingly, regions having different densities of the wavelength conversion material 155 may be formed. In particular, the density of the wavelength conversion material 155 in a region vertically overlapped with the concave grooves 130a may be higher than those in other regions. In addition, in cross-sectional view on the basis of an imaginary line I crossing the concave grooves 130a, the light emitting device package may include at least one region where the wavelength conversion material 155 is disposed and a region where the wavelength conversion material 155 is not disposed. The region where the wavelength conversion material 155 is not disposed may be on one side of the region where the wavelength conversion material 155 is disposed. Alternatively, in cross-sectional view on the basis of the imaginary line I crossing the concave grooves 130a, regions that do not include the wavelength conversion material 155 may be disposed on both sides of the at least one region where the wavelength conversion material 155 is disposed. Alternatively, in cross-sectional view on the basis of the imaginary line I crossing the concave grooves 130a, regions where the wavelength conversion material 155 is disposed and regions that do not include the wavelength conversion material 155 may be alternately formed. Alternatively, in view on the basis of the imaginary line I, a density of the wavelength conversion material 155 disposed in one concave groove 130a may be different from a density of the wavelength conversion material 155 disposed in another concave groove 130a, or the number of wavelength conversion materials 155 may be different from each other. At least one wavelength conversion material 155 disposed in the concave groove 130a may be disposed closer to the active layer than at least one wavelength conversion material 155 disposed in a region that is not vertically overlapped with the concave groove 130a. Therefore, light loss may be reduced by shortening a path of light reaching the wavelength conversion material 155. The wavelength conversion material 155 may include a cover layer surrounding a center thereof, and a size of the wavelength conversion material 155 may be less than or equal to 10 nm. The cover layer may be a single layer or formed of a plurality of layers. The wavelength conversion material 155 may be a circular shape or may include a curved surface such as an elliptical shape, or may have a bar shape.

FIG. 12A, FIG. 12B, FIG. 12C, and FIG. 12D are schematic cross-sectional views illustrating a method of manufacturing a light emitting device according to another exemplary embodiment.

Referring to FIG. 12A, FIG. 12B, FIG. 12C, and FIG. 12D, a substrate 210, a first stress relief layer 220, a second stress relief layer 230, and a light emitting structure 211 are formed in a same manner as in FIGS. 7A and 7B. Accordingly, a description of the same element will be omitted.

The light emitting structure 211 may be formed into a mesa structure through a mesa etching process. In more detail, the mesa structure may include a second conductivity type semiconductor layer 211c and an active layer 211b, and may be disposed on the first conductivity type semiconductor layer 211a. The mesa structure may include a portion of a first conductivity type semiconductor layer 211a together with the active layer 211b and the second conductivity type semiconductor layer 211c. An ohmic electrode 213 may be formed on the second conductivity type semiconductor layer 211c of the light emitting structure 211, a dielectric layer 212 covering at least a portion of the ohmic electrode 213, and covering a side surface of the mesa is formed, and a metal reflection layer 216 may be formed in an opening 212a of the dielectric layer 212. A lower insulation layer 214 may be formed on the metal reflection layer 216, and first and second contact electrodes 215a and 215b may be formed on an upper surface of the lower insulation layer 214. In addition, an upper insulation layer 218 may be formed on upper and side surfaces of the first and second contact electrodes 215a and 215b, and a first electrode pad 219a and a second electrode 219b may be formed in openings of the upper insulation layer 218.

The ohmic electrode 213 may contact the second conductivity type semiconductor layer 211c. The ohmic electrode 213 may be formed over almost an entire region of an upper portion of the second conductivity type semiconductor layer 211c.

The ohmic electrode 213 may be formed of an oxide and a metal that transmit light generated in the active layer 211b of the light emitting structure 211. The ohmic electrode 213 may be formed of, for example, indium tin oxide (ITO), zinc oxide (ZnO), Ni, and the like. The ohmic electrode 213 may be formed to have a thickness sufficient to be in ohmic contact with the second conductivity type semiconductor layer 211c, and for example, may be formed within a thickness range of 3 nm to 50 nm, more specifically, within the thickness range of 6 nm to 30 nm. If the thickness of the ohmic electrode 213 is too small, a forward voltage may increase because sufficient ohmic characteristics may not be provided. If the thickness of the ohmic electrode 213 is too large, loss due to light absorption may occur, thereby reducing luminous efficiency.

Next, the dielectric layer 212 may cover the ohmic electrode 213 and further, may cover side surfaces of the second conductivity type semiconductor layer 211c and the first conductivity type semiconductor layer 211a. Accordingly, an edge of the dielectric layer 212 may be located farther from an edge of the substrate 210 than an edge of the lower insulation layer 214. However, the inventive concepts are not limited thereto, and a portion of the dielectric layer 212 may be exposed to the outside by the lower insulation layer 214.

The dielectric layer 212 may have the opening 212a exposing the ohmic electrode 213. The opening 212a may be formed in an upper portion of the ohmic electrode 213. The opening 212a may be used as a connection path such that the metal reflection layer 216 can be connected to the ohmic electrode 213.

The dielectric layer 212 may be formed of an insulating material having a lower refractive index than those of the second conductivity type semiconductor layer 211c and the ohmic electrode 213, and may be formed of, for example, $SiO_2$, without being limited thereto.

Thereafter, the metal reflection layer 216 may be electrically connected to the ohmic electrode 213 through the opening 212a of the dielectric layer 212 formed on the ohmic electrode 213. The metal reflection layer 216 includes a reflective metal, for example, Ag or Ni/Ag. Furthermore, the metal reflection layer 216 may include a barrier layer for protecting a reflection metal material layer, for example, Ni, and may include an Au layer so as to prevent oxidation of a metallic layer. Furthermore, so as to improve an adhesion of the Au layer, a Ti layer may be included in a lower portion of the Au layer. A partial region of the metal reflection layer 216 may be in contact with an upper surface of the dielectric layer 212.

By disposing the ohmic electrode 213, the dielectric layer 212, and the metal reflection layer 216 on the second conductivity type semiconductor layer 211c, a reflectivity of light may be improved, thereby improving luminous efficiency.

The lower insulation layer 214 may cover the mesa and the metal reflection layer 216. The lower insulation layer 214 may also cover the first conductivity type semiconductor layer 211a along a periphery of the mesa. In particular, the lower insulation layer 214 may be formed to cover a side surface of the mesa and the dielectric layer 212. Meanwhile, the lower insulation layer 214 may have a first opening 214a exposing the first conductivity type semiconductor layer 211a and a second opening 214b exposing the metal reflection layer 216.

The lower insulation layer 214 may be formed of a single layer of $SiO_2$ or $Si_3N_4$, without being limited thereto. For example, the lower insulation layer 214 may have a multilayer structure including $SiO_2$ or $Si_3N_4$, and may include a distributed Bragg reflector in which $SiO_2$ layers and $TiO_2$ layers are alternately stacked.

The first contact electrode 215a may be disposed on the lower insulation layer 214, and may be insulated from the mesa and the metal reflection layer 216 by the lower insulation layer 214. The first contact electrode 215a may contact the first conductivity type semiconductor layer 211a through the first opening 214a of the lower insulation layer 214.

The second contact electrode 215b may be formed in an upper region of the mesa on the lower insulation layer 214, and may be electrically connected to the metal reflection layer 216 through the second opening 214b of the lower insulation layer 214. A boundary region 215ab may be formed between the second contact electrode 215b and the first contact electrode 215a, the lower insulation layer 214 may be exposed in the boundary region 215ab, and the boundary region 215ab may be covered with the upper insulation layer 218.

In some forms, the first and second contact electrodes 215a and 215b may be formed together using the same material through a same process. The first and second contact electrodes 215a and 215b may include an ohmic reflection layer such as an Al layer, and the ohmic reflection layer may be formed on an adhesive layer such as Ti, Cr, Ni, or the like. In addition, a protection layer having a single layer or a composite layer structure of Ni, Cr, Au, or the like may be formed on the ohmic reflection layer. The first and second contact electrodes 215a and 215b may have, for example, a multilayer structure of Cr/Al/Ni/Ti/Ni/Ti/Au/Ti.

Thereafter, the upper insulation layer 218 may be formed to cover the first and second contact electrodes 215a and 215b. The upper insulation layer 218 may cover the first conductivity type semiconductor layer 211a along the periphery of the mesa. The upper insulation layer 218 may expose the first conductivity type semiconductor layer 211a along an edge, but the inventive concepts are not limited thereto, and the upper insulation layer 218 may cover all of the first conductivity type semiconductor layer 211a or may be formed to be flush with the edge of the substrate 210. In addition, the upper insulation layer 218 may have an opening exposing the first and second contact electrodes 215a and 215b.

The upper insulation layer 218 may be formed of a single layer of $SiO_2$ or $Si_3N_4$, without being limited thereto. For example, the upper insulation layer 218 may have a multilayer structure including $SiO_2$ or $Si_3N_4$, and may include a distributed Bragg reflector in which $SiO_2$ layers and $TiO_2$ layers are alternately stacked.

Meanwhile, the first electrode pad 219a and the second electrode pad 219b may be electrically connected to the first contact electrode 215a and the second contact electrode 215b exposed through the opening of the upper insulation layer 218, respectively. The first and second electrode pads 219a and 219b may be formed in the opening of the upper insulation layer 218. However, the inventive concepts are not limited thereto, and the first and second electrode pads 219a and 219b may be formed to cover all of the openings of the upper insulation layer 218 and to seal them.

Thereafter, the first stress relief layer 220 may be removed by grinding a lower surface of the substrate 210 on which the first stress relief layer 220 has been grown, and a thickness of the substrate 220 may be reduced to a certain thickness by removing at least a portion of the substrate 220. In addition, a lapping process may be further carried out so as to reduce a roughness of the surface of the substrate 210, and a roughened surface generated due to grinding may be trimmed by lapping and chemical mechanical polishing (CMP) processes.

Figure 12A:
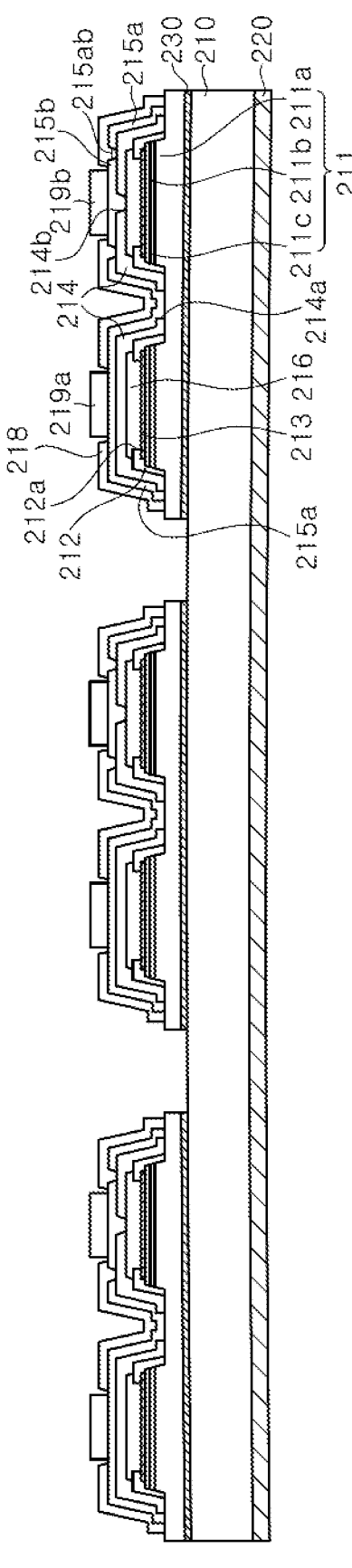
FIGS. 12A through 12D are schematic cross-sectional views illustrating a method of manufacturing a light emitting device according to another exemplary embodiment.
Figure 12B:
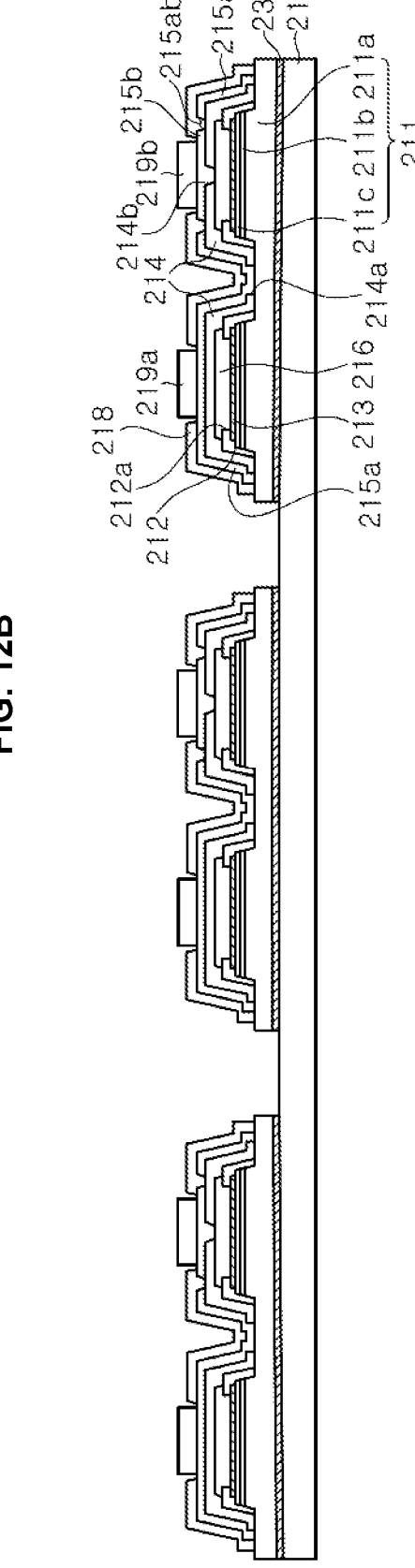
Figure 12C:
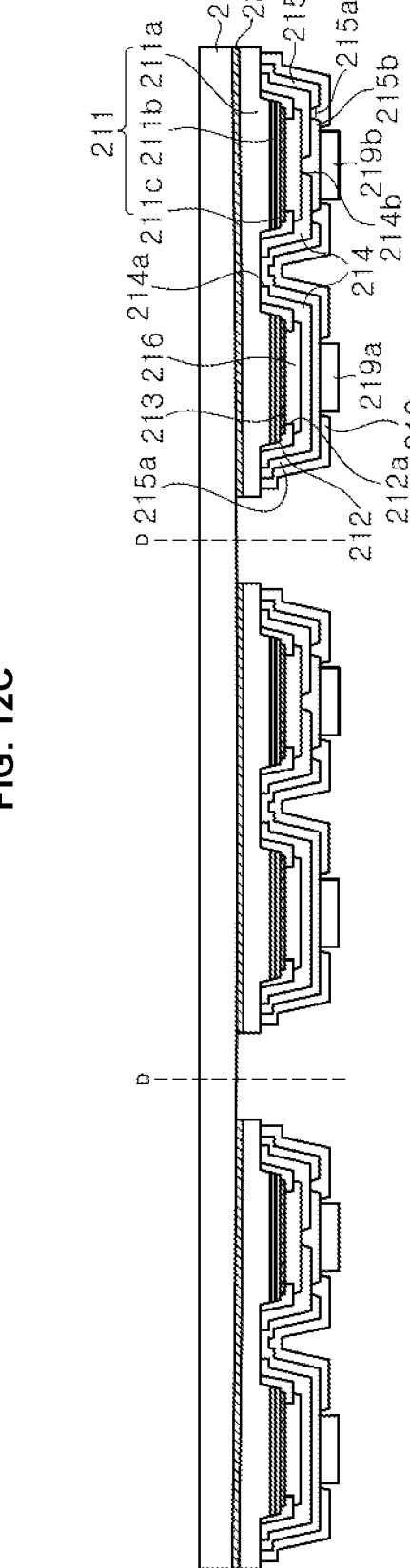
Figure 12D:
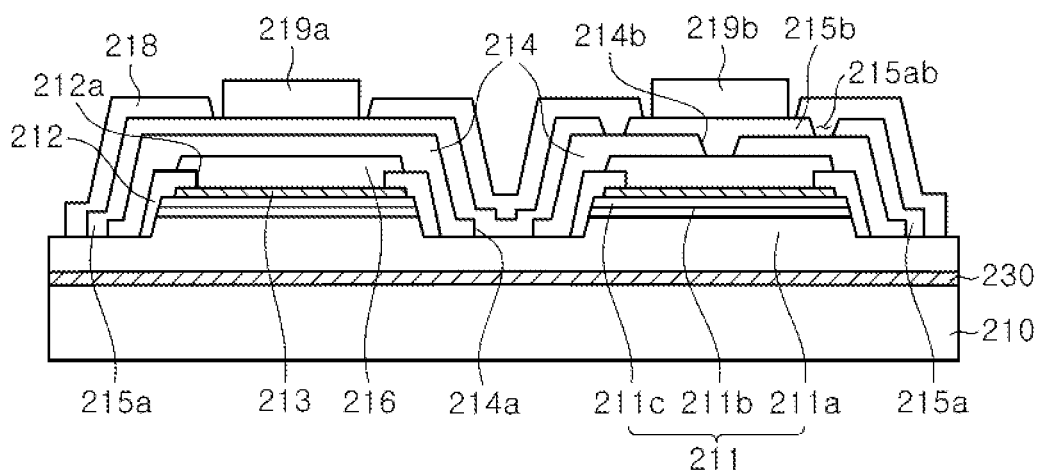

Subsequently, as shown in FIG. 12C, a light emitting device 2100 as shown in FIG. 12D may be provided by dividing the substrate through a dicing D process as shown in FIG. 12C.

Figure 13:
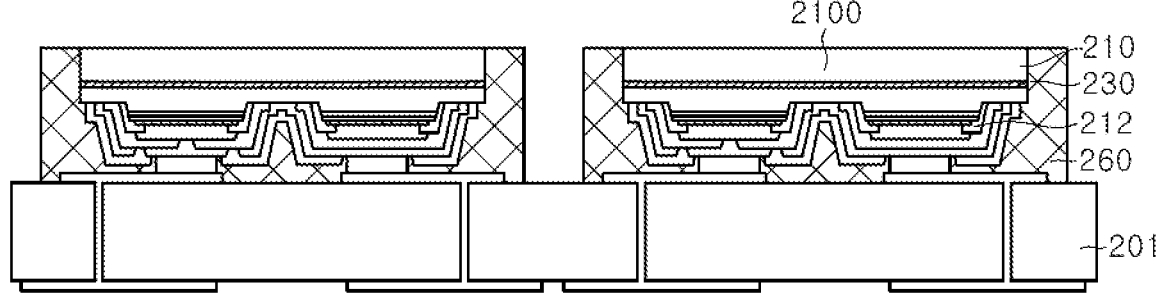
FIG. 13 is a schematic cross-sectional view illustrating an example in which a light emitting device according to an exemplary embodiment is applied to a light emitting device package.

FIG. 13 illustrates an example in which the light emitting device according to another exemplary embodiment of the present disclosure is applied to a package.

Referring to FIG. 13, the light emitting device 2100 may be disposed on an electrode located on an upper surface of a circuit board 201, and a reflection material 260 may be formed surrounding a side surface of the light emitting device 2100.

The light emitting device 2100 may emit light through an upper surface and a side surface thereof. The reflection material 260 may cover the side and lower surfaces of the light emitting device 2100. The reflection material 260 may reflect or absorb light emitted to the side surface and the lower surface of the light emitting device 2100. The reflected light may be emitted through the upper surface of the light emitting device 2100 after entering the light emitting device 2100. Accordingly, light emitted from the light emitting device 2100 may be set to be focused upward. However, the inventive concepts are not limited thereto, and a viewing angle of light emitted from a light emitting structure 211 may be adjusted by adjusting a reflectivity and a light transmittance of the reflection material 260, if necessary.

The reflection material 260 may include a white resin, without being limited thereto. The white resin may include a white pigment in a resin. Instead of the reflection material 260, a light blocking material that absorbs or blocks light by including a black dye or pigment in the resin may be disposed. In addition, the reflection material 260 may prevent light emitted from the light emitting device 2100 from being reabsorbed by the light emitting device 2100.

FIG. 14A, FIG. 14B, FIG. 14C, and FIG. 14D are schematic cross-sectional views illustrating a method of manufacturing a light emitting device according to another exemplary embodiment.

Referring to FIG. 14A, FIG. 14B, FIG. 14C, and FIG. 14D, the light emitting device has the same configuration as that of FIGS. 12A, 12B, 12C, and 12D except for a configuration of a second insulation reflection layer 240. Accordingly, a description of the same element will be omitted.

As shown in FIG. 14C, the second insulation reflection layer 240 may be formed in a lower portion of the substrate 210. The second insulation reflection layer 240 may cover an entire lower surface of the substrate 210. The second insulation reflection layer 240 may include a distributed Bragg reflector.

Figure 14A:
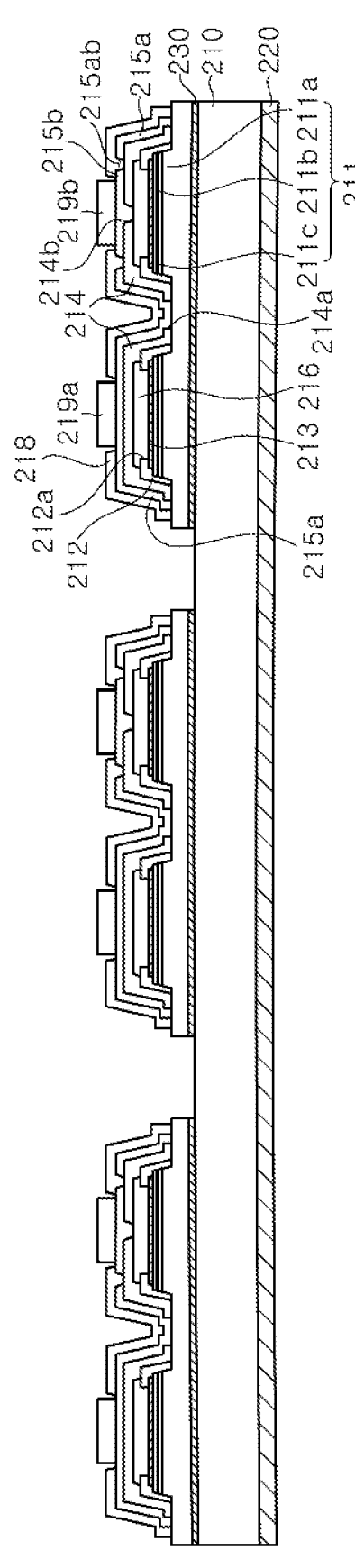
Figure 14B:
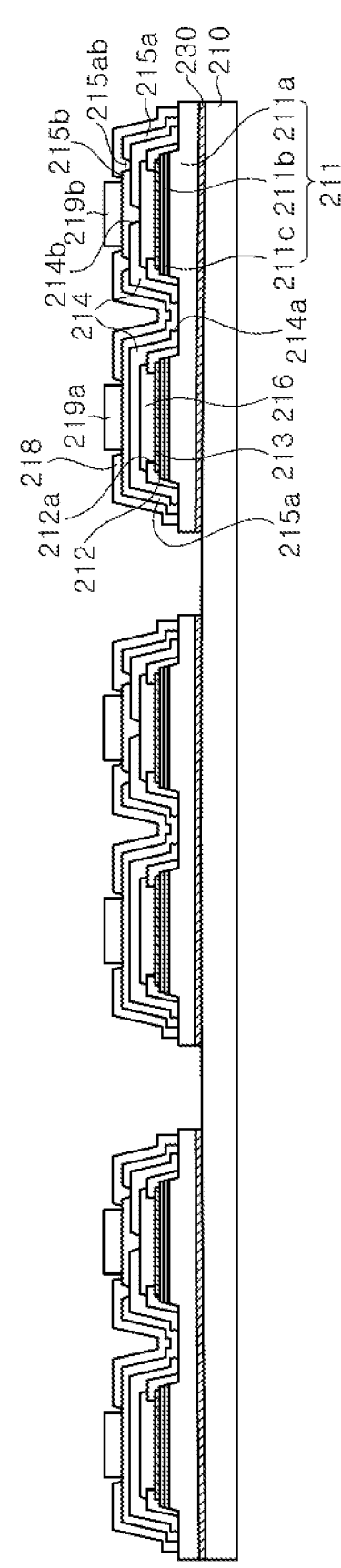
Figure 14C:
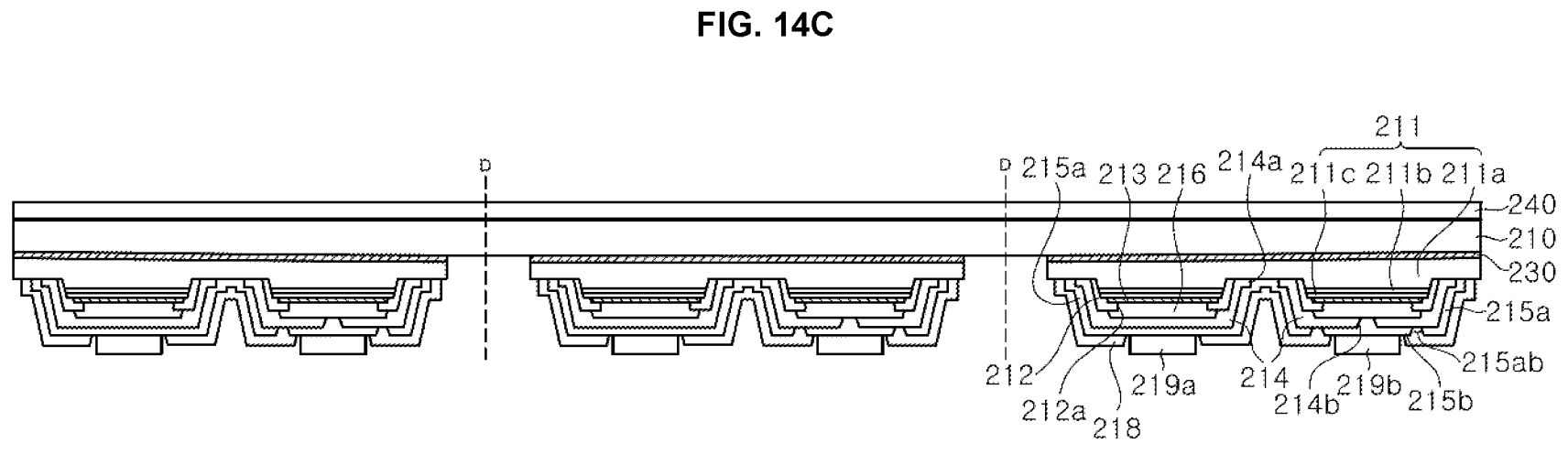
Figure 14D:
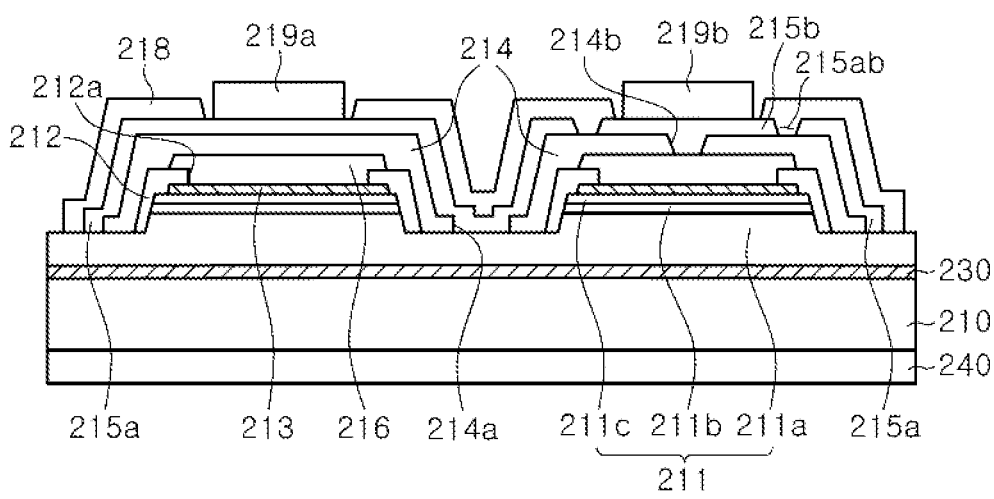

Subsequently, as shown in FIG. 14C, the light emitting device 2200 as shown in FIG. 14D may be provided by dividing the substrate through a dicing D process.

Figure 15A:
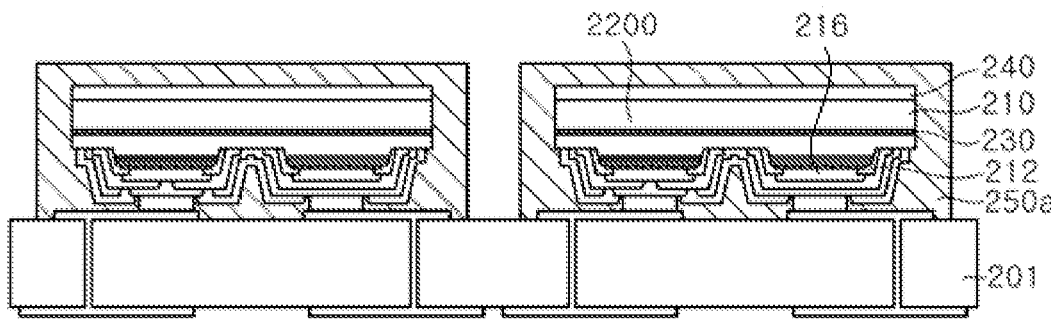
FIGS. 15A and 15B are schematic cross-sectional views illustrating an example in which a light emitting device according to an exemplary embodiment is applied to a light emitting device package.
Figure 15B:
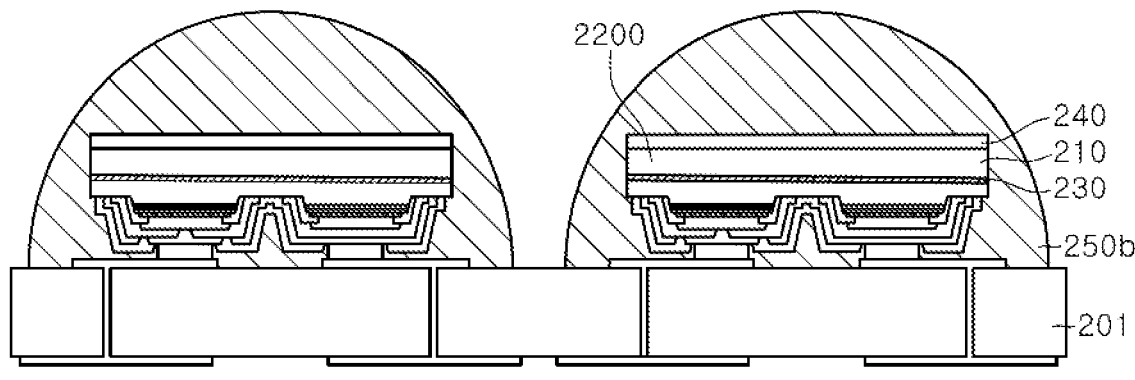

FIG. 15A and FIG. 15B illustrate an example in which the light emitting device according to another exemplary embodiment of the present disclosure is applied to a package.

Referring to FIG. 15A, the light emitting device 2200 is disposed on the electrode located on the upper surface of the circuit board 201, and a molding layer 250a may be formed surrounding side, upper, and lower surfaces of the light emitting device 2200.

The light emitting device 2200 may emit light through the side surface thereof. In more detail, the metal reflection layer 216 and the second insulation reflection layer 240 may reflect light emitted to the upper and lower surfaces of the light emitting device 2200, and reflected light may be emitted through the side surface of the light emitting device 2200. Accordingly, light emitted from the light emitting device 2200 may be widely dispersed in the lateral direction, and thus, a light emitting area of the light emitting device 2200 may be increased.

The molding layer 250a may protect the light emitting device 2200 from external materials such as moisture, dust, and others. The molding layer 250a may include a material such as silicone, epoxy, oxide, nitride, or the like.

Referring to FIG. 15B, the light emitting device 2200 may be disposed on an electrode of a substrate 201, and a molding layer 250b may be disposed on an upper side of the electrode of the substrate 201 to be spaced apart from the light emitting device 2200.

A lower surface of the molding layer 250b facing the substrate 201 may be flat, and an upper surface of the molding layer 250b may have a lens structure of a convex dome shape. In the dome-shaped lens, a center of a convex portion may overlap an optical axis of the light emitting device 2200.

The molding layer 250b may include a material capable of transmitting light emitted from the light emitting device 2200. For example, the molding layer 250b may include a material such as silicone, epoxy, oxide, nitride, or the like. In addition, the molding layer 250b may include a glass material. For example, the molding layer 250b may be formed of a transparent material such as LiF, MgF$_2$, CaF$_2$, BaF$_2$, Al$_2$O$_3$, SiO$_2$, or optical glass (N-BK7), and in a case of SiO$_2$, it may be a quartz crystal. The molding layer 250b may be light-transmissive with respect to a plurality of peak wavelengths of light emitted from the light emitting device. Alternatively, the molding layer 250b may have different light transmittance with respect to the plurality of peak wavelengths of light emitted from the light emitting device. Preferably, the light transmittance may be higher at the second peak wavelength than the first peak wavelength, and the light transmittance may be higher at a relatively longer wavelength than a shorter wavelength.

Figure 16A:
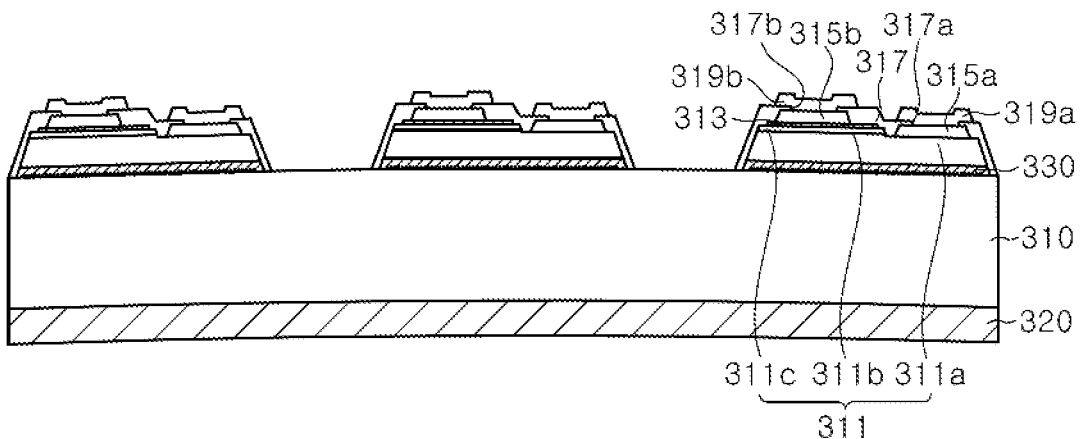
FIGS. 16A and 16B are schematic cross-sectional views illustrating a method of manufacturing a light emitting device according to another exemplary embodiment.
Figure 16B:
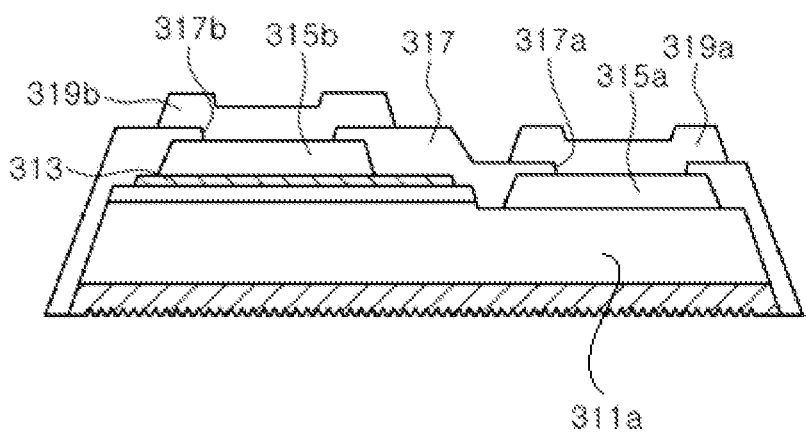

FIG. 16A and FIG. 16B are a cross-sectional view and a plan view illustrating a method of manufacturing a light emitting device according to another exemplary embodiment, respectively.

Referring to FIG. 16A and FIG. 16B, a substrate 310, a first stress relief layer 320, a second stress relief layer 330, and a light emitting structure 311 are formed in the same manner as in FIGS. 7A and 7B. Accordingly, a description of the same element will be omitted.

The light emitting structure 311 may include a first conductivity type semiconductor layer 311a, an active layer 311b, and a second conductivity type semiconductor layer 311c, and an ohmic electrode 313 and first and second contact electrodes 315a and 315b may be formed on the second conductivity type semiconductor layer 311c. In addition, a first insulation reflection layer 317 having an opening may be formed on the first and second contact electrodes 315a and 315b, and first and second pad electrodes 319a and 319b may be formed to cover at least a portion of the first insulation reflection layer 317 and the exposed first and second contact electrodes 315a and 315b.

In the illustrated exemplary embodiment, a light emitting device 3100 may be a light emitting device 3100 that emits red light, green light, and blue light, respectively, without being limited thereto, or may be a light emitting device that emits light of various colors, as described with reference to FIGS. 6A through 6O.

In some forms, the light emitting device 3100 emits red light, and the semiconductor layers included in the light emitting device 3100. may be gallium nitride based semiconductor layers, without being limited thereto, and may include aluminum gallium arsenide (AlGaAs), gallium arsenide phosphide. (GaAsP), aluminum gallium indium phosphide (AlGaInP), or gallium phosphide (GaP).

In another form, the light emitting device 3100 emits green light, and the semiconductor layers included in the light emitting device 3100 may include indium gallium nitride (InGaN), gallium nitride (GaN), gallium phosphide (GaP), aluminum gallium indium phosphide (AlGaInP), or aluminum gallium phosphide (AlGaP).

In another form, the light emitting device 3100 emits blue light, and the semiconductor layers included in the light emitting device 3100 may include gallium nitride (GaN), indium gallium nitride (InGaN), or zinc selenide (ZnSe).

The light emitting structure 311 may form a mesa structure. The second conductivity type semiconductor layer 311c and the active layer 311b may have the mesa structure and be formed on the first conductivity type semiconductor layer 311a. The mesa may include the active layer 311b and the second conductivity type semiconductor layer 311c, and may also include a portion of the first conductivity type semiconductor layer 311a.

The ohmic electrode 313 may be in ohmic contact with the second conductivity type semiconductor layer 311*c* and be formed on the second conductivity type semiconductor layer 313*c*. The ohmic electrode 313 may be formed as a single layer or multiple layers. The ohmic electrode 313 may be formed of a transparent conductive oxide film or a metallic layer. For example, the transparent conductive oxide layer may include ITO or ZnO, and the metallic layer may include a metal such as Al, Ti, Cr, Ni and Au, and alloys thereof.

The first contact electrode 315*a* may be formed on the exposed first conductivity type semiconductor layer 311*a* in which the mesa is not formed. The first contact electrode 315*a* may be in ohmic contact with the first conductivity type semiconductor layer 311*a*. The first contact electrode 315*a* may be formed of an ohmic metallic layer in ohmic contact with the first conductivity type semiconductor layer 311*a*. The ohmic metallic layer of the first contact electrode 315*a* may be appropriately selected depending on a semiconductor material of the first conductivity type semiconductor layer 311*a*.

The second contact electrode 315*b* may be formed on the ohmic electrode 313. The second contact electrode 315*b* may be electrically connected to the ohmic electrode 313.

The first insulation reflection layer 317 may cover at least portions of the first conductivity type semiconductor layer 311*a*, the active layer 311*b*, the second conductivity type semiconductor layer 311*c*, the first contact electrode 315*a*, and the second contact electrode 315*b*. In the exemplary embodiment of the present disclosure, the first insulation reflection layer 317 may be formed so as to cover substantially an entire surface of the second contact electrode 315*b* except for a partial region of the second contact electrode 315*b* and a portion of the first contact electrode 315*a*. That is, the first insulation reflection layer 317 may have a first opening 317*a* and a second opening 317*b* exposing the first contact electrode 315*a* and the second contact electrode 315*b*. The first insulation reflection layer 317 may be formed of a distributed Bragg reflector in which insulation layers having different refractive indices are stacked, and the distributed Bragg reflector may be formed by alternately stacking at least eight insulation layers selected from $SiO_2$, $TiO_2$, $Nb_2O_5$, $Si_3N_4$, SiON, $Ta_2O_5$, and the like.

The distributed Bragg reflector may reflect light emitted from the active layer 311*b*, and in this case, the distributed Bragg reflector may be formed so as to exhibit a high reflectivity over a relatively wide wavelength range including a peak wavelength of light emitted from the active layer 311*b*. In addition, the distributed Bragg reflector may be designed in consideration of an incident angle of light, if necessary. Through this, the distributed Bragg reflector may emit light generated in the active layer 311*b* to the outside of the light emitting device 3100 through the first conductivity type semiconductor layer 311*a* exposed by removing the substrate.

The light emitting device 3100 emitting blue light may have a higher internal quantum efficiency than the light emitting devices 3100 emitting red light and green light. Accordingly, the light emitting structure emitting blue light may exhibit a higher light extraction efficiency than the light emitting devices 3100 emitting red light and green light. Accordingly, it may be difficult to properly maintain a color mixing ratio of red light, green light, and blue light. So as to adjust the color mixing ratio of the red light, the green light, and the blue light, the light emitting devices 3100 may be formed such that applied distributed Bragg reflectors have different reflectivities from one another. Specifically, the light emitting device 3100 emitting blue light may have a distributed Bragg reflector having a relatively low reflectivity compared to the light emitting devices 3100 emitting red light and green light.

In an exemplary embodiment of the present disclosure, the distributed Bragg reflectors applied to the light emitting devices 3100 of the red light, the green light, and the blue light may have substantially similar thicknesses. By setting the thicknesses of the distributed Bragg reflectors to be similar, process conditions applied to each of the light emitting devices 3100 emitting red light, green light, and blue light may be similarly set. Specifically, a process of patterning the first insulation reflection layer 317 may be set similarly, and the distributed Bragg reflectors may have a similar number of stacks. However, the inventive concepts are not limited thereto.

The first pad electrode 319*a* and the second pad electrode 319*b* may be formed on the first insulation reflection layer 317. The first pad electrode 319*a* may extend from an upper portion of the first contact electrode 315*a* to an upper portion of the ohmic electrode 313 with at least a portion of the first insulation reflection layer 317 interposed therebetween. The second pad electrode 319*b* may be formed in a region of the upper portion of the ohmic electrode 313. In more detail, the second pad electrode 319*b* may extend from an upper portion of the second contact electrode 315*b* to the upper portion of the ohmic electrode 313 with the first insulation reflection layer 317 interposed therebetween.

The first pad electrode 319*a* may be electrically connected to the first contact electrode 315*a* through the first opening 317*a* of the first insulation reflection layer 317, and if necessary, it may directly contact the first conductivity type semiconductor layer 311*a*. In this case, the first contact electrode 315*a* may be omitted. The second pad electrode 319*b* may be electrically connected to the second contact electrode 315*b* through the second opening 317*b* of the first insulation reflection layer 317, the second pad electrode 319*b* may directly contact the ohmic electrode 313, and the second contact electrode 315*b* may be omitted.

Next, the substrate 310 and the first stress relief layer 320 may be removed. A laser lift-off process may be used to separate the first stress relief layer 320 and the substrate 310, without being limited thereto, or an etching process or a chemical mechanical polishing (CMP) process may be used. When a multilayer light emitting structure formed of a III-V nitride-based semiconductor is subjected to the laser lift-off process, many damages and cracks may occur in the semiconductor single crystal thin film after separation from the sapphire substrate because the semiconductor single crystal thin film has a lattice constant and a thermal expansion coefficient different from those of the substrate 310 and it cannot withstand a mechanical stress generated between the III-V nitride semiconductor thin film and the substrate, for example, the sapphire substrate. However, in a case of the exemplary embodiment of the present disclosure, a warpage of the substrate 310 may be alleviated using the first stress relief layer 320 and the second stress relief layer 330, and thus, the semiconductor layer may be grown relatively thin. Accordingly, it may be easy to separate the substrate 310 and the first stress relief layer 320 from the light emitting structure, and a high-quality semiconductor layer may be obtained by alleviating damage to the semiconductor layer. The light emitting device 3100 may be, for example, a micro LED, and in a case of the micro LED, a quality of the semiconductor layer may be a major factor in the occurrence of product failures. In the exemplary embodiment of the present disclosure, by employing the first and second stress relief layers 320 and 330, the high-quality semiconductor layer may be secured, and a yield of micro LEDs on a single wafer may be improved.

Meanwhile, after the substrate 310 is removed, grooves may be formed on a surface of the first conductivity type semiconductor layer 311a as shown in FIG. 16B. For example, when the substrate 310 is a patterned sapphire substrate, the grooves may be formed on the surface of the first conductivity type semiconductor layer 311a depending on a shape of the substrate. A diffusion agent or another filler material may be densely formed in surface grooves of the first conductivity type semiconductor layer 311a.

Figure 17A:
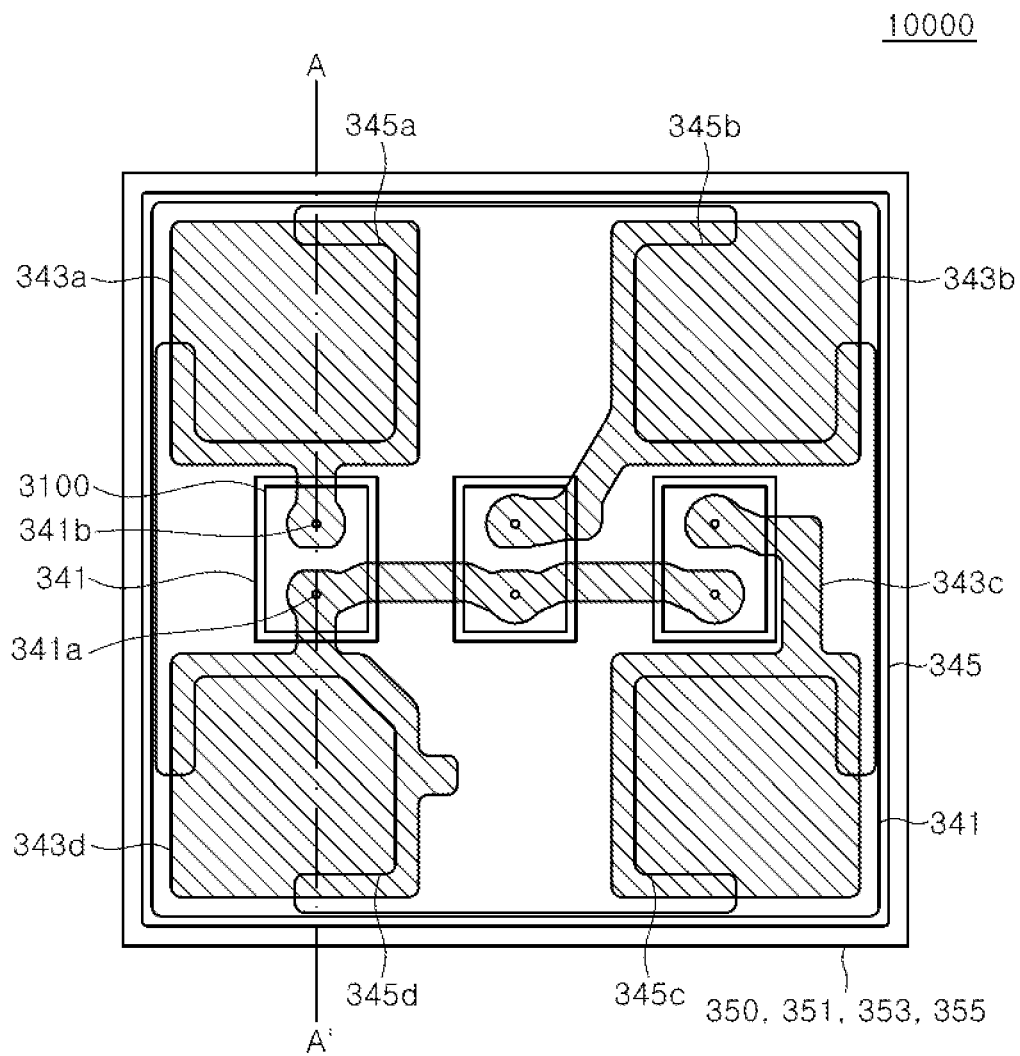
FIG. 17A is a schematic cross-sectional view illustrating an example in which a light emitting device according to an exemplary embodiment is applied to a unit pixel.
Figure 17B:
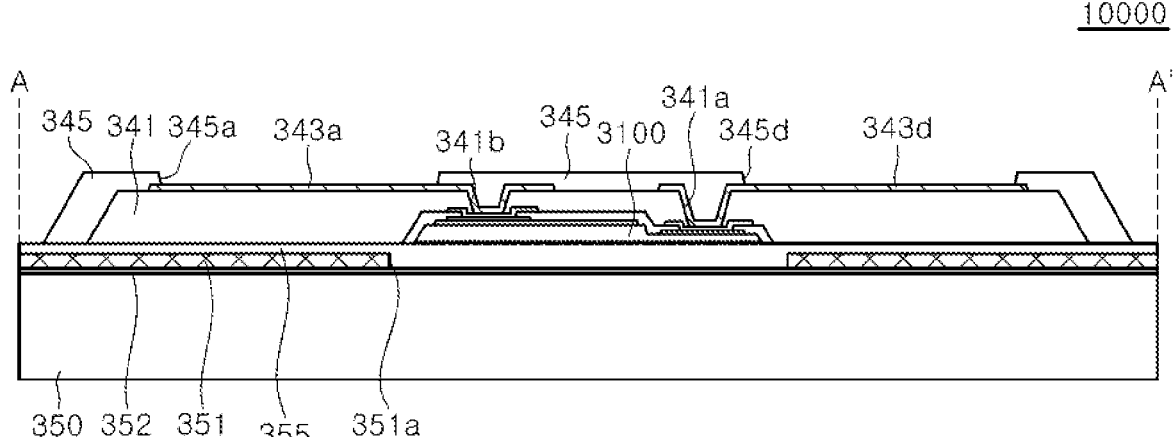
FIG. 17B is a schematic cross-sectional view taken along line A-A' of FIG. 17A.
Figure 18:
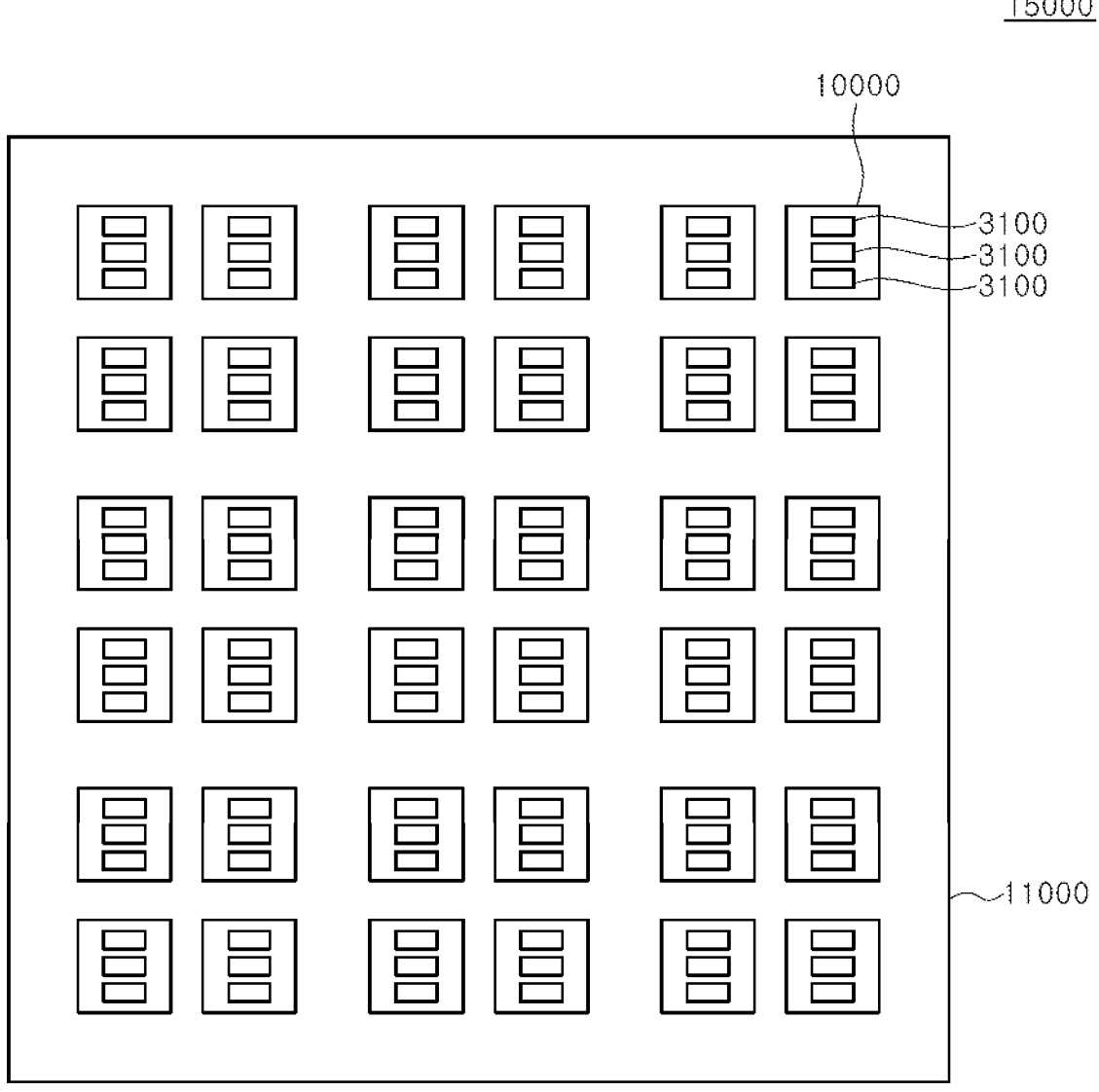
FIG. 18 is a schematic cross-sectional view illustrating an example in which a light emitting device according to an exemplary embodiment is applied to a display apparatus.

FIG. 17A, FIG. 17B, and FIG. 18 show an example in which the light emitting device according to another exemplary embodiment of the present disclosure is employed in a unit pixel and applied to a display apparatus.

Referring to FIG. 17A and FIG. 17B, a unit pixel 10000 may include a transparent substrate 350, a light emitting device 3100 formed on the transparent substrate 350, and a light blocking layer 351 formed between the transparent substrate 350 and the light emitting device 3100, a window 351a formed in a region where the light blocking layer 351 is open, a surface layer 352 for adhesion between the transparent substrate 350 and the light blocking layer 351, an adhesive layer 355 formed extending from the window 351a to an upper portion of the light blocking layer 351, a step adjustment layer 341 formed to cover at least a portion of the light emitting device 3100 on the adhesive layer 355, connection layers 343a, 343b, 343c, and 343d formed in openings of the step adjustment layer 341, and an insulation material layer 345 covering the step adjustment layer 341 and at least portions of the connection layers 343a, 343b, 343c, and 343d.

A plurality of light emitting devices 3100 in the unit pixel 10000 may include at least three or more light emitting devices to provide one pixel.

The plurality of light emitting devices 3100 used in the illustrated embodiment may include micro LEDs having a surface area of less than 10,000 $\mu m^2$, and each of the light emitting devices 3100 may extract light of different colors.

The transparent substrate 350 may be a light-transmitting substrate such as PET, glass substrate, quartz, sapphire substrate, or the like. The transparent substrate 350 may be disposed on a light exiting surface of a display apparatus 15000, and light generated from the light emitting device 3100 may be extracted to the outside through the transparent substrate 350. The transparent substrate 350 may have an upper surface that is the light exiting surface and a lower surface adjacent to the light emitting device 3100. The transparent substrate 350 may have a flat surface at a lower surface of the transparent substrate 350, which faces the light emitting device 3100, without being limited thereto, and a concave-convex pattern may be formed on the surface of the transparent substrate 350 facing the light emitting device 3100, or the concave-convex pattern may be formed on an entire surface of the transparent substrate 350 by extending to a side of the surface facing the light emitting device 3100.

The transparent substrate 350 may include an anti-reflection coating on the upper surface which is the light exiting surface, or may include an anti-glare layer. The transparent substrate 350 may have a thickness of about 50 $\mu m$ to about 300 $\mu m$.

Since the transparent substrate 350 is disposed on the light exiting surface in the illustrated exemplary embodiment, the transparent substrate 350 does not include a circuit. However, the inventive concepts are not limited thereto, and, in some exemplary embodiments, the transparent substrate 350 may include the circuit.

In addition, in the present disclosure, although a single unit pixel 10000 is formed on a single transparent substrate 350, without being limited thereto, a plurality of unit pixels 10000 may be formed on the single transparent substrate 350.

In the present disclosure, an additional surface layer 352 may be formed between the transparent substrate 350 and the light blocking layer 351, and the surface layer 352 is formed to improve adhesion with the light blocking layer 351. For example, the surface layer 352 may be formed of a silicon oxide layer. The surface layer 352 may be omitted depending on a type of the transparent substrate 350.

The light blocking layer 351 may consist of an inorganic material or an organic material, and may be formed in a black color by adding a dye such as carbon, for example, including a material that absorbs light such as a black matrix. The light absorbing material prevents light generated between the plurality of light emitting devices 3100 from leaking to a side in a region between the transparent substrate 350 and the plurality of light emitting devices 3100, and thus, a color tone change may be reduced.

The light blocking layer 351 may have the window 351a for a light path such that light generated from the plurality of light emitting devices 3100 is incident on the transparent substrate 350. The window 351a may be specified as a region in which a portion of the light blocking layer 351 is open, and preferably, the window 351a may be formed to overlap the plurality of light emitting devices 3100 at least partially in a vertical direction. In addition, at least one of widths of the window 351a may be wider than at least one of widths of the light emitting device 3100, without being limited thereto, or may be narrower than or equal to the width of the light emitting device 3100.

When the window 351a is formed to overlap the light emitting device 3100 in the vertical direction, a location of the light emitting device 3100 may be defined. Accordingly, a plurality of windows 351a may be formed according to the number of light emitting devices 3100. Accordingly, separate arrangement markers for defining arrangement locations of light emitting device 3100 may be omitted. However, the inventive concepts are not limited thereto, and the arrangement markers may be formed on the transparent substrate 350, the light blocking layer 351, and the adhesive layer 355 so as to provide the location for arranging the light emitting device 3100.

The transparent substrate 351 may have a thickness of about 0.5 $\mu m$ to about 2 $\mu m$. Preferably, the transparent substrate 351 may have a thickness of about 0.5 $\mu m$ to about 1.5 $\mu m$. More preferably, the transparent substrate 351 may have a thickness of about 0.5 $\mu m$ to about 1 $\mu m$. When the thickness of the light blocking layer 351 is too small, it is difficult to achieve a purpose of blocking light, and when the thickness thereof is too large, the thickness of the unit pixel itself may increase, and it may also lead to an increase in production cost as the material used increases.

The adhesive layer 355 may be used to attach the light emitting device 3100 onto the transparent substrate 350. The adhesive layer 355 may be disposed on the transparent substrate 350, and may cover at least the portion of the light blocking layer 351. The adhesive layer 355 may be formed on the entire surface of the transparent substrate 350, without being limited thereto, or may be formed in a partial region so as to expose a region near an edge of the transparent substrate 350. The adhesive layer 355 may fill the window 351*a* formed by the light blocking layer 351.

The adhesive layer 355 may be formed of a light-transmitting material, and may transmit light emitted from the light emitting device 3100. The adhesive layer 355 may be formed using an organic adhesive, and for example, the adhesive layer 355 may be formed using a transparent epoxy, PDMS, or the like. In addition, the adhesive layer 355 may include a diffuser such as $SiO_2$, $TiO_2$, ZnO, or the like so as to diffuse light. The light diffuser may prevent the light emitting device 3100 from being observed from the light exiting surface.

In the exemplary embodiment of the present disclosure, the light emitting device 3100 is attached to the transparent substrate 350 by the adhesive layer 355, without being limited thereto, or the light emitting device 3100 may be coupled to the transparent substrate 350 using another bonding member instead of the adhesive layer 355. For example, the light emitting device 3100 may be coupled to the transparent substrate 350 using a spacer. The spacer may have a predetermined shape after an organic resin is applied, and may have a pillar or columnar shape in general. Accordingly, gases or liquids may fill a region between the light emitting device 3100 and the transparent substrate 350. An optical layer that transmits light emitted from the light emitting device 3100 may be formed by these gases or liquids.

The step adjustment layer 341 may cover at least a portion of the light emitting device 3100. The step adjustment layer 341 has first and second openings 341*a* and 341*b* exposing the first and second pad electrodes 319*a* and 319*b* of the light emitting device 3100. The step adjustment layer 341 may assist the connection layers 343*a*, 343*b*, 343*c*, and 343*d* to be securely formed by uniformly adjusting elevations of surfaces on which the connection layers 343*a*, 343*b*, 343*c*, and 343*d* are formed. The step adjustment layer 341 may be formed of, for example, photosensitive polyimide.

In an exemplary embodiment of the present disclosure, first, second, third, and fourth connection layers 343*a*, 343*b*, 343*c*, and 343*d* for electrically connecting the plurality of light emitting devices 3100 may be included. The first, second, and third connection layers 343*a*, 343*b*, and 343*c* may be electrically connected to the second conductivity type semiconductor layer 311*c* of each of the light emitting devices 3100. The fourth connection layer 343*d* may be commonly electrically connected to the first conductivity type semiconductor layer 311*a* of the plurality of light emitting devices 3100. In more detail, the first, second, and third connection layers 343*a*, 343*b*, and 343*c* may be connected to the second pad electrode 319*b* of the plurality of light emitting devices 3100 through the second opening 341*b* of the step adjustment layer 341. In addition, the fourth connection layer 343*d* may be connected to the first pad electrode 319*a* of the plurality of light emitting devices 3100 through the first opening 341*a* of the step adjustment layer 341.

The first, second, third, and fourth connection layers 343*a*, 343*b*, 343*c*, and 343*d* may be formed together on the step adjustment layer 341, and may include, for example, Au. Although the common electrode is formed on the first conductivity type semiconductor layer 311*a* in the illustrated exemplary embodiment, it is also possible to form the common electrode on the second conductivity type semiconductor layer 311*c*.

In an exemplary embodiment of the present disclosure, an insulation material layer 345 covering at least a portion of the step adjustment layer 341 may be additionally formed.

The insulation material layer 345 may be formed to have a thickness smaller than that of the step adjustment layer 341. A sum of the thicknesses of the insulation material layer 345 and the step adjustment layer 341 may be preferably about 1 μm to about 50 μm or less, but the inventive concepts are not limited thereto.

The insulation material layer 345 may cover side surfaces of the step adjustment layer 341 and at least portions of the connection layers 343*a*, 343*b*, 343*c*, and 343*d*. In more detail, the insulation material layer 345 may cover at least eight side surfaces and portions of upper surfaces of the connection layers 343*a*, 343*b*, 343*c*, and 343*d* disposed parallel to and adjacent to the transparent substrate 350, and may be disposed to extend in directions of edges of the transparent substrate 350.

In addition, when the adhesive layer 355 is exposed, the insulation material layer 345 may cover at least a portion of the adhesive layer 355. The insulation material layer 345 may have openings 345*a*, 345*b*, 345*c*, and 345*d* exposing the connection layers 343*a*, 343*b*, 343*c*, and 343*d*, and accordingly, pad regions of the unit pixel may be defined.

The insulation material layer 345 may be a translucent material, and may be formed of an organic or inorganic material. For example, it may be formed of polyimide. When the insulation material layer 345 along with the step adjustment layer 341 is formed of polyimide, lower surfaces, side surfaces, and at least portions of upper surfaces of the connection layers 343*a*, 343*b*, 343*c*, and 343*d* may be surrounded by the polyimide, except for the pad regions.

The insulation material layer 345 may prevent a defect from occurring in the unit pixel 10000 while the unit pixel 10000 is transferred.

Meanwhile, the unit pixel may be mounted on a circuit board using a bonding material such as solder, and the bonding material may bond the connection layers 343*a*, 343*b*, 343*c*, and 343*d* exposed to the openings 345*a*, 345*b*, 345*c*, and 345*d* of the insulation material layer 345 to pads on the circuit board.

Referring to FIG. 18, the unit pixels 10000 are mounted on a panel substrate 11000. The panel substrate 11000 may be replaced with a circuit board.

The panel substrate 11000 may be formed of a material such as polyimide (PI), FR-4 glass epoxy (FR4), glass, or the like, and may include a circuit for passive matrix driving or active matrix driving. In the illustrated exemplary embodiment, the panel substrate 11000 may include interconnections and resistors therein, without being limited thereto, and, in another exemplary embodiment, the panel substrate 11000 may include interconnections, transistors, and capacitors. The panel substrate 11000 may have pads on an upper surface thereof that is capable of being electrically connected to the disposed circuit.

The plurality of unit pixels 10000 may be arranged on the panel substrate 11000. The plurality of unit pixels 10000 may be arranged in a 6×6 matrix as shown in FIG. 18, without being limited thereto, or may be arranged in various matrices such as 2×2, 3×3, 5×5, or the like (n×m, n=1, 2, 3, 4, . . . , m=1, 2, 3, 4, . . . ).

Figure 19A:
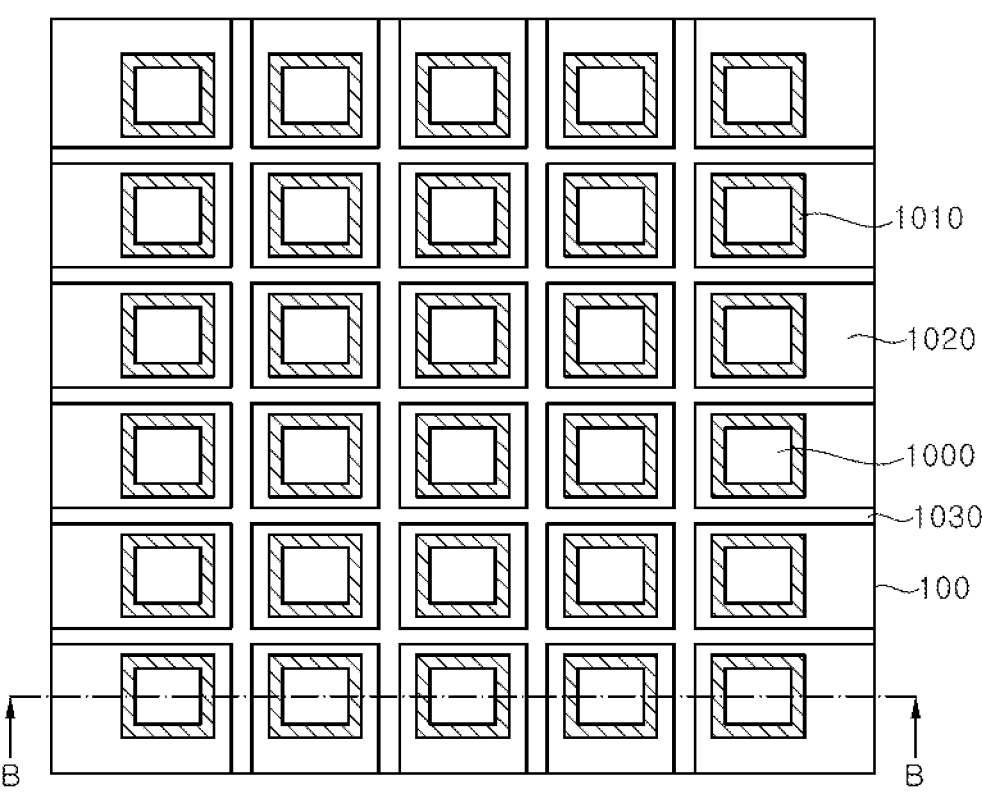
FIG. 19A is a schematic plan view illustrating a light emitting module according to an exemplary embodiment of the present disclosure.
Figure 19B:
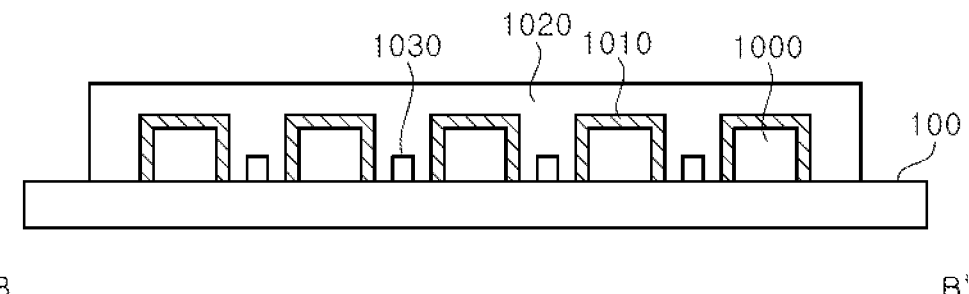
FIG. 19B is a schematic cross-sectional view taken along line B-B' of FIG. 19A.

FIG. 19A is a schematic plan view illustrating a light emitting module according to an exemplary embodiment of the present disclosure, and FIG. 19B is a schematic cross-sectional view taken along line B-B' of FIG. 19A.

Referring to FIGS. 19A and 19B, the light emitting module according to the illustrated embodiment includes a circuit board 100 and a plurality of light sources 1000. The plurality of light sources 1000 may be arranged on the circuit board 100 at regular intervals. The light source 1000 may be a single device or a pixel device in which RGB devices constitute one pixel. The pixel is not limited to the RGB devices, and may be constituted with a combination of devices of different colors. Alternatively, light having a peak wavelength of 400 nm or less may be generated in active layers of the plurality of light sources 1000.

A hill portion 1030 may be formed between the light sources 1000, and the light sources 1000 on both sides of the hill portion may be arranged so as to share the hill portion 1030 disposed therebetween. The hill portion 1030 may prevent light interference between the light sources 1000. In particular, when the circuit board 100 is a flexible board, excessive bending of the board 100 may be prevented to prevent a short circuit. A height of the hill portion 1030 may be formed to be lower than that of the light source 1000. A cover material 1010 may be formed over the light source 1000, and the cover material 1010 may cover an upper surface and side surfaces of the light source. The cover material 1010 prevents light from being concentrated on the upper surface of the light source 1000 to be emitted, and assists light to be dispersed smoothly around the light source 1000. However, the cover material 1010 is not necessarily required, and the cover material 1010 may not be included. The cover material 1010 may include a wavelength conversion material. The cover material 1010 respectively covering at least two or the plurality of light sources 1000 may have different colors of light emitted after being converted by the wavelength conversion material. Therefore, since finally emitted light may include a peak wavelength of less than 400 nm and a peak wavelength of 400 nm or more, a peak wavelength of less than 400 nm having a sterilization function may be included when a current is applied to the light source. Through this, the light emitting module may implement a lighting or a display apparatus including the sterilization function.

Additionally, a protection material 1020 may be formed so as to cover both the light source 1000 and the hill portion 1300, and the protection material 1020 may be translucent or transparent so as to partially block light while partially transmitting it. The protection material 1020 may be formed of resin, such as silicone or epoxy.

Figure 20:
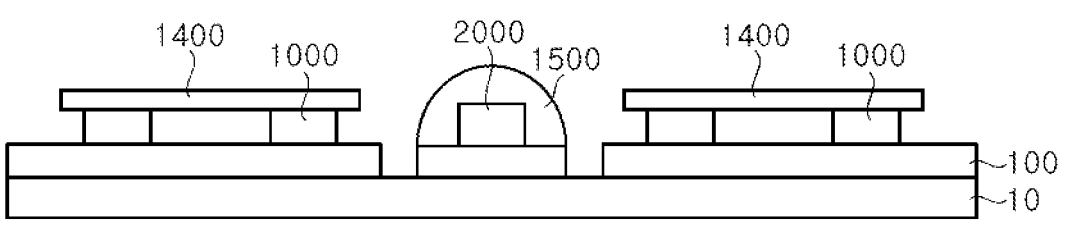
FIG. 20 is a schematic cross-sectional view illustrating a light emitting module according to an exemplary embodiment of the present disclosure.

FIG. 20 is a schematic cross-sectional view illustrating a light emitting module according to an exemplary embodiment of the present disclosure.

Referring to FIG. 20, both a light source 1000 and a sterilizing light source 2000 may be disposed on a base 10. A diffusion unit 1400 may be disposed over the light source 1000, and a dispersion unit 1500 may be disposed over the light source so as to increase a sterilization effect of the sterilizing light source 2000. The dispersion unit 1500 serves to disperse light emitted from the sterilizing light source 2000 so that light can be emitted to a wider region, and for example, any material that can transmit sterilizing light, such as a dome-shaped silicone resin or a diffusion lens can be used. Since the light source 1000 and the sterilizing light source 2000 are disposed on a same base 10, a role of sterilization may be carried out while providing illumination light in daily life and sterilization light at the same time. In addition, by employing the light emitting module, sterilization may be carried out without an additional sterilizer. In particular, since the sterilizing light source 2000 according to an exemplary embodiment of the present invention is closer to a wavelength region of a light source for lightings than that of a shorter wavelength sterilizing light source having a peak wavelength of 360 nm or less and can also perform sterilization, it may sterilize air or contaminants formed on surfaces without being harmful to the human body. In addition, since the peak wavelength of the sterilizing light source is close to the wavelength region of the light source for lightings, thermal characteristics of the light source itself are similar to those of the light source for lightings, and thus, reliability and sterilizing power may be maintained for a long time even when the light source for lightings and the sterilizing light source are disposed and driven together on the same base 10.

A height of the dispersion unit 1500 may be greater than that of an adjacent diffusion unit 1400. Thus, light emitted from the sterilizing light source 2000 is blocked by components of an adjacent light source for lightings to prevent obstruction of dispersion of the sterilizing light.

In addition, since the sterilizing light source 2000 emits light of a loner wavelength peak of 530 nm or more, which is a visible light region, visual repulsion may be reduced compared to when only ultraviolet light is emitted.

Figure 21:
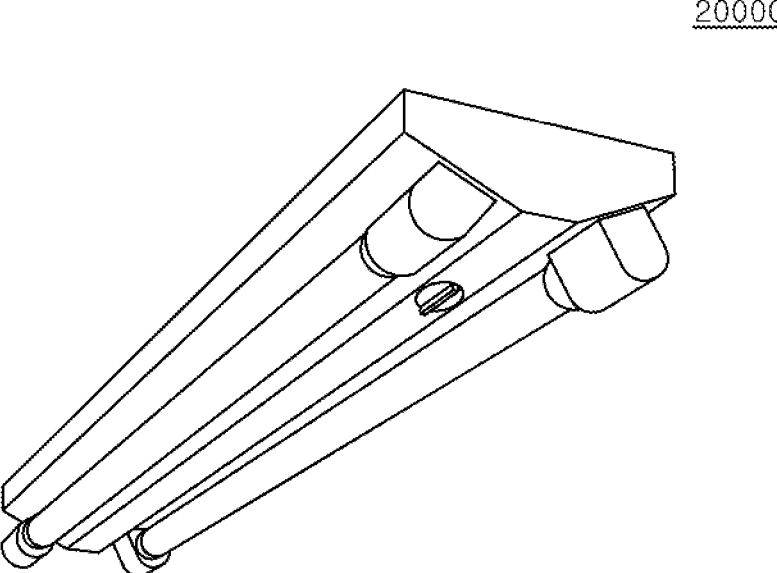
FIG. 21 is a schematic perspective view illustrating a lighting apparatus according to an exemplary embodiment of the present disclosure.

FIG. 21 is a schematic perspective view illustrating a lighting apparatus 20000 according to an exemplary embodiment of the present disclosure.

Referring to FIG. 21, various light emitting modules of the present disclosure may include a sterilizing light source including a sterilizing function, and may be applied to various lighting products such as LED fluorescent lamps. For example, the lighting apparatus 20000 may be used for lighting in medical facilities such as hospitals, and may also perform a sterilization function.

The light emitting device or light emitting module having the sterilization function according to the illustrated embodiments is not limited to a lighting apparatus, and may be appropriately applied to various fields such as automobiles and display apparatuses.

Although some exemplary embodiments have been described herein, it should be understood that these exemplary embodiments are provided for illustration only and are not to be construed in any way as limiting the present disclosure. It should be understood that features or components of one exemplary embodiment can also be applied to other exemplary embodiments without departing from the spirit and scope of the present disclosure.

The invention claimed is:

1. A light emitting device, comprising:
a first conductivity type semiconductor layer;
a second conductivity type semiconductor layer;
an active layer disposed between the first conductivity type semiconductor layer and the second conductivity type semiconductor layer; and
a protection material covering the second conductivity type semiconductor layer, wherein the protection material includes a wavelength conversion material,
wherein:
upon operation, the active layer emits light of a first peak wavelength and light of a second peak wavelength,
the first peak wavelength is less than 500 nm, and
the second peak wavelength is greater than or equal to 500 nm, and
a combination of the first peak wavelength and the second peak wavelength emitted by the active layer causes a radiated light passing through the protection material to include CIE coordinates (x, y) in a range of $0.2 < x < 0.48$, and $0.15 < y < 0.4$.

2. The light emitting device of claim 1,
wherein the first peak wavelength is in a range of 400 nm to 500 nm.

3. The light emitting device of claim 1,
wherein the second peak wavelength is in a range of 500 nm to 600 nm.

4. The light emitting device of claim 1, wherein a difference between the first peak wavelength and the second peak wavelength is greater than or equal to 30 nm.

5. The light emitting device of claim 1, wherein an intensity at the first peak wavelength is different from an intensity at the second peak wavelength.

6. The light emitting device of claim 5, wherein a peak intensity at the first peak wavelength is greater than a peak intensity at the second peak wavelength.

7. The light emitting device of claim 1, wherein an area of a spectrum of light of the first peak wavelength is different from that of a spectrum of light of the second peak wavelength.

8. The light emitting device of claim 1, wherein a full width at half maximum of a spectrum of light of the first peak wavelength is different from that of the spectrum of light of the second peak wavelength.

9. The light emitting device of claim 1, the active layer, comprising:

a lower multi-quantum well structure;

an upper multi-quantum well structure; and a spacer layer disposed between the lower multi-quantum well structure and the upper multi-quantum well structure.

10. The light emitting device of claim 9, wherein:

the lower multi-quantum well structure and the upper multi-quantum well structure include a plurality of grooves, respectively, and the plurality of grooves of the lower multi-quantum well structure and the plurality of grooves of the upper multi-quantum well structure overlap each other.

11. The light emitting device of claim 9, wherein:

the spacer layer is formed of AlGaN or AlInGaN, and the spacer layer includes a greater Al content than that of a barrier layer in the lower multi-quantum well structure.

12. The light emitting device of claim 9, further comprising:

a step coverage layer disposed between the upper multi-quantum well structure and the second conductivity type semiconductor layer, wherein the step coverage layer is formed of AlGaN or AlInGaN, and wherein a content of Al in the step coverage layer decreases as a distance from the upper multi-quantum well structure increases.

13. The light emitting device of claim 1, wherein light of the first peak wavelength and light of the second peak wavelength are simultaneously emitted.

14. A light emitting module, comprising:

a circuit board;

light emitting devices disposed on the circuit board; and a protection material covering the light emitting devices and adhering the light emitting devices to the circuit board, wherein the protection material includes a wavelength conversion material and a light diffuser that mixes light emitted from the light emitting devices, at least one of the light emitting devices, comprising:

a first conductivity type semiconductor layer;

a second conductivity type semiconductor layer; and an active layer disposed between the first conductivity type semiconductor layer and the second conductivity type semiconductor layer, wherein:

upon operation, the active layer emits light of a first peak wavelength and light of a second peak wavelength, the first peak wavelength is less than 500 nm, and the second peak wavelength is greater than or equal to 500 nm, and a combination of the first peak wavelength and the second peak wavelength emitted by the active layer causes a radiated light passing through the protection material to include CIE coordinates (x, y) in a range of $0.2<x<0.48$, and $0.15<y<0.4$.

15. The light emitting module of claim 14, wherein the protection material includes a wavelength conversion material.

16. The light emitting module of claim 15, wherein:

the at least one light emitting device has a surface with concave grooves, and the wavelength conversion material includes a plurality of wavelength conversion materials that are concentrated in the concave grooves.

17. The light emitting module of claim 14, wherein an intensity of light of the first peak wavelength is greater than that of light of the second peak wavelength.

18. The light emitting module of claim 14, the active layer, comprising:

a lower multi-quantum well structure;

an upper multi-quantum well structure; and a spacer layer disposed between the lower multi-quantum well structure and the upper multi-quantum well structure.

19. The light emitting module of claim 18, wherein:

the lower multi-quantum well structure and the upper multi-quantum well structure include a plurality of grooves, and the plurality of grooves of the lower multi-quantum well structure and the plurality of grooves of the upper multi-quantum well structure overlap each other.

* * * * *